(12) United States Patent
Sakakibara et al.

(10) Patent No.: US 10,547,802 B2
(45) Date of Patent: Jan. 28, 2020

(54) SOLID-STATE IMAGE PICKUP DEVICE AND CONTROL METHOD THEREFOR, AND ELECTRONIC APPARATUS

(71) Applicant: Sony Corporation, Tokyo (JP)

(72) Inventors: Masaki Sakakibara, Kanagawa (JP); Yasuhisa Tochigi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/575,991

(22) PCT Filed: Jul. 13, 2016

(86) PCT No.: PCT/JP2016/070650
§ 371 (c)(1),
(2) Date: Nov. 21, 2017

(87) PCT Pub. No.: WO2017/018215
PCT Pub. Date: Feb. 2, 2017

(65) Prior Publication Data
US 2018/0152650 A1    May 31, 2018

(30) Foreign Application Priority Data

Jul. 27, 2015 (JP) ................................ 2015-147451

(51) Int. Cl.
*H04N 5/359* (2011.01)
*H04N 5/378* (2011.01)
(Continued)

(52) U.S. Cl.
CPC ............. *H04N 5/359* (2013.01); *H04N 5/355* (2013.01); *H04N 5/374* (2013.01); *H04N 5/378* (2013.01);
(Continued)

(58) Field of Classification Search
CPC .... H04N 5/359; H04N 5/355; H04N 5/35509; H04N 5/3559; H04N 5/374;
(Continued)

(56) References Cited

U.S. PATENT DOCUMENTS

2009/0002528 A1* 1/2009 Manabe ............... H04N 5/2355
                                                                348/248
2009/0128676 A1* 5/2009 Tanaka .................. H04N 5/335
                                                                348/300
(Continued)

FOREIGN PATENT DOCUMENTS

JP    2005-332880 A    12/2005
JP    2009-165186 A    7/2009
(Continued)

OTHER PUBLICATIONS

International Search Report and English translation thereof dated Sep. 27, 2016 in connection with International Application No. PCT/JP2016/070650.
(Continued)

*Primary Examiner* — Nelson D. Hernández Hernández
(74) *Attorney, Agent, or Firm* — Wolf, Greenfield & Sacks, P.C.

(57) ABSTRACT

While realizing a broad dynamic range, the present technology relates to a solid-state image pickup device and control method therefor, and electronic apparatus aiming at enabling an influence of PLS to be suppressed.
The solid-state image pickup device includes a pixel array unit in which a plurality of pixels are arrayed. A portion of pixels in the pixel array unit are a unit pixel at least having one photoelectric conversion element and over flow integration capacitor. Further, the solid-state image pickup device includes one AD converter for one or more unit pixels
(Continued)

in the pixel array unit. The present technology is applicable to, for example, the solid-state image pickup.

18 Claims, 48 Drawing Sheets

(51) Int. Cl.
  *H04N 5/355* (2011.01)
  *H04N 5/374* (2011.01)
  *H01L 27/146* (2006.01)
(52) U.S. Cl.
  CPC .... *H01L 27/1464* (2013.01); *H01L 27/14641* (2013.01)
(58) Field of Classification Search
  CPC ........... H04N 5/37455; H04N 5/37457; H04N 5/378; H01L 27/14634; H01L 27/14641
  See application file for complete search history.

(56) References Cited

U.S. PATENT DOCUMENTS

| | | | | |
|---|---|---|---|---|
| 2009/0251556 A1* | 10/2009 | Mabuchi | ........... | H01L 27/14621 348/222.1 |
| 2011/0234830 A1* | 9/2011 | Kiyota | .............. | H01L 27/14609 348/222.1 |
| 2011/0242381 A1 | 10/2011 | Sakakibara et al. | | |
| 2012/0257092 A1* | 10/2012 | Sa | .......................... | H04N 5/355 348/302 |
| 2013/0214371 A1 | 8/2013 | Asatsuma et al. | | |
| 2014/0078367 A1* | 3/2014 | Sonoda | ............. | H01L 27/14634 348/303 |
| 2015/0124132 A1 | 5/2015 | Mabuchi et al. | | |
| 2018/0103216 A1 | 4/2018 | Sakakibara et al. | | |

FOREIGN PATENT DOCUMENTS

| | | |
|---|---|---|
| JP | 2011-199816 A | 10/2011 |
| JP | 2011-204797 A | 10/2011 |
| JP | 2011-229120 A | 11/2011 |
| JP | 2013-207321 A | 10/2013 |
| WO | WO 2005/083790 A1 | 9/2005 |
| WO | WO 2013/176007 A1 | 11/2013 |

OTHER PUBLICATIONS

Written Opinion and English translation thereof dated Sep. 27, 2016 in connection with International Application No. PCT/JP2016/070650.

International Preliminary Report on Patentability and English translation thereof dated Feb. 8, 2018 in connection with International Application No. PCT/JP2016/070650.

* cited by examiner

SOLID-STATE IMAGE PICKUP DEVICE AND CONTROL METHOD THEREFOR, AND ELECTRONIC APPARATUS

CROSS-REFERENCE TO RELATED APPLICATIONS

This application claims the benefit under 35 U.S.C. § 371 as a U.S. National Stage Entry of International Application No. PCT/JP2016/070650, filed in the Japanese Patent Office as a Receiving Office on Jul. 13, 2016, which claims priority to Japanese Patent Application Number JP2015-147451, filed in the Japanese Patent Office on Jul. 27, 2015, each of which is hereby incorporated by reference in its entirety.

TECHNICAL FIELD

The present technology relates to a solid-state image pickup device and a control method therefor, and an electronic apparatus, and particularly to, a solid-state image pickup device and control method therefor, and electronic apparatus aiming at enabling an influence of PLS to be suppressed while realizing a broad dynamic range.

BACKGROUND ART

A lateral over flow integration capacitor (LOFIC) that accumulates a charge overflowed from a photodiode is provided in a pixel, and thereby an image sensor in which a broad dynamic range is realized has been proposed (see, for example, PTL 1 to 3).

In the image sensor disclosed in PTL 1, for example, an integration capacitor (hereinafter, referred to as a LOFIC unit) for accumulating an overflow charge and a CCD (Charge Coupled Device) unit for a global shutter are provided in the pixel. This image sensor is a front-surface irradiation type image sensor, and therefore the LOFIC unit and the CCD unit are shielded.

CITATION LIST

Patent Literature

[PTL 1]
JP 2011-199816A
[PTL 2]
JP 2009-165186A
[PTL 3]
WO2005/083790

SUMMARY

Technical Problems

In the image sensor disclosed in PTL 1, an exposure time can be controlled to be the same in all pixels but reading of a pixel signal is line-sequentially performed; therefore, PLS (Parasitic Light Sensitivity: a rate of unnecessary signals generated by a light shield leakage) is different dependent on the read-out row. A pixel in which the PLS is maximized is a pixel of the final read-out row.

If the front-surface irradiation type image sensor disclosed in PTL 1 is changed to a back-surface irradiation type for improving the PLS, a shielded structure is required in a back-surface side and it is difficult to realize the structure.

The present technology has been made in view of the circumstances as described above and aims at enabling an influence of the PLS to be suppressed while realizing a broad dynamic range.

Solution to Problems

According to a first aspect of the present technology, there is provided a solid-state image pickup device including: a first unit pixel at least having one photoelectric conversion element and over flow integration capacitor as a portion of pixels in a pixel array unit in which a plurality of pixels are arrayed; and one AD converter for the one or more first unit pixel in the pixel array unit.

In the first aspect of the present technology, a first unit pixel at least having one photoelectric conversion element and over flow integration capacitor is provided as a portion of pixels in a pixel array unit in which a plurality of pixels are arrayed; and one AD converter is provided for the one or more first unit pixel in the pixel array unit.

According to a second aspect of the present technology, there is provided a method for controlling a solid-state image pickup device including: causing a solid-state image pickup device, including a unit pixel at least having one photoelectric conversion element and over flow integration capacitor as a portion of pixels in a pixel array unit in which a plurality of pixels are arrayed, and one AD converter for the one or more unit pixels in the pixel array unit to convert a pixel signal of the unit pixel to a digital value and to output the digital value in the pixel array unit.

In the second aspect of the present technology, a unit pixel at least having one photoelectric conversion element and over flow integration capacitor is provided as a portion of pixels in a pixel array unit in which a plurality of pixels are arrayed, and one AD converter is provided for the one or more unit pixels in the pixel array unit. Then, a pixel signal of the unit pixel is converted to a digital value and is output in the pixel array unit.

According to a third aspect of the present technology, there is provided an electronic apparatus including: a solid-state image pickup device including a unit pixel at least having one photoelectric conversion element and over flow integration capacitor as a portion of pixels in a pixel array unit in which a plurality of pixels are arrayed, and one AD converter for the one or more unit pixels in the pixel array unit.

In the third aspect of the present technology, a unit pixel at least having one photoelectric conversion element and over flow integration capacitor is provided as a portion of pixels in a pixel array unit in which a plurality of pixels are arrayed, and one AD converter is provided for the one or more unit pixels in the pixel array unit.

The solid-state image pickup device and the electronic apparatus may be independent devices or modules incorporated into other devices.

Advantageous Effects of the Invention

According to the first to third aspects of the present technology, an influence of the PLS can be suppressed while realizing a broad dynamic range.

In addition, advantageous effects disclosed herein are not necessarily limited thereto and may be any advantageous effects disclosed during the present disclosure.

DESCRIPTION OF EMBODIMENTS

Hereinafter, modes for carrying out the present technology (hereinafter, referred to as embodiments) will be described. In addition, the description is made in the following order.

1. Overall Schematic Configuration Example of Solid-State Image Pickup Device
2. Detailed Configuration Example of Pixels
3. Configuration Example of Comparison Circuit
4. Detailed Configuration Example of Latch Storage Unit and Repeater
5. Arrangement Example of Pixel Circuit and ADC
6. Configuration Example of Pixel Circuit
7. Circuit Configuration Example of FD Sharing
8. Configuration of Plural Substrates
9. Arithmetic Operation Configuration Example of CDS/DDS
10. Other Configuration Examples of Pixels
11. Signal Synthetic Process
12. Signal Determination Process 13. Descriptions of Advantageous Effects
14. Other Driving Methods of Pixels
15. Application Examples to Electronic Apparatus 1. Overall Schematic Configuration Example of Solid-State Image Pickup Device FIG. 1 illustrates a schematic configuration of a solid-state image pickup device to which the present technology is applied.

Figure 1:
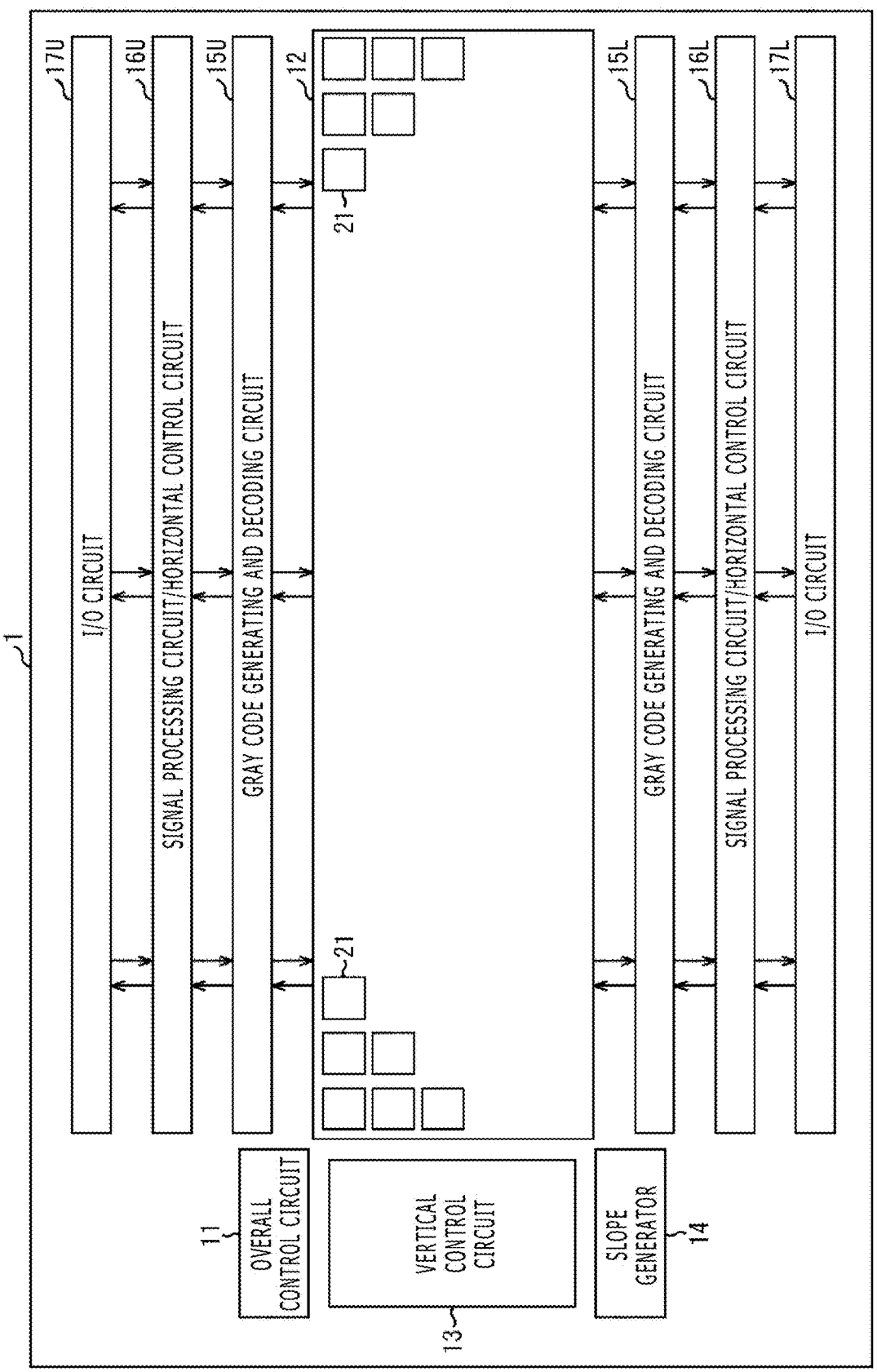
FIG. 1 is a diagram illustrating a schematic configuration of a solid-state image pickup device to which the present technology is applied.

A solid-state image pickup device 1 of FIG. 1 includes an overall control circuit 11, a pixel array unit 12, a vertical control circuit 13, and a slope generator 14. Further, the solid-state image pickup device 1 includes a gray code generating and decoding circuit 15, a signal processing circuit/horizontal control circuit 16, and an I/O circuit 17 on each of the upper side and the lower side of the pixel array unit 12. Specifically, on the upper side of the pixel array unit 12, a gray code generating and decoding circuit 15U, a signal processing circuit/horizontal control circuit 16U, and an I/O circuit 17U are arranged, and on the lower side of the pixel array unit 12, a gray code generating and decoding circuit 15L, a signal processing circuit/horizontal control circuit 16L, and an I/O circuit 17L are arranged.

The overall control circuit 11 is configured of a timing generator etc. generating various timing signals and supplies the generated various timing signals to each unit or the like to control the overall operations of the solid-state image pickup device 1.

The pixel array unit 12 has a region in which pixels 21 are arrayed in a matrix form. Each pixel 21 within the pixel array unit 12 generates analog pixel signals SIG in accordance with the amount of received light and converts (AD-converts) the signals to digital signals in the pixel array unit 12, and then outputs the signals to the gray code generating and decoding circuit 15.

The vertical control circuit 13 outputs control signals to control exposure of each pixel 21 within the pixel array unit 12. In addition, the vertical control circuit 13 performs control to output the digital pixel signals SIG of each pixel 21 generated in the pixel array unit 12 to the gray code generating and decoding circuit 15 other than the pixel array unit 12 in a predetermined order.

The slope generator 14 generates and outputs a reference signal (reference voltage signal) REF that is a slope signal in which a voltage level monotonically decreases or increases on the basis of the lapse of time, and that is required at the time of AD-converting the analog pixel signals SIG generated in the pixel.

The gray code generating and decoding circuit 15 generates and outputs gray codes for generating AD conversion data, and at the same time converts the input gray codes to binary data.

The signal processing circuit/horizontal control circuit 16 performs predetermined digital signal processing, for example, CDS (Correlated Double Sampling) processing, black level correction processing to correct black levels, color processing, or the like, if necessary, and then outputs the digital data to the I/O circuit 17. The signal processing circuit/horizontal control circuit 16 has a memory (for example, a RAM 401 of FIG. 38) such as a DRAM (Dynamic Random Access Memory) or SRAM (Static RAM) that temporally stores data for predetermined signal processing or horizontal transfer control.

The I/O circuit 17 outputs pixel signals after the predetermined signal processing, supplied from the signal processing circuit/horizontal control circuit 16 to the outside of the device. Further, the I/O circuit 17 receives control signals supplied from external devices or an input of power supply etc. and supplies it to the inside of the device.

Figure 2:
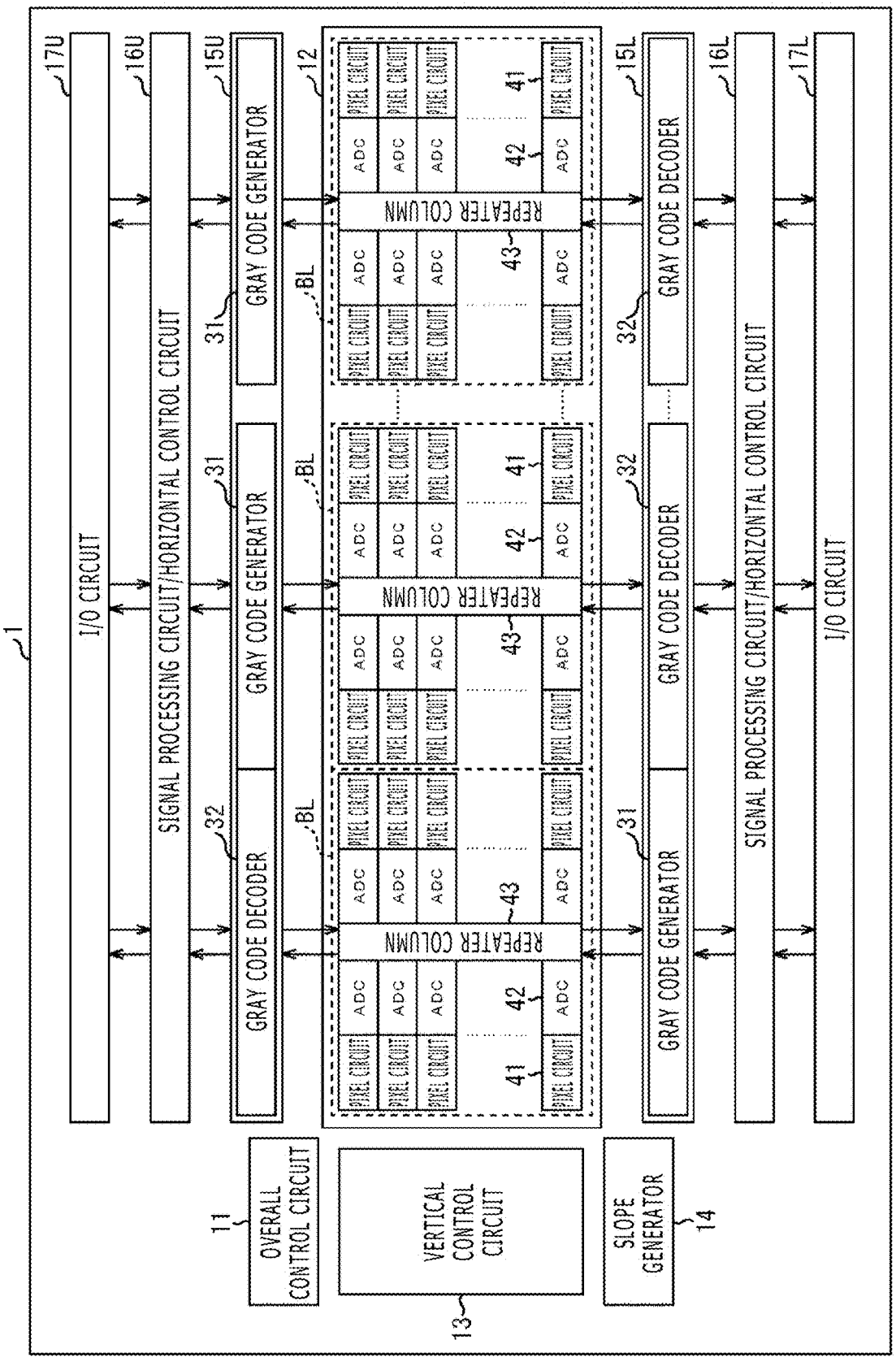
FIG. 2 is a diagram illustrating a detailed configuration of a pixel array unit and a gray code generating and decoding circuit.

FIG. 2 illustrates detailed configurations of the pixel array unit 12 and gray code generating and decoding circuit 15 illustrated in FIG. 1.

In the gray code generating and decoding circuit 15, gray code generators 31 and gray code decoders 32 are alternately arranged in the horizontal direction (in the lateral direction in FIG. 2). The gray code generators 31 and the gray code decoders 32 are arranged corresponding to a block BL in which the pixel array unit 12 is divided in the horizontal direction.

The gray code generating and decoding circuit 15L on the lower side of the pixel array unit 12 is alternately arranged in the order corresponding to the gray code generator 31 and the gray code decoder 32 from a left end; in contrast, the gray code generating and decoding circuit 15U on the upper side of the pixel array unit 12 is alternately arranged in the order corresponding to the gray code decoder 32 and the gray code generator 31 from the left end.

In other words, the gray code generator 31 and the gray code decoder 32 of the gray code generating and decoding circuit 15L, and the gray code generator 31 and the gray code decoder 32 of the gray code generating and decoding circuit 15U are alternately arranged so as not to be overlapped with the corresponding block BL of the pixel array unit 12.

The gray code generator 31 generates gray codes for generating the AD conversion data and outputs the gray codes to repeater columns 43 of the pixel array unit 12. The gray code decoder 32 converts the gray codes (the after-mentioned gray code latched value) input from the repeater columns 43 to binary data. In the present embodiment, the gray code generator 31 is assumed to generate N-bit gray codes (N>0). In the case of using the N-bit gray codes (N>0), the number of bits of the pixel signals output by the solid-state image pickup device 1 is (N−1) bits because of the after-mentioned CDS processing.

In the pixel array unit 12, the pixel circuit 41, the ADC (AD converter) 42, and the repeater column 43 are arranged in plurality. Each pixel 21 within the pixel array unit 12 is configured of the pixel circuit 41 and the ADC 42. The repeater column 43 is provided in units of the block BL divided in the horizontal direction.

The pixel circuit 41 outputs charge signals as the analog pixel signal SIG to the ADC 42 on the basis of the amount of received light. The ADC 42 converts the analog pixel signals SIG supplied from the pixel circuit 41 to digital signal. The ADC 42 latches and stores values corresponding to the amount of received light in the pixel 21 (the pixel circuit 41) among the gray codes supplied from the gray code generator 31 via the repeater column 43. This latched and stored value of the gray code corresponds to a digital value of the pixel signal SIG.

The repeater column 43 transfers the gray codes output from the gray code generator 31 in the vertical direction and supplies the gray codes to each ADC 42 within the block BL. In addition, the repeater column 43 transfers the latched and stored value of the gray code (hereinafter, referred to as a gray code latched value) that is output from each ADC 42 within the block BL in the vertical direction and supplies the gray code latched value to the gray code decoder 32.

The gray code decoder 32 generates the clock signal CLK used for the transfer of the gray code and the gray code latched value of the repeater column 43 and outputs the clock signal CLK to the repeater column 43. In the repeater column 43, the clock signals CLK are transferred in the direction from the gray code decoder 32 to the gray code generator 31; in contrast, the gray codes and the gray code latched values are transferred in the direction from the gray code generator 31 to the gray code decoder 32.

As described above, the gray code generator 31 and the gray code decoder 32 are alternately arranged in the horizontal direction in accordance with the blocks BL within the pixel array unit 12; therefore, in the case where the repeater column 43 of the block BL within the pixel array unit 12 vertically transfers the gray code and the gray code latched value from top down in FIG. 2, the repeater column 43 of the block BL adjacent thereto vertically transfers the gray code and the gray code latched value from bottom up.

In the same manner, in the case where the repeater column 43 of the block BL within the pixel array unit 12 vertically transfers the clock signal CLK output from the gray code decoder 32 from bottom up, the repeater column 43 of the block BL adjacent thereto vertically transfers the clock signal CLK output from the gray code decoder 32 from top down.

The pixel circuits 41 and ADCs 42 illustrated in FIG. 2 are arranged on display for convenience of explanation; practically, the pixel circuits 41 are arranged so as to be overlapped on the ADCs 42 and the repeater columns 43 as described below with reference to FIG. 9.

2. Detailed Configuration Example of Pixels

A detailed configuration of the ADC 42 that is a portion of the pixel 21 will be described with reference to FIG. 3.

The ADC 42 is configured of a comparison circuit 51 and a latch storage unit 52.

The comparison circuit 51 compares a reference signal REF supplied from the slope generator 14 and the pixel signal SIG supplied from the pixel circuit 41 and outputs an output signal VCO as a comparison result signal representing comparison results. When the reference signal REF and the pixel signal SIG have the same voltage, the comparison circuit 51 inverts the output signal VCO.

The comparison circuit 51 is configured of a differential input circuit 61, a voltage conversion circuit 62, and a positive feedback circuit (PFB) 63; further, details will be described below with reference to FIG. 4.

The latch storage unit 52 is configured of a latch control circuit 71 that controls a writing operation and a reading operation of the gray codes and a latched value storage unit 72 that stores values of the gray codes corresponding to the amount of received light of the pixel 21 (the pixel circuit 41), that is, the gray code latched values.

To the latch storage unit 52, a word signal for controlling reading timing of the pixel 21 during the reading operation of pixel signals is supplied from the vertical control circuit 13 in addition to the output signal VCO input from the comparison circuit 51. Further, the gray codes generated by the gray code generator 31 are also supplied to the latch storage unit 52 via the repeater columns 43.

When the output signals VCO of Hi (High) from the comparison circuit 51 is input in a writing operation of the gray codes, the latch control circuit 71 stores the gray code updated in each unit time supplied from the repeater column 43 in the latched value storage unit 72. Then, when the reference signal REF and the pixel signal SIG have the same voltage and the output signal VCO supplied from the comparison circuit 51 is inverted to Lo (Low), the latch control circuit 71 stops writing (update) to the latched value storage unit 72 of the supplied gray codes and finally holds as the gray code latched value the gray codes stored in the latched value storage unit 72.

Sweeping of the reference signal REF is finished and the gray code latched values are stored in the latched value storage units 72 of all the pixels 21 in the pixel array unit 12, and then operations of the pixels 21 are changed from the writing operation to the reading operation.

In the reading operation of the gray code latched value, on the basis of a WORD signal for controlling the reading timing, when the reading timing of the pixel 21 becomes that of itself, the latch control circuit 71 outputs the gray code latched value (the digital pixel signal SIG) stored in the latched value storage unit 72 to the repeater column 43. The repeater column 43 sequentially transfers the supplied gray code latched values in the vertical direction (the column direction) and supplies the gray code latched values to the gray code decoder 32.

3. Configuration Example of Comparison Circuit

Figure 4:
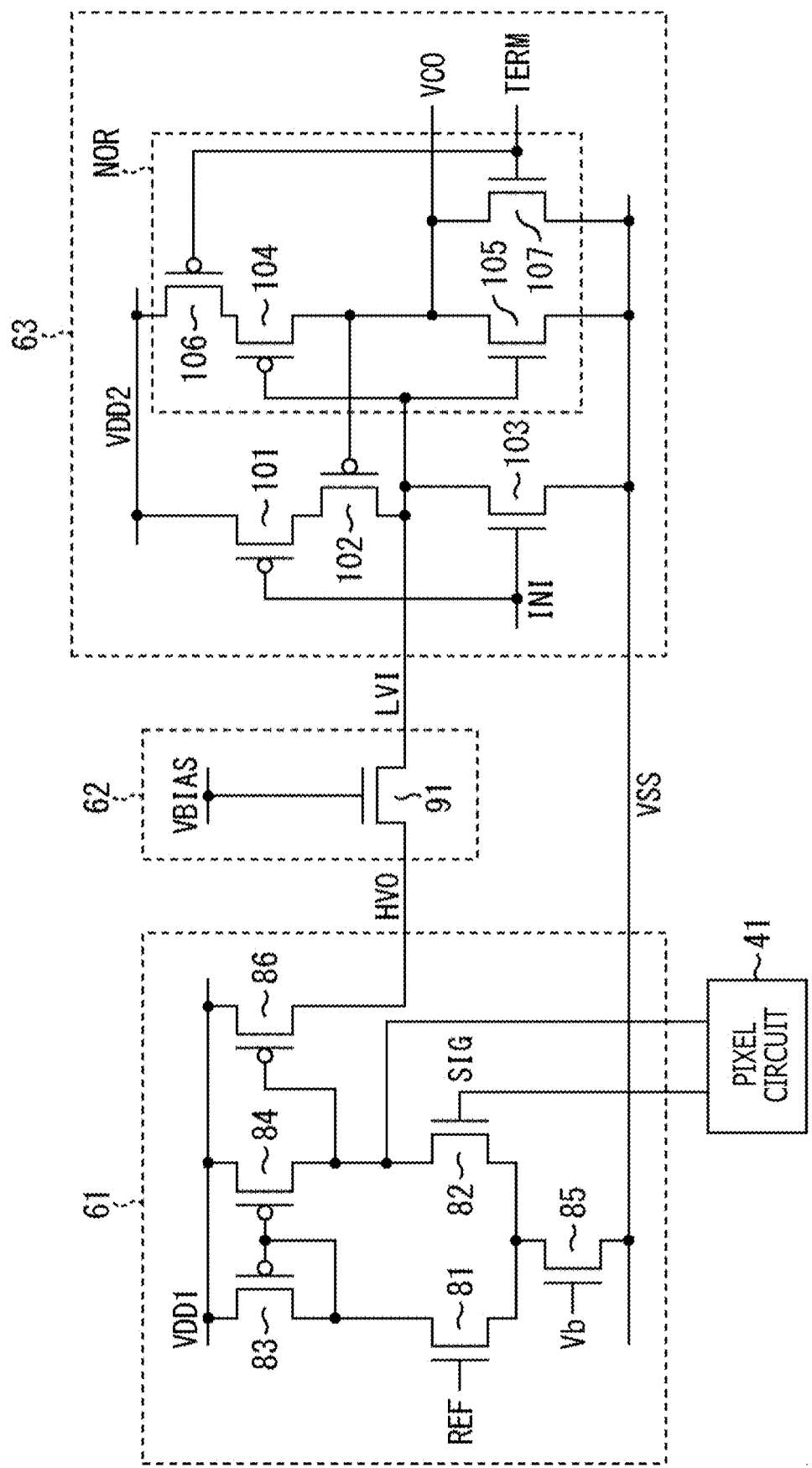
FIG. 4 is a diagram illustrating a detailed configuration of a comparison circuit.

FIG. 4 is a circuit diagram illustrating a detailed configuration of the differential input circuit 61, the voltage conversion circuit 62, and a positive feedback circuit 63 configuring the comparison circuit 51.

The differential input circuit 61 compares the pixel signal SIG output from the pixel circuit 41 and the reference signal REF output from the slope generator 14 and, when the pixel signal SIG is higher than the reference signal REF, and outputs a predetermined signal (current).

The differential input circuit 61 is configured of transistors 81 and 82 to be a differential pair, transistors 83 and 84 configuring a current mirror, a transistor 85 as a constant current source that supplies a current IB according to the input bias current Vb, and a transistor 86 that outputs an output signal HVO of the differential input circuit 61.

The transistors 81, 82, and 85 are configured of NMOS (Negative Channel MOS) transistors and the transistors 83, 84, and 86 are configured of PMOS (Positive Channel MOS) transistors.

In the transistors 81 and 82 to be a differential pair, the reference signal REF output from the slope generator 14 is input to a gate of the transistor 81 and the pixel signal SIG output from the pixel circuit 41 is input to a gate of the transistor 82. Sources of the transistors 81 and 82 are connected to a drain of the transistor 85, and a source of the transistor 85 is connected to a predetermined voltage VSS (VSS<VDD2<VDD1).

A drain of the transistor 81 is connected to gates of the transistors 83 and 84 configuring a current mirror circuit and a drain of the transistor 83, and a drain of the transistor 82 is connected to a drain of the transistor 84 and a gate of the transistor 86. Sources of the transistors 83, 84, and 86 are connected to the first power supply voltage VDD1.

The voltage conversion circuit 62 is configured of, for example, an NMOS transistor 91. A drain of the transistor 91 is connected to a drain of the transistor 86 in the differential input circuit 61, a source of the transistor 91 is connected to a predetermined connection point in a positive feedback circuit 63, and a gate of the transistor 91 is connected to a bias voltage VBIAS.

The transistors 81 to 86 configuring the differential input circuit 61 form a circuit that operates at a high voltage up to the first power supply voltage VDD1, and the positive feedback circuit 63 is a circuit that operates at the second power supply voltage VDD2 lower than the first power supply voltage VDD1. The voltage conversion circuit 62 converts an output signal HVO input from the differential input circuit 61 into a signal (conversion signal) LVI of low voltage that is operable by the positive feedback circuit 63 and supplies the signal LVI to the positive feedback circuit 63.

The bias voltage VBIAS is a voltage converting to a voltage in which transistors 101 to 105 of the positive feedback circuit 63 operating at a constant voltage are not broken. For example, the bias voltage VBIAS can be set to the same voltage (VBIAS=VDD2) as the second power supply voltage VDD2 of the positive feedback circuit 63.

On the basis of a conversion signal LVI in which the output signal HVO from the differential input circuit 61 is converted into a signal corresponding to the second power supply voltage VDD2, the positive feedback circuit 63 outputs a comparison result signal inverting at the time when the pixel signal SIG is higher than the reference signal REF. Further, the positive feedback circuit 63 increases a transition speed at the time when the output signal VCO outputting as the comparison result signal is inverted.

The positive feedback circuit 63 is configured of five transistors 101 to 107. Herein, the transistors 101, 102, 104, and 106 are configured of PMOS transistors and the transistors 103, 105, and 107 are configured of NMOS transistors.

The source of the transistor 91 that is an output end of the voltage conversion circuit 62 is connected to drains of the transistors 102 and 103 and gates of the transistors 104 and 105. Sources of the transistors 101 and 106 are connected to the second power supply voltage VDD2 and a drain of the transistor 106 is connected to a source of the transistor 104. A drain of the transistor 101 is connected to a source of the transistor 102 and a gate of the transistor 102 is connected to drains of the transistors 104, 105, and 107 that are also output ends of the positive feedback circuit 63. Sources of the transistors 103, 105, and 107 are connected to the predetermined voltage VSS. To gates of the transistors 101 and 103, an initialization signal INI is supplied.

A drain of the transistor 107 is connected to an output end of the comparison circuit 51 and a source of the transistor 107 is connected to the predetermined voltage VSS.

The transistors 104 to 107 configure a NOR circuit of two inputs, and connection points between the drains of the transistors 104, 105, and 107 act as an output end in which the comparison circuit 51 outputs the output signal VCO. Further, to gates of the transistors 106 and 107, a second input control signal TERM that is different from a first input conversion signal LVI is supplied.

Figure 5:
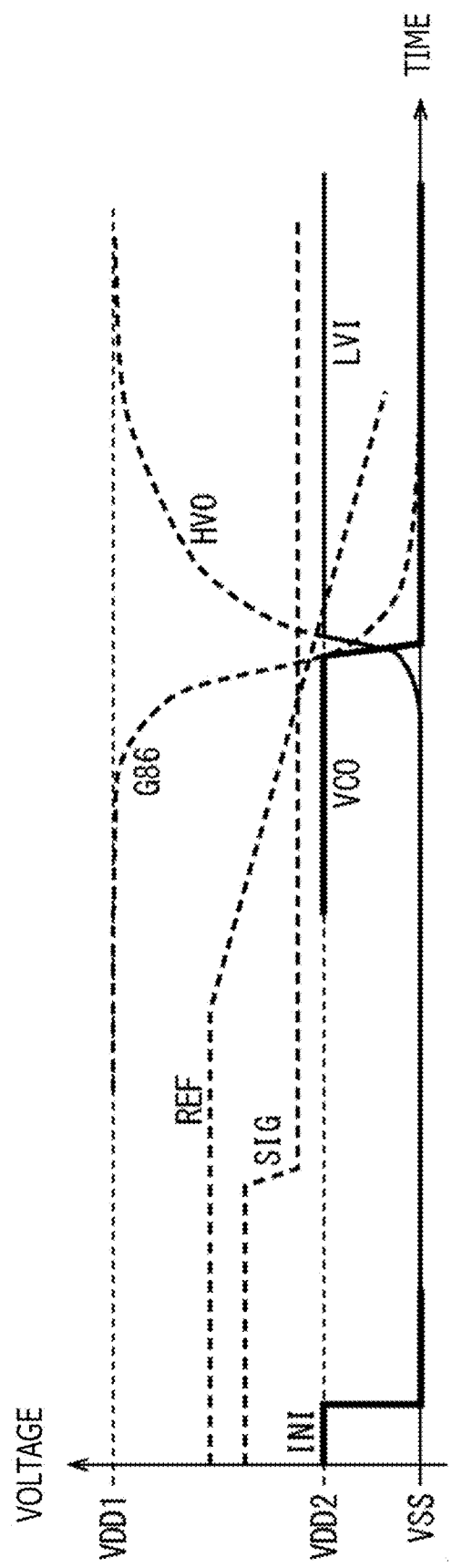
FIG. 5 is a diagram illustrating a transition of each signal during an operation of the comparison circuit.

Operations of the comparison circuit 51 configured as described above will be described with reference to FIG. 5. FIG. 5 illustrates a transition of each signal during the operations of the comparison circuit 51. In FIG. 5, "G86" represents a gate potential of the transistor 86.

First, the reference signal REF is set to a voltage higher than those of the pixel signals SIG of all the pixels 21, and at the same time the initialization signal INI is set to Hi and the comparison circuit is initialized.

More specifically, the reference signal REF is applied to the gate of the transistor 81 and the pixel signal SIG is applied to the gate of the transistor 82. When a voltage of the reference signal REF is a voltage higher than that of the pixel signal SIG, most of a current output by the transistor 85 to be a current source flows into the diode-connected transistor 83 via the transistor 81. A channel resistance of the transistor 84 having a common gate to that of the transistor 83 is reduced sufficiently, the gate of the transistor 86 is approximately kept to the first power supply voltage VDD1 level, and the transistor 86 is cut off. Thus, even if the transistor 91 of the voltage conversion circuit 62 has conducted, the positive feedback circuit 63 acting as a charging circuit charges no charging signals LVI. On the other hand, since a Hi signal is supplied as the initialization signal INI, the transistor 103 conducts and the positive feedback circuit 63 discharges the conversion signal LVI. Further, since the transistor 101 is cut off, the positive feedback circuit 63 charges no conversion signals LVI via the transistor 102. As a result, the conversion signal LVI is discharged up to a predetermined voltage VSS level, the positive feedback circuit 63 outputs a Hi output signal VCO by the transistors 104 and 105 configuring an inverter, and the comparison circuit 51 is initialized.

After the initialization, the initialization signal INI is subjected to Lo and sweeping of the reference signal REF is started.

During a period at which the reference signal REF is higher, in a voltage, than the pixel signal SIG, the transistor 86 is turned off and therefore is cut off, since the output signal VCO becomes a Hi signal, the transistor 102 is also turned off and cut off. The initialization signal INI is Lo, and therefore the transistor 103 is also cut off. The conversion signal LVI keeps the predetermined voltage VSS while holding a high impedance state and the Hi output signal VCO is output.

When the reference signal REF becomes lower than the pixel signal SIG, an output current of the transistor 85 as a current source does not flow to the transistor 81, a gate potential between the transistors 83 and 84 rises up, and a channel resistance of the transistor 84 becomes high. A current flowing there via the transistor 82 causes a voltage drop to reduce a gate potential of the transistor 86 and the transistor 91 conducts. The output signal HVO output from the transistor 86 is converted to the conversion signal LVI by the transistor 91 of the voltage conversion circuit 62 and is supplied to the positive feedback circuit 63. The positive feedback circuit 63 as a charging circuit charges the conversion signal LVI and approximates a potential from the low voltage VSS to the second power supply voltage VDD2.

Then, when a voltage of the conversion signal LVI exceeds a threshold voltage of the inverter configured of the transistors 104 and 105, the output signal VCO becomes Lo and the transistor 102 conducts. Since the Lo initialization signal INI is applied, the transistor 101 also conducts; further, the positive feedback circuit 63 rapidly charges the conversion signal LVI via the transistors 101 and 102 and raises up a potential at once up to the second power supply voltage VDD2.

In the transistor 91 of the voltage conversion circuit 62, since the bias voltage VBIAS is applied to the gate, when a voltage of the conversion signal LVI reaches a voltage value reduced to a transistor threshold from the bias voltage VBIAS, it is cut off. Even if the transistor 86 is kept conductive, the conversion signal LVI is not further charged and the voltage conversion circuit 62 functions as a voltage clamp circuit.

The charging of the conversion signal LVI due to the conduction of the transistor 102 originally starts from the fact that the conversion signal LVI rises up to an inverter threshold and it is a positive feedback operation accelerating its movement. In the transistor 85 that is a current source of the differential input circuit 61, the number of circuits operating in parallel at the same time in the solid-state image pickup device 1 is enormous, and therefore a current per circuit is set to an extremely slight current. Further, a voltage changing in a unit time at which the gray codes are switched is an LSB step of the AD conversion, and therefore the reference signal REF is swept extremely sluggishly. Thus, a change in the gate potential of the transistor 86 is also sluggish and a change in the output current of the transistor 86 driven thereby is also sluggish. However, a positive feedback is performed to the conversion signal LVI charged by the output current from a subsequent stage, so that the output signal VCO can transit sufficiently rapidly. Preferably, the transition time of the output signal VCO is a fraction of the unit time of the gray code and is equal to or less than 1 ns as a typical example. In the comparison circuit 51 of the present disclosure, for example, a slight current of 0.1 µA is only set to the transistor 85 as the current source, and thereby this output transition time can be attained.

Further, in the comparison circuit 51, when the second input control signal TERM is set to Hi, the output signal VCO can be set to Lo without relation to a state of the differential input circuit 61.

For example, when a voltage of the pixel signal SIG becomes lower than a final voltage of the reference signal REF due to a high luminance exceeding the assumption (for example, a sun image shot in a field angle of the solid-state image pickup device 1), the comparison period is finished while the output signal VCO of the comparison circuit 51 is kept Hi; therefore, the latch storage unit 52 controlled by the output signal VCO cannot fix a value and the AD conversion function is lost. For the purpose of preventing such a state from occurring, the control signal TERM of Hi pulse is input at the end of the sweeping of the reference signal REF to thereby invert forcibly the output signal VCO that is not yet inverted to Lo. Since the latch storage unit 52 latches and stores the gray codes immediately before a forcible inversion, in the case of adopting a configuration of FIG. 4, as a result, the ADC 42 functions as the AD converter that cramps an output value to a fixed-level or more luminance input.

The bias voltage VBIAS is controlled to a Lo level, the transistor 91 is cut off, and the initialization signal INI is set to Hi; as a result, the output signal VCO becomes Hi without relation to a state of the differential input circuit 61. Therefore, by combining a forcible Hi output of this output signal VCO and a forcible Lo output by the above-mentioned control signal TERM, the output signal VCO can be set to an arbitrary value without relation to states of the differential input circuit 61, the pixel circuit 41 that is a previous stage, and the slope generator 14. Through this function, for example, a circuit of a subsequent stage from the pixel 21 can be test only by an electrical signal input without depending on an optical input to the solid-state image pickup device 1.

4. Detailed Configuration Example of Latch Storage Unit and Repeater

Figure 6:
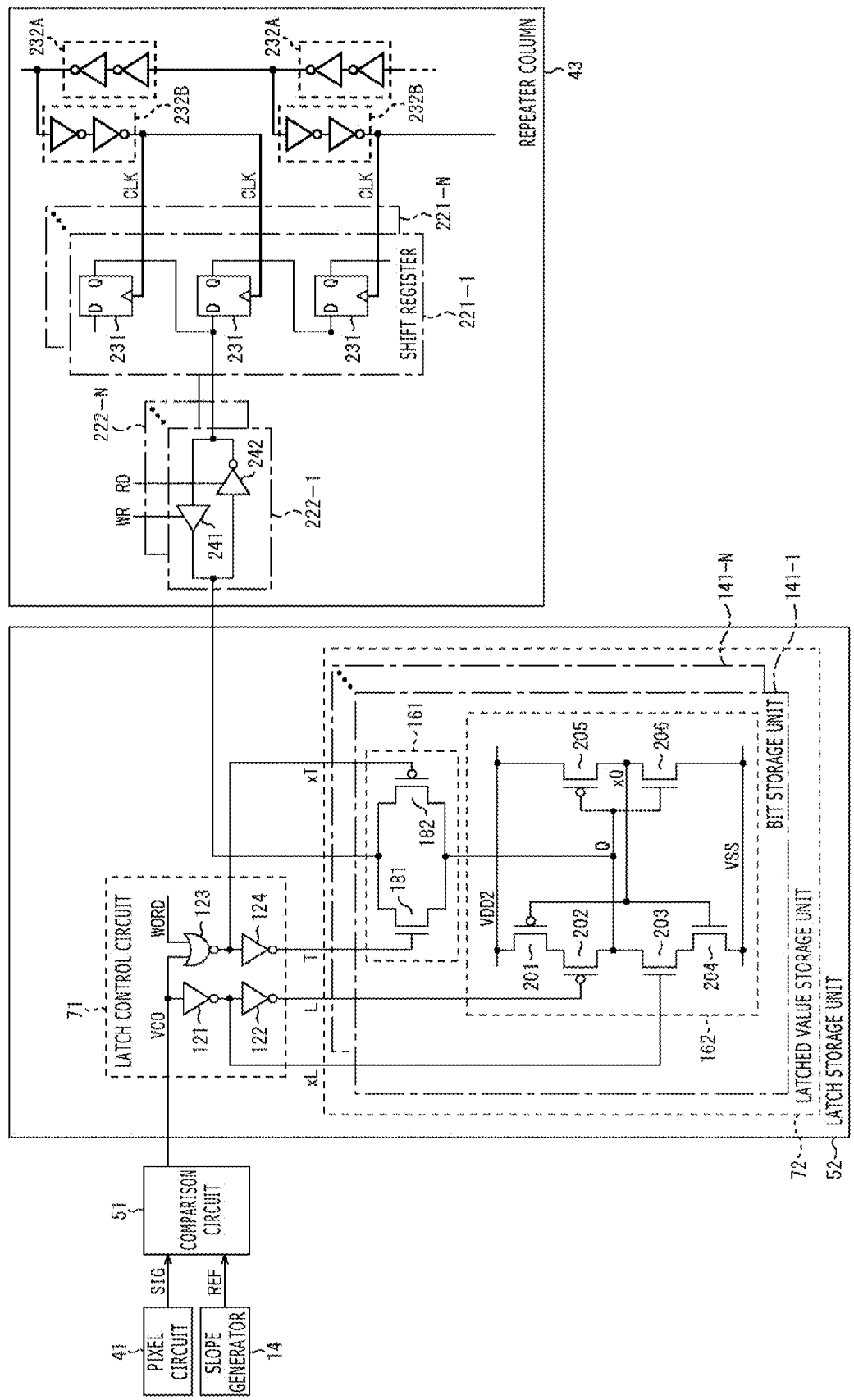
FIG. 6 is circuit diagrams illustrating detailed configurations of a latch storage unit and a repeater column.

FIG. 6 is a circuit diagram illustrating detailed configurations of the latch storage unit 52 and the repeater column 43.

The latch control circuit 71 is configured of two inverters 121 and 122 that are connected in series, and the NOR circuit 123 and inverter 124 that are connected in series.

The latched value storage unit 72 is configured of N pieces of bit storage units 141-1 to 141-N in accordance with the N-bit gray codes. To the N pieces of bit storage units 141-1 to 141-N, the output signal VCO and the WORD signal are supplied from the latch control circuit 71.

Each of the bit storage units 141-1 to 141-N is configured of a transfer gate 161 and a latch circuit 162.

The transfer gate 161 of the bit storage unit 141-*n* (1≤n≤N) is configured of two transistors 181 and 182 of an NMOS transistor and a PMOS transistor.

The latch circuit 162 of the bit storage unit 141-*n* is configured of a static type latch circuit including transistors 201 to 206. The transistors 201, 202, and 205 are configured of PMOS transistors and the transistors 203, 204, and 206 are configured of NMOS transistors.

The output signal VCO that is an output from the comparison circuit 51 is input to the inverter 121 and the NOR circuit 123 and, to the other input of the NOR circuit 123, the WORD signal is supplied. An output of the inverter 121 is supplied to the inverter 122 and a gate of the transistor 203 in the latch circuit 162, and an output of the inverter 122 is supplied to a gate of the transistor 202 in the latch circuit 162. Further, an output of the NOR circuit 123 is supplied to the inverter 124 and a gate of the transistor 182 in the transfer gate 161, and an output of the inverter 124 is supplied to a gate of the transistor 181 in the transfer gate 161.

In the writing operation of the gray code, the WORD signal becomes Lo in all the pixels, and the transfer gate 161 conducts when the output signal VCO is Hi and the transfer gate 161 is cut off when the output signal VCO is Lo. When the output signal VCO is Hi, a feedback (an output xQ to an input Q) of the latch circuit 162 is cut off, and when the output signal VCO is Lo, the feedback conducts. Accordingly, when the output signal VCO is Hi, the latch circuit 162 is in the writing state (transparent) of the gray code of n-th bit, and when the output signal VCO is Lo, the latch circuit 162 is in a holding state (a latch state) of the written gray code.

In the reading operation of the gray code, the WORD signal is supplied to only the latch control circuit 71 of the pixel 21 as a reading target. Since the output signal VCO is Lo, the transfer gate 161 conducts only when the Hi WORD signal is input, and the gray code held in the latch storage unit 212, that is, the gray code latched value is output to the repeater column 43.

The repeater column 43 has N pieces of shift resisters 221-1 to 221-N corresponding to the N-bit gray codes. Each of the N pieces of shift resisters 221-1 to 221-N includes a plurality of D-F/Fs (D-flip flops) 231.

Further, in the repeater column 43, a plurality of repeater circuits 232 that transmit the clock signal CLK output from the gray code decoder 32 are provided. More specifically, a plurality of repeater circuits 232A are arranged in series in the column direction of the pixel array unit 12, and to each D-F/F 231 of each of the N pieces of shift resisters 221-1 to 221-N, the clock signal CLK is supplied via the repeater circuit 232B connected to a subsequent stage of the predetermined repeater circuit 232A. The repeater circuit 232B is connected to one or more D-F/Fs 231. In FIG. 6, an example in which the repeater circuit 232B is connected to two D-F/Fs 231 is illustrated. In addition, a power supply of the repeater circuit 232 and wiring of GND are arranged so as to be separated from other circuits.

A transmission direction of the clock signal CLK of a plurality of repeater circuits 232A arranged in series in the column direction is a direction opposite to the transmission direction of the gray codes. In the example of FIG. 6, the transmission direction of the gray codes is a direction from top down, and therefore the transmission direction of the clock signal CLK is a direction from bottom up. Through the processing, as the repeater circuit 232A is arranged nearer to the upper side (the side near to the gray code generator 31) of FIG. 6, a delay of the clock signal CLK becomes larger, and in each D-F/F 231 of the shift register 221, after the gray code latched values held by itself are output, the next gray code latched value is input. In other words, a margin of a holding time in the data transfer of the gray code latched value can be secured definitely.

Further, the repeater column 43 includes N pieces of bidirectional buffer circuits 222-1 to 222-N corresponding to the N-bit gray codes between one latch storage unit 52 and one D-F/F 231. In other words, the N pieces of bidirectional buffer circuits 222-1 to 222-N are provided one-on-one corresponding to N pieces of shift resisters 221-1 to 221-N In addition, in the repeater column 43, the N pieces of bidirectional buffer circuits 222-1 to 222-N are provided corresponding to the number of the D-F/Fs 231; however, in FIG. 6, only one from among them is illustrated.

The bidirectional buffer circuit 222-*n* (1≤n≤N) has a buffer circuit 241 and an inverter circuit 242.

To the buffer circuit 241, the writing control signal WR to be Hi in the writing operation of the gray code is supplied and, to the inverter circuit 242, the reading control signal RD to be Hi in the reading operation of the gray code is supplied. On the basis of the writing control signal WR and the reading control signal RD, the bidirectional buffer circuit 222-*n* switches the writing operation and the reading operation of the gray code for the bit storage unit 141-*n*.

During the AD conversion period at which the sweeping of the reference signal REF is performed, the N pieces of shift registers 221 of the repeater column 43 transfer the gray codes supplied from the gray code generator 31 on the basis of a shift clock using a unit time of the gray code as a clock cycle.

In the writing operation of the gray code, a Hi writing control signal WR and a Lo reading control signal RD are supplied to the bidirectional buffer circuit 222, and the bidirectional buffer circuit 222 supplies the gray codes supplied from a predetermined D-F/F 231 of the shift resister 221 to the bit storage unit 141 via the transfer gate 161. The bit storage unit 141 stores the supplied gray codes.

On the other hand, in the reading operation of the gray code, the gray code latched values stored in the bit storage unit 141 are supplied to the predetermined D-F/F 231 in the shift resister 221 of the repeater column 43 via the bidirectional buffer circuit 222. The shift resister 221 transfers the gray code latched values supplied to the D-F/F 231 in each stage sequentially up to the I/O circuit 17 and outputs the gray code latched values.

More specifically, to each D-F/F 231 of the shift resister 221, a configuration in which the clock signal CLK supplied to a clock input can be in a high impedance state (hereinafter, described as a Hi-Z state) in any one of Hi and Lo is adopted. For example, in the after-mentioned configuration of the D-F/F 231 in FIG. 7, when the clock signal CLK is Lo, the D-F/F 231 is in the Hi-Z state.

During a period at which each D-F/F 231 of the shift resister 221 is in the Hi-Z state, a Hi reading control signal RD is supplied to the bidirectional buffer circuit 222; at the same time, the WORD signal becomes Hi and the gray code latched values stored in the bit storage unit 141 are supplied to the predetermined D-F/F 231 in the shift resister 221 of the repeater column 43 via the bidirectional buffer circuit 222.

After the reading control signal RD is returned to Lo, a shift clock is supplied to each D-F/F 231 in the shift resister 221, and the shift resister 221 transfers the gray code latched values supplied to the D-F/F 231 in each stage sequentially up to the gray code decoder 32 and outputs the gray code latched values.

<Configuration Example of D-F/F>

Figure 7:
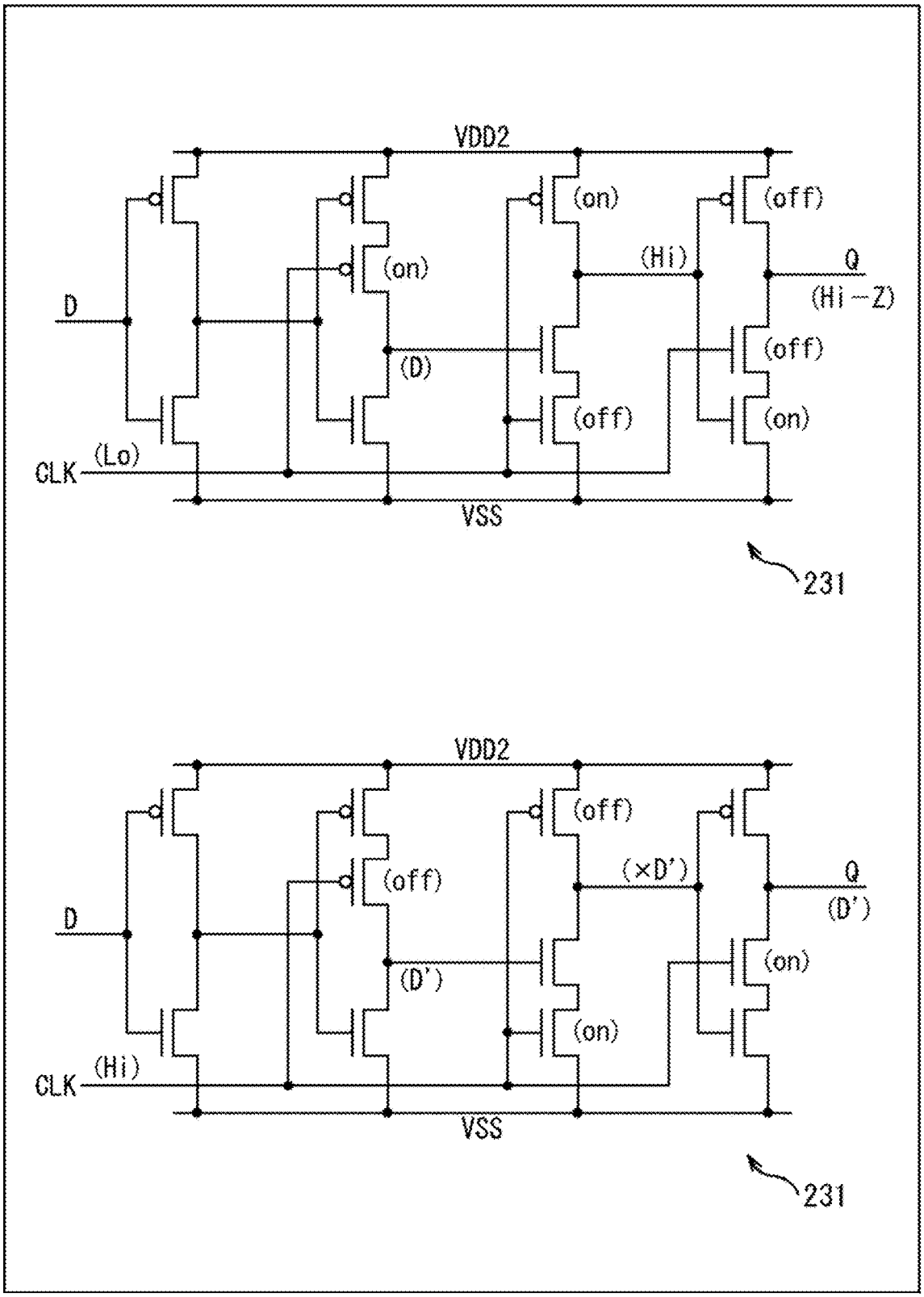
FIG. 7 is a diagram illustrating a configuration example of D-F/Fs in a shift register.

FIG. 7 illustrates a configuration example of the D-F/F 231 in the shift register 221.

The D-F/F 231 in the upper stage of FIG. 7 illustrates the Hi-Z state at the time when an Lo clock signal CLK is supplied. The D-F/F 231 in the lower stage of FIG. 7 illustrates a state in which previous data D' is output at the time when a Hi clock signal CLK is supplied.

In FIG. 7, characters such as on and off described in parentheses in the vicinity of each transistor or signal line illustrate a potential state of each transistor or signal line at the time when the Lo or Hi clock signal CLK is input to the clock input.

<Configuration Example of Bidirectional Buffer Circuit>

Figure 8:
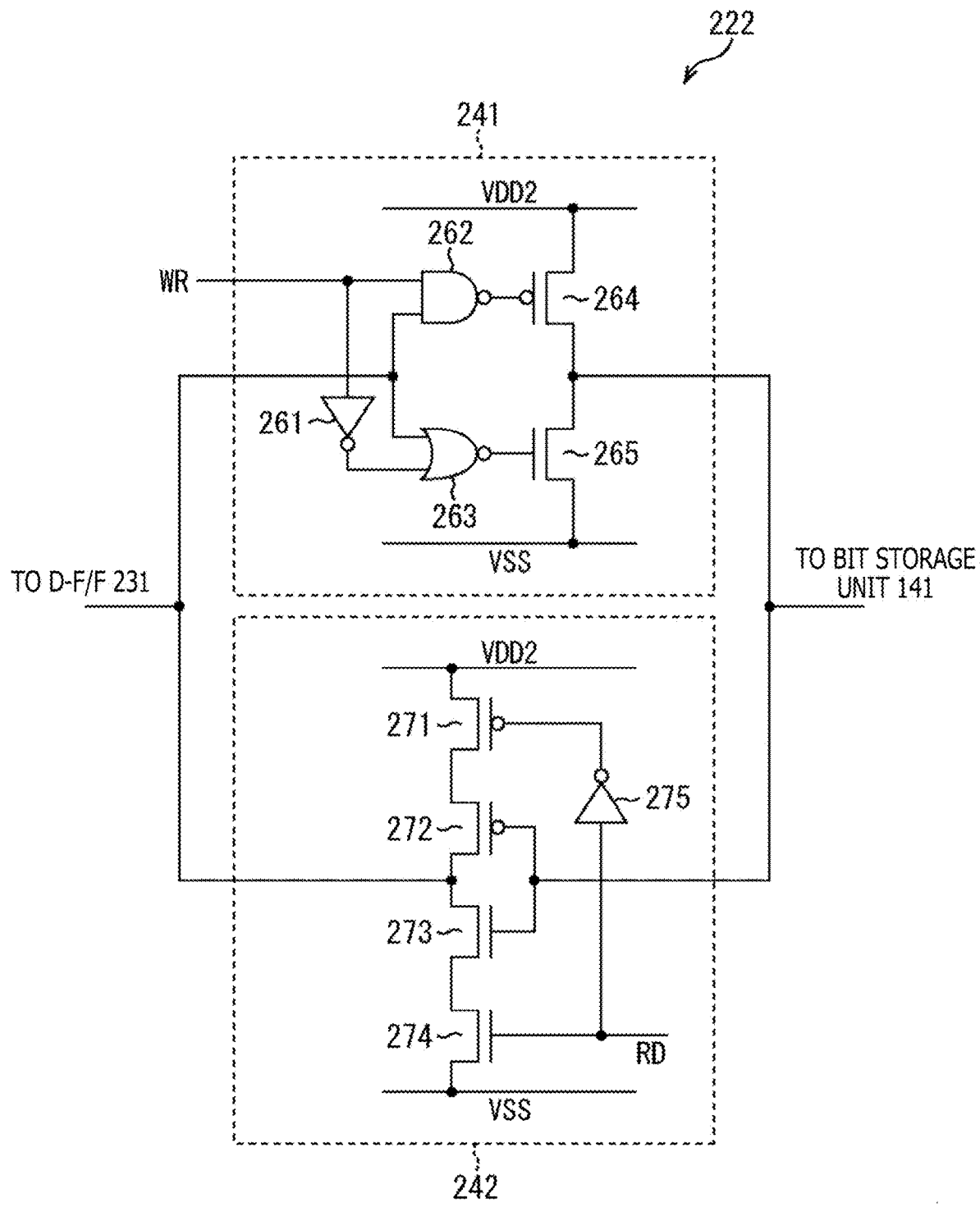
FIG. 8 is a diagram illustrating a configuration example of a bidirectional buffer circuit.

FIG. 8 illustrates a configuration example of the bidirectional buffer circuit 222.

The bidirectional buffer circuit 222 illustrated in FIG. 8 is configured of the buffer circuit 241 and the inverter circuit 242.

The buffer circuit 241 is configured of an inverter 261, a NAND circuit 262, a NOR circuit 263, a PMOS transistor 264, and an NMOS transistor 265.

In the buffer circuit 241, when the writing control signal WR is Hi, outputs of the NAND circuit 262 and the NOR circuit 263 are obtained together by inverting the gray codes supplied from the D-F/F 231 of the repeater column 43. Since an output of the buffer circuit 241 is obtained by further inverting the gray codes, as a result, the output has the same values as those of the gray codes supplied from the D-F/F 231. When the writing control signal WR is Lo, an output of the NAND circuit 262 is Hi, an output of the NOR circuit 263 is Lo, and an output of the buffer circuit 241 is in the Hi-Z state.

On the other hand, the inverter circuit 242 is configured of a clocked inverter including two PMOS transistors 271 and 272, two NMOS transistors 273 and 274, and an inverter 275.

In the inverter circuit 242, when the reading control signal RD is Hi, the clocked inverter becomes active and the inverter circuit 242 inverts and outputs the gray code latched values supplied from the bit storage unit 141. When the reading control signal RD is Lo, the clocked inverter becomes inert (nonactive) and an output of the inverter circuit 242 is in the Hi-Z state.

In the configuration of the bidirectional buffer circuit 222 of FIG. 8, as described above, when the gray codes supplied from the D-F/Fs 231 in the repeater column 43 are written in the bit storage unit 141, the gray codes have the same values as those of the gray codes supplied from the D-F/Fs 231 and therefore a polarity is not inverted; further, when the gray code latched values stored in the bit storage unit 141 are read out, the polarity is inverted. Thus, the read-out gray codes (the gray code latched values) are inverted data of the supplied gray codes.

To solve the above problem, by providing the inverter in the previous stage of the inverter circuit 242, the D-F/F 231 may be configured so that the gray code latched value read out from the bit storage unit 141 is output with the same polarity as that of the supplied gray code.

5. Arrangement Example of Pixel Circuit and ADC

Figure 9:
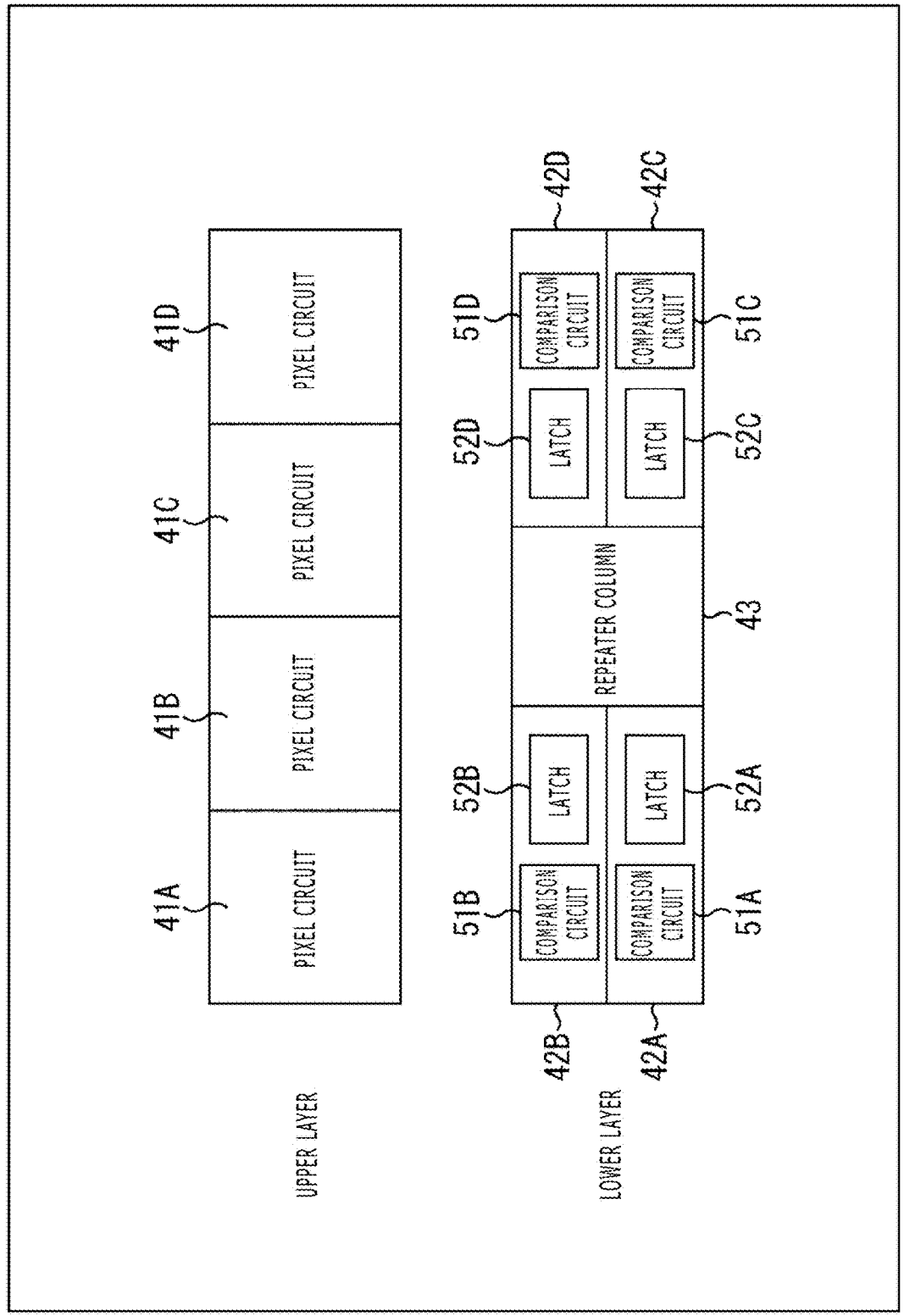
FIG. 9 is a diagram illustrating an arrangement configuration of a pixel circuit, the ADC, and the repeater column.

FIG. 9 illustrates an arrangement configuration of the pixel circuit 41, the ADC 42, and the repeater column 43 in the pixel array unit 12.

In the pixel array unit 12, as illustrated in FIG. 2, the pixel circuit 41, the ADC 42, and the repeater column 43 are not arranged side by side in the plane direction, but a stacked structure (two-layer structure) is adopted in which the pixel circuits 41 are arranged in an upper layer and the ADCs 42 and the repeater columns 43 are arranged in a lower layer thereof as illustrated in FIG. 9.

A configuration is adopted in which the pixel circuits 41 in the upper layer are arranged, for example, in the shape of a square and in a matrix form, and relating to the ADCs 42 and the repeater columns 43 in the lower layer, the repeater column 43 is arranged in a central portion in the horizontal direction and the ADCs 42 are arranged on both sides of the repeater column 43.

More specifically, as illustrated in FIG. 9, using as one unit four pixels in the horizontal direction, a configuration is adopted in which the pixel circuits 41 of four pixels are evenly arranged in the shape of a square in the upper layer, and the repeater column 43 is arranged in the central portion in the horizontal direction and the ADCs 42 are arranged by two pixels on both sides thereof in the lower side. When the pixel circuits 41 of four pixels in the upper layer are distinguished as the pixel circuits 41A to 41D from the left side of FIG. 9, the ADCs 42A and 42B corresponding to the pixel circuits 41A and 41B are arranged side by side in the vertical direction on the left side of the repeater column 43 in the lower layer and the ADCs 42C and 42D corresponding to the pixel circuits 41C and 41D are arranged side by side in the vertical direction on the right side of the repeater column 43. In each of the ADCs 42A to 42D, the latch storage units 52A to 52D are arranged on the side close to the repeater column 43 and the comparison circuits 51A to 51D are arranged on the side away from the repeater column 43.

Figure 10:
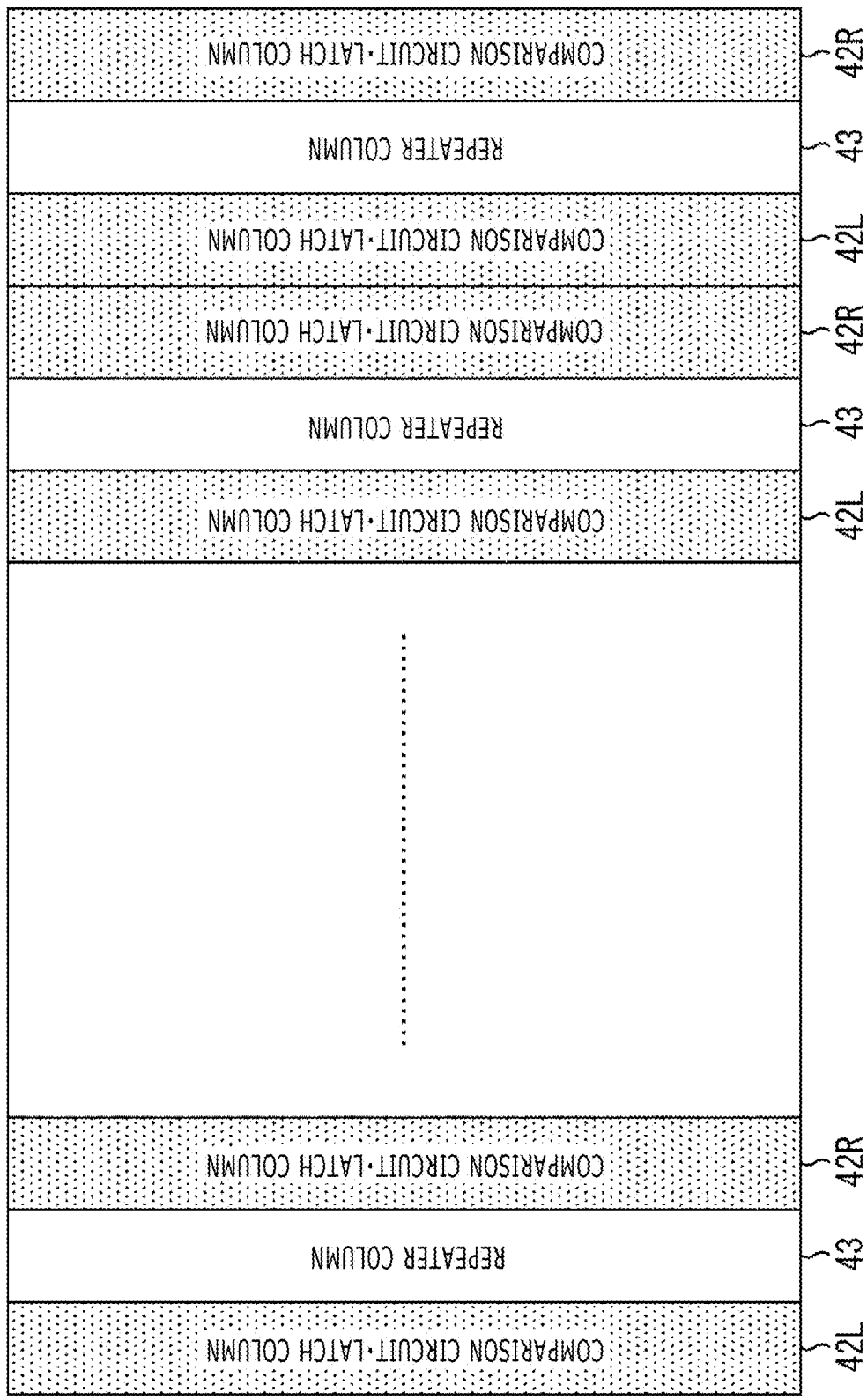
FIG. 10 is a diagram illustrating an arrangement configuration of the ADCs and the repeater columns in the overall pixel array unit.

FIG. 10 is a diagram illustrating an arrangement configuration of the ADCs 42 and the repeater columns 43 in the overall pixel array unit 12.

In the lower layer of the pixel array unit 12, a unit in which the comparison circuit/latch column 42L and the comparison circuit/latch column 42R are arranged on both sides of the repeater column 43 is arranged and configured repeatedly in the horizontal direction.

In each region of the comparison circuit/latch column 42L and the comparison circuit/latch column 42R, as illustrated in FIG. 9, the comparison circuit 51 and the latch storage unit 52 are arranged repeatedly in the vertical direction.

A unit including one repeater column 43 and the comparison circuits/latch columns 42L and 42R on both sides thereof corresponds to a region of the block BL in which the pixel array unit 12 is divided in the horizontal direction in FIG. 2.

Figure 11:
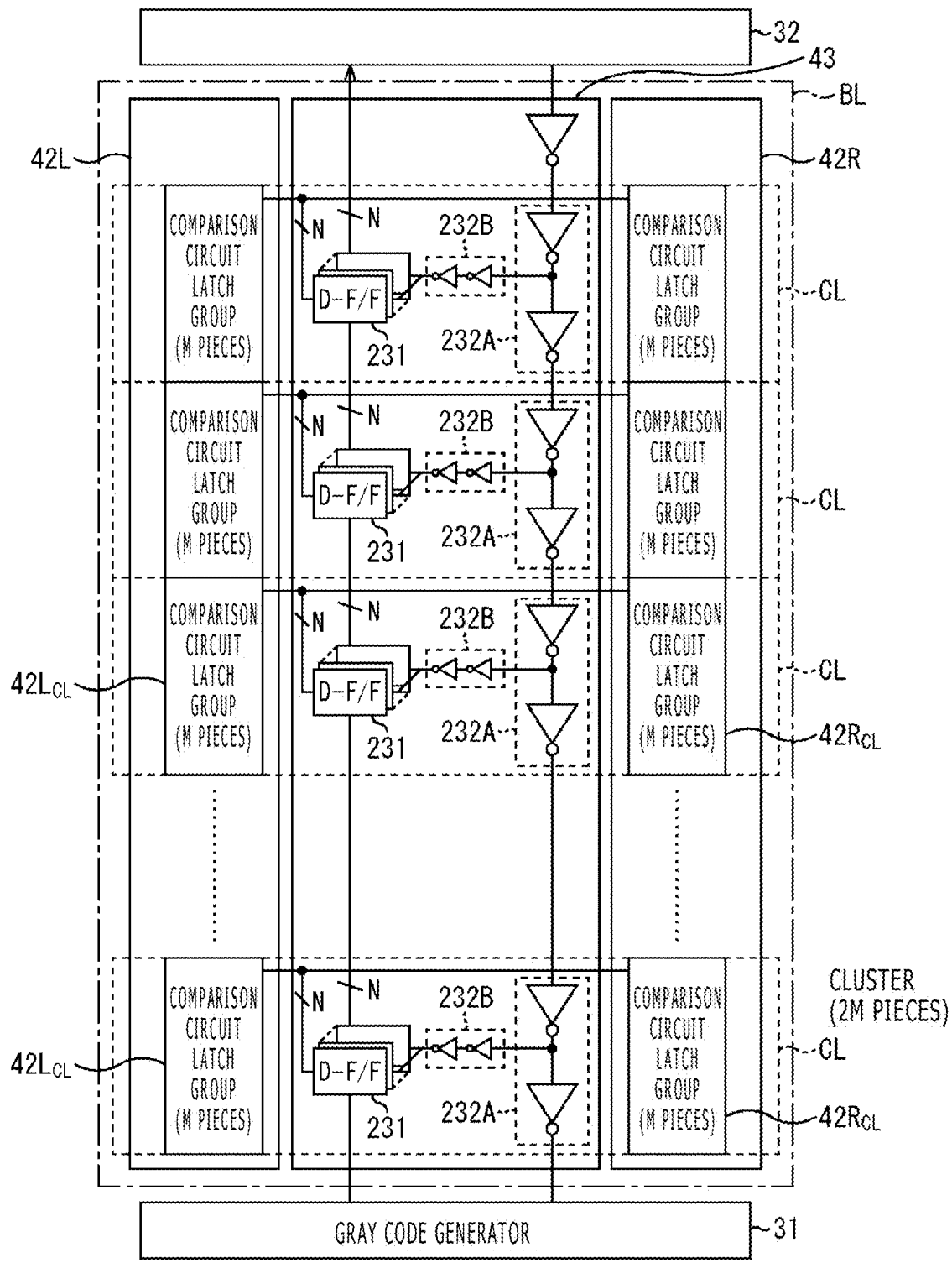
FIG. 11 is a diagram illustrating an arrangement configuration of one block BL of a lower portion of the pixel array unit.

With reference to FIG. 11, a detailed configuration of one block BL in a portion of the lower layer of the pixel array unit 12 will be described.

One block BL in the lower layer of the pixel array unit 12 is further divided in units of a plurality of pixels in the vertical direction and the division unit is set to a cluster CL. Therefore, one block BL is configured by including a plurality of clusters CL arrayed in the vertical direction.

Then, in each cluster CL arrayed repeatedly in the vertical direction, N pieces of D-F/Fs 231 corresponding to N-bit gray codes and the repeater circuits 232A and 232B transmitting the clock signal CLK described with reference to FIG. 6 are arranged.

In FIG. 11, N pieces of bidirectional buffer circuits 222-1 to 222-N provided ahead of N pieces of D-F/Fs 231 corresponding to the N-bit gray codes are omitted in the figure.

The comparison circuit/latch column 42L on the left side of the repeater column 43 is divided into a comparison circuit latch group $42L_{CL}$ including M (M>0) pieces of comparison circuits 51 and latch storage units 52 in units of the cluster CL arrayed in the vertical direction. The comparison circuit/latch column 42R on the right side of the repeater column 43 is divided into a comparison circuit latch group $42R_{CL}$ including M pieces of comparison circuits 51 and latch storage units 52 in units of the cluster CL arrayed in the vertical direction.

Figure 12:
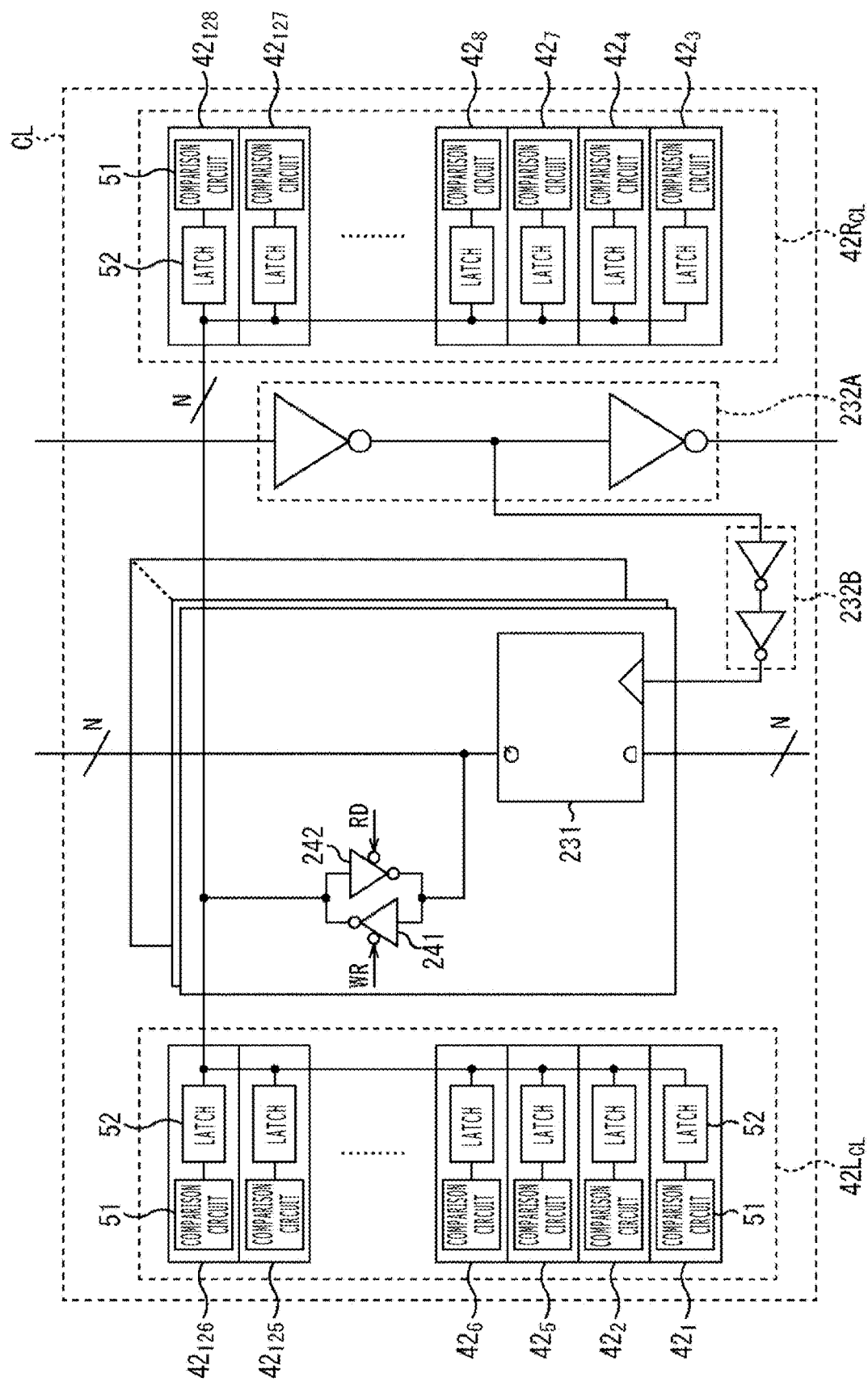
FIG. 12 is a diagram illustrating a more detailed configuration of one cluster CL.

FIG. 12 is a diagram in which one cluster CL is illustrated in more detail.

For example, in the case where one cluster CL is configured of a pixel region including four pixels in the horizontal direction and 32 pixels in the vertical direction, 4 32=128 ADCs 42 are arranged in the one cluster CL. The 128 ADCs 42 are distributed by 64 pieces to the comparison circuit latch group $42L_{CL}$ and the comparison circuit latch group $42R_{CL}$. That is, in an example of FIG. 12, an example in the case where M in FIG. 11 is 64 (M=64) is illustrated.

An arrangement of 128 ADC $42_1$ to ADC $42_{128}$ in the comparison circuit latch group $42L_{CL}$ and the comparison circuit latch group $42R_{CL}$ is the arrangement in which the ADCs 42A to 42D illustrated in FIG. 9 are arrayed repeatedly in the vertical direction.

In addition, the number of pixels configuring one cluster CL is not limited to 128 pixels illustrated in FIG. 12. As described above, the repeater circuits 232A and 232B, N pieces of D-F/Fs 231 corresponding to the N-bit gray codes and N pieces of bidirectional buffer circuits 222-1 to 222-N are arranged in units of the cluster CL, and therefore a range in which signal waveforms of the clock signal CLK etc. to be transmitted in the vertical direction are not deformed may be set in units of the cluster CL.

Further, in the above-mentioned example, as illustrated in FIG. 9, a configuration is adopted in which a unit is arranged repeatedly in the vertical direction in which the upper layer of the pixel array unit 12 includes four pixel circuits 41 of 1 row by 4 columns (1×4) and the lower layer of the pixel array unit 12 includes four ADCs 42 of 2 rows by 2 columns (2×2) in which two ADCs 42 are arrayed vertically on the right side and the left side centering on the repeater column 43. The unit arranged repeatedly in units of this cluster CL is not also limited to a configuration in which the upper layer includes (1×4) ADCs 42 and the lower layer includes (2×2) ADCs 42. For example, a unit can be set to a repeating unit in which the upper layer of the pixel array unit 12 includes six pixel circuits 41 of 1 row by 6 columns (1×6) and the lower layer of the pixel array unit 12 includes six ADCs 42 of 3 rows by 2 columns (3×2) in which three ADCs 42 are arrayed vertically on the right side and the left side centering on the repeater column 43.

6. Configuration Example of Pixel Circuit

Subsequently, a configuration example and operations of the pixel circuit 41 that can be taken by the solid-state image pickup device 1 will be described.

6. 1 First Configuration Example of Pixel Circuit

First, a first configuration example of the pixel circuit 41 will be described with reference to FIG. 13.

Figure 3:
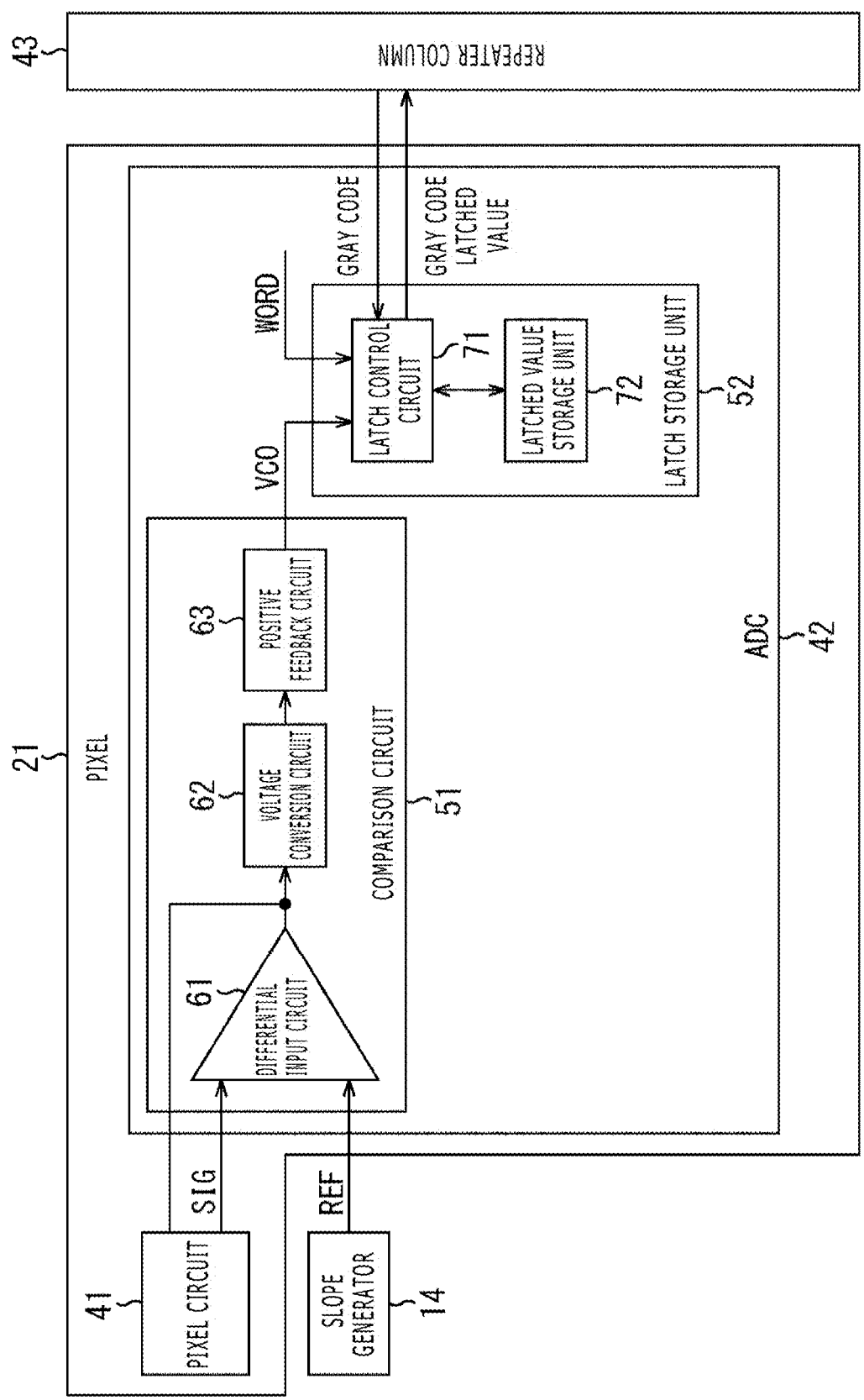
FIG. 3 is a diagram illustrating a detailed configuration of an ADC.
Figure 13:
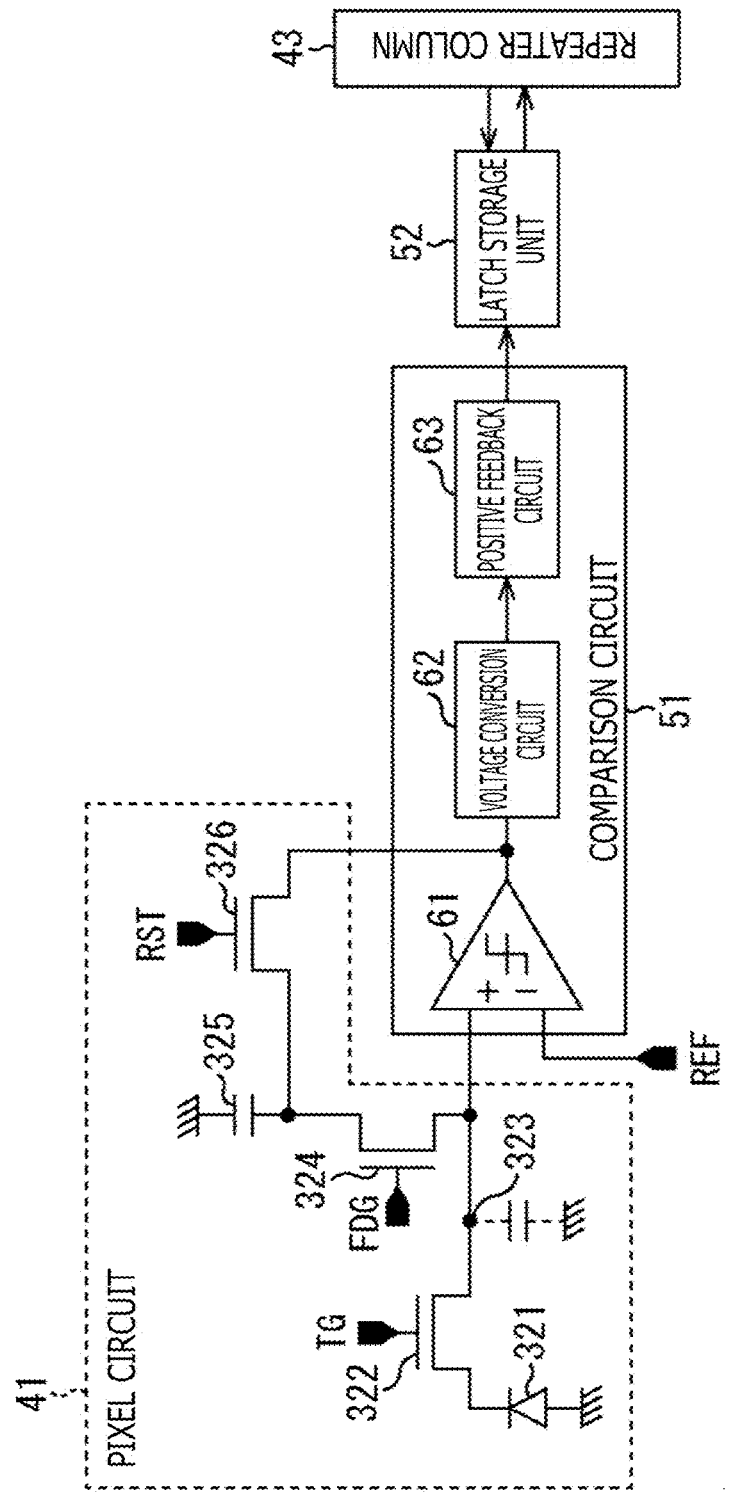
FIG. 13 is a diagram illustrating a pixel circuit of a first configuration example.

FIG. 13 is a diagram in which the pixel circuit 41 of the first configuration example is illustrated along with the comparison circuit 51, the latch storage unit 52, and the repeater column 43 illustrated in FIG. 3.

The pixel circuit 41 is configured of a photodiode (PD) 321 as a photoelectric conversion element, a first transfer transistor 322, an FD (floating diffusion layer) 323, a second transfer transistor 324, a lateral over flow integration capacitor 325 (hereinafter, referred to as a LOFIC 325), and a reset transistor 326.

The first transfer transistor 322 transfers a charge generated by the photodiode 321 to the FD 323. The second transfer transistor 324 transfers a charge exceeding the saturated amount of charges of the photodiode 321, in other words, a charge overflowed from the photodiode 321 to the LOFIC 325 via the FD323. The LOFIC 325 accumulates the charge overflowed from the photodiode 321.

The reset transistor 326 resets a charge held in the FD 323 and the LOFIC 325. The FD 323 is connected to a gate (FIG. 4) of the transistor 82 in the differential input circuit 61. This processing permits the transistor 82 in the differential input circuit 61 to function as also an amplifier transistor of the pixel circuit 41.

A source of the reset transistor 326 is connected to the FD 323 and the gate of the transistor 82 in the differential input circuit 61 via the second transfer transistor 324; further, a drain of the reset transistor 326 is connected to the drain (FIG. 4) of the transistor 82 in the differential input circuit 61. Therefore, a fixed reset voltage for resetting a charge of the FD 323 is not present. The reason is that a circuit state of the differential input circuit 61 is controlled and thereby a reset voltage for resetting the FD 323 can be set arbitrarily by using the reference signal REF.

The pixel circuit 41 of the first configuration example configured as described above includes the LOFIC 325, and thereby a charge larger than that capable of being held in the photodiode 321 can be held to thereby realize a broad dynamic range.

<Timing Chart of First Configuration Example>

Operations of the pixel 21 using the pixel circuit 41 of the first configuration example illustrated in FIG. 13 will be described with reference to a timing chart of FIG. 14.

The pixel 21 using the pixel circuit 41 of the first configuration example outputs two kinds of pixel signals of a low-light intensity pixel signal and a high-light intensity pixel signal.

First, the pixel 21 receives light by the photodiode 321 and outputs a charge accumulated in the photodiode 321 as the low-light intensity pixel signal.

At the time t1, the reference signal REF is set to a reset voltage $V_{rst}$ for resetting a charge of the FD 323 and the LOFIC 325 from a previous standby voltage $V_{stb}$, and at the same time the second transfer transistor 324 is turned on by a Hi transfer signal FDG, and the FD323 is connected to the LOFIC 325. Then, at the time t2, the first transfer transistor 322 and the reset transistor 326 are turned on by using a Hi transfer signal TG and a Hi reset signal RST, and thereby an accumulated charge of the photodiode 321 and an accumulated charge of the FD 323 and the LOFIC 325 are reset.

During a period from the time t3 to the time t4 after the first transfer transistor 322 and the reset transistor 326 are turned off, exposure is performed. During the exposure period, the transfer signal FDG is controlled to Hi and the second transfer transistor 324 is turned on.

At the time t4, the reference signal REF is raised up to a predetermined voltage $V_u$ and a comparison (the sweeping of the reference signal REF) of the reference signal REF and the pixel signal SIG is started. At this time point, the reference signal REF is larger than the pixel signal SIG, and therefore the output signal VCO becomes Hi. After a predetermined time of the time t4 has elapsed, the transfer signal FDG is controlled to Lo from Hi and the second transfer transistor 324 is turned off.

At the time t5 at which it is determined that the reference signal REF and the pixel signal SIG are the same, the output signal VCO is inverted (transits to Low). When the output signal VCO is inverted, an inversion of the output signal VCO is speeded up by using the positive feedback circuit 63 as described above. Further, in the latch storage unit 52, the gray code (LBL [1] to LBL [N] of N bits) is latched and stored at the time point at which the output signal VCO is inverted.

At the time t6 at which the signal writing period is finished and that is a start time of the signal reading period, a voltage of the reference signal REF supplied to the gate of the transistor 81 in the comparison circuit 51 is reduced to a level (the standby voltage $V_{stb}$) in which the transistor 81 is turned off. Through this processing, consumption current of the comparison circuit 51 during the signal reading period is suppressed.

At the time t7, the WORD signal (not illustrated) for controlling the reading timing becomes Hi and an N-bit latch signal LBL [n] (n=1 to N) is output from the latch storage unit 52. Data obtained herein is P phase data (hereinafter, also referred to as P1 data) in a reset level of the low-light intensity pixel signal.

At the time t8, the reference signal REF is raised up to a predetermined voltage $V_u$.

At the time t9, the first transfer transistor 322 in the pixel circuit 41 is turned on by a Hi transfer signal TG and a charge accumulated in the photodiode 321 is transferred to the FD 323.

After the first transfer transistor 322 is turned off, the comparison (the sweeping of the reference signal REF) of the reference signal REF and the pixel signal SIG is started. At this time point, the reference signal REF is larger than the pixel signal SIG, and therefore the output signal VCO becomes Hi.

At the time t10 at which it is determined that the reference signal REF and the pixel signal SIG are the same, the output signal VCO is inverted (transits to Low). When the output signal VCO is inverted, an inversion of the output signal VCO is speeded up by using the positive feedback circuit 63. Further, in the latch storage unit 52, the gray code (LBL [1] to LBL [N] of N bits) is latched and stored at the time point at which the output signal VCO is inverted.

At the time t11 at which the signal writing period is finished and that is a start time of the signal reading period, a voltage of the reference signal REF supplied to the gate of the transistor 81 in the comparison circuit 51 is reduced to a level (the standby voltage $V_{stb}$) in which the transistor 81 is turned off. Through this processing, consumption current of the comparison circuit 51 during the signal reading period is suppressed.

At the time t12, the WORD signal (not illustrated) for controlling the reading timing becomes Hi and an N-bit LBL [n] (n=1 to N) is output from the latch storage unit 52. Data obtained herein is D phase data (hereinafter, also referred to as D1 data) in a signal level of the low-light intensity pixel signal.

With that, an output of the low-light intensity pixel signal is finished.

Next, the pixel 21 receives light by the photodiode 321 and outputs as the high-light intensity pixel signal a charge overflowed from the photodiode 321 and accumulated in the LOFIC 325.

First, at the time t13, the second transfer transistor 324 is turned on by using the Hi transfer signal FDG, and at the same time the reference signal REF is raised up to the predetermined voltage $V_u$ and a comparison (the sweeping of the reference signal REF) of the reference signal REF and the pixel signal SIG is started. At this time point, the reference signal REF is larger than the pixel signal SIG, and therefore the output signal VCO becomes Hi.

At the time t14 at which it is determined that the reference signal REF and the pixel signal SIG are the same, the output signal VCO is inverted (transits to Low). When the output signal VCO is inverted, an inversion of the output signal VCO is speeded up by using the positive feedback circuit 63. Further, in the latch storage unit 52, the gray code (LBL [1] to LBL [N] of N bits) is latched and stored at the time point at which the output signal VCO is inverted.

At the time t15 at which the signal writing period is finished and that is a start time of the signal reading period, a voltage of the reference signal REF supplied to the gate of the transistor 81 in the comparison circuit 51 is reduced to a level (the standby voltage $V_{stb}$) in which the transistor 81 is turned off. Through this processing, the consumption current of the comparison circuit 51 during the signal reading period is suppressed.

At the time t16, the WORD signal (not illustrated) for controlling the reading timing becomes Hi and an N-bit latch signal LBL [n] (n=1 to N) is output from the latch storage unit 52. Data obtained herein is D phase data (hereinafter, also referred to as D2 data) in a signal level of the high-light intensity pixel signal.

At the time t17, the reference signal REF is set to the reset voltage $V_{rst}$ for resetting a charge of the FD 323 and the LOFIC 325 from the previous standby voltage $V_{stb}$.

At the time t18, the second transfer transistor 324 is turned off by using the Lo transfer signal FDG, and at the same time the first transfer transistor 322 and the reset transistor 326 are turned on by using the Hi transfer signal TG and the Hi reset signal RST. Then, while the reset transistor 326 is turned on, the transfer signal FDG is changed to Hi and the second transfer transistor 324 is turned on. As a result, the accumulated charge of the photodiode 321 and the accumulated charge of the FD 323 and the LOFIC 325 are reset.

Then, at the time t19, the reference signal REF is raised up to the predetermined voltage $V_u$ and a comparison (the sweeping of the reference signal REF) of the reference signal REF and the pixel signal SIG is started. At this time point, the reference signal REF is larger than the pixel signal SIG, and therefore the output signal VCO becomes Hi.

Then, at the time t20 at which it is determined that the reference signal REF and the pixel signal SIG are the same, the output signal VCO is inverted (transits to Low). When the output signal VCO is inverted, an inversion of the output signal VCO is speeded up by using the positive feedback circuit 63. Further, in the latch storage unit 52, the gray code (LBL [1] to LBL [N] of N bits) is latched and stored at the time point at which the output signal VCO is inverted.

At the time t21 at which the signal writing period is finished and that is a start time of the signal reading period, a voltage of the reference signal REF supplied to the gate of the transistor 81 in the comparison circuit 51 is reduced to a level (the standby voltage $V_{stb}$) in which the transistor 81 is turned off. Through this processing, the consumption current of the comparison circuit 51 during the signal reading period is suppressed.

At the time t22, the WORD signal (not illustrated) for controlling the reading timing becomes Hi and the N-bit LBL [n] (n=1 to N) is output from the latch storage unit 52. Data obtained herein is P phase data (hereinafter, also referred to as P2 data) in a reset level of the high-light intensity pixel signal.

At the time t23, the signal reading period is finished and the process is returned to the same state as that before the initialization before the time t1. A state of the time t24 is the same state as that of the above-mentioned time t1 and drives the next 1 V (one normal scan period).

Figure 15:
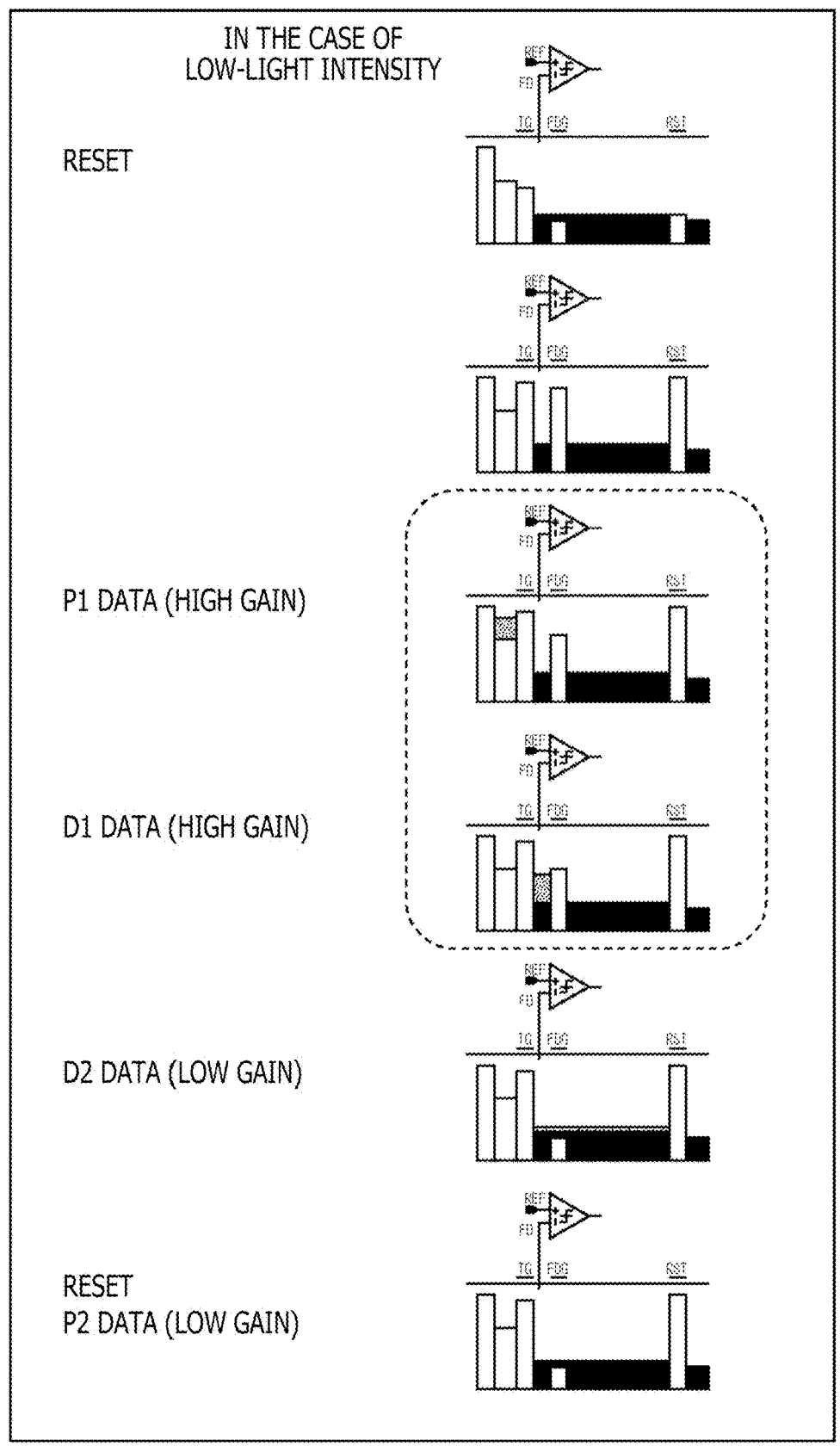
FIG. 15 is a potential diagram illustrating operations of the pixel circuit in the case of a low-light intensity.

FIG. 15 is a potential diagram illustrating operations of the pixel circuit 41 in the case where light received in the pixel 21 is a low-light intensity.

In the case where light received in the pixel 21 is the low-light intensity, in the same manner as in the potential diagram corresponding to the P1 data, a charge is accumulated only in the photodiode 321. In the same manner as in the potential diagram corresponding to the D1 data, even in a state in which this charge is transferred to the FD 323 by using the first transfer transistor 322, it does not exceed an overflow path of the second transfer transistor 324. Thus, a high-gain pixel signal can be obtained by using only the P1 data and D1 data illustrated by being surrounded by a broken line in FIG. 15

Figure 16:
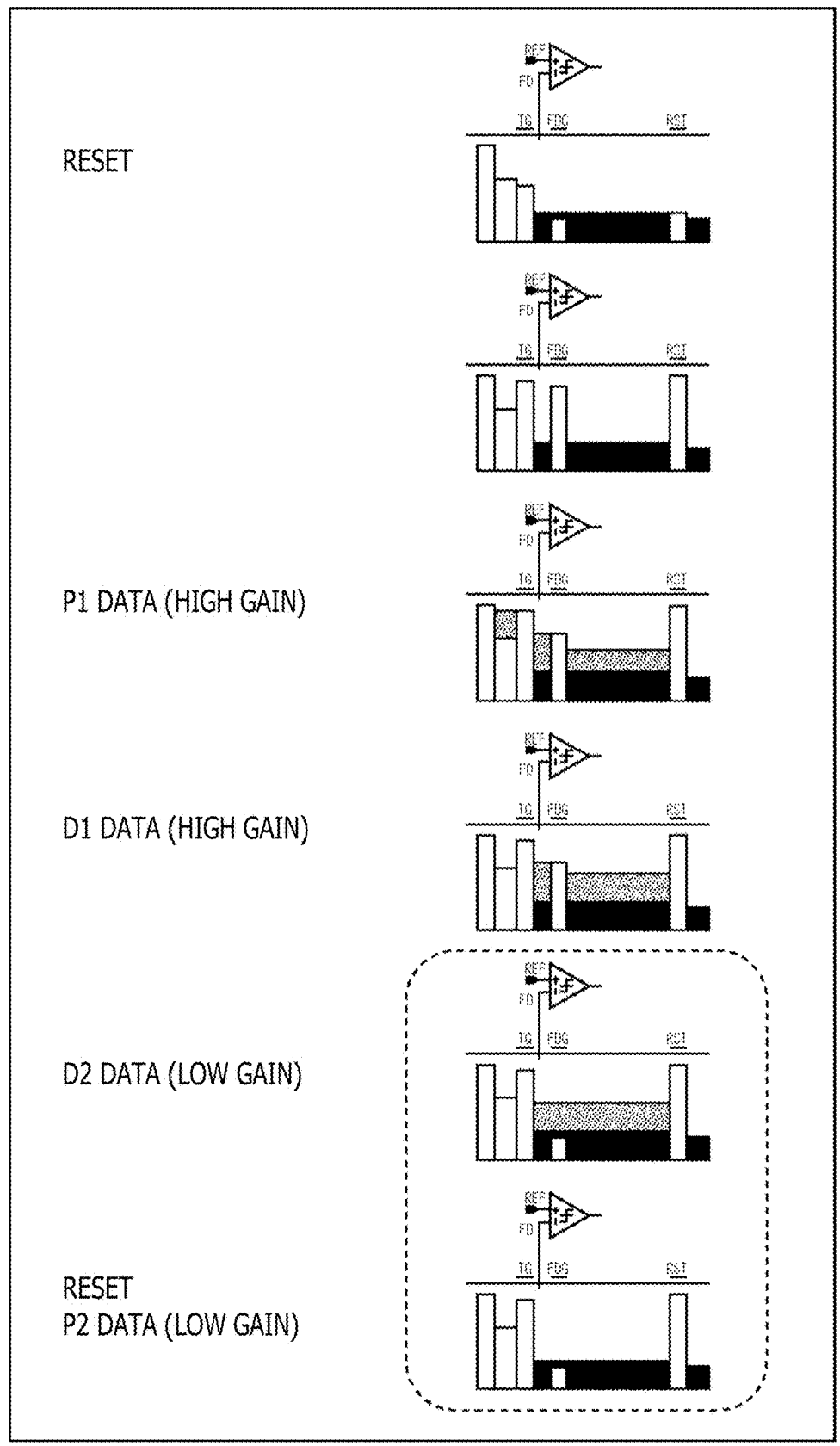
FIG. 16 is a potential diagram illustrating operations of the pixel circuit in the case of a high-light intensity.

FIG. 16 is a potential diagram illustrating operations of the pixel circuit 41 in the case where light received in the pixel 21 is a high-light intensity.

In the case where light received in the pixel 21 is the high-light intensity, in the same manner as in the potential diagram corresponding to the P1 data, a charge is accumulated also in the LOFI 325 through the photodiode 321 and the FD 323, and an overflow path of the second transfer transistor 324. Thus, a pixel signal corresponding to the high-light intensity can be obtained by using only the D2 data and the P2 data illustrated by being surrounded by a broken line in FIG. 16

In accordance with above-mentioned driving of the pixel 21, a charge accumulated in the photodiode 321 is first read out as the low-light intensity pixel signal in the order corresponding to the P1 data and the D1 data. Next, a charge overflowed from the photodiode 321 and accumulated in the LOFIC 325 is read out as the high-light intensity pixel signal in the order corresponding to the D2 data and the P2 data. Thus, the low-light intensity pixel signal becomes a CDS (correlated double sampling) signal, and on the other hand, the high-light intensity pixel signal becomes a DDS (double data sampling) signal.

In accordance with the above-mentioned driving, each pixel 21 of the pixel array unit 12 of the solid-state image pickup device 1 can perform a global shutter operation in which all pixels perform a reset operation at the same time and all pixels perform an exposure at the same time. Since all pixels can perform the exposure and reading at the same time, normally, a charge holding unit that is provided in the pixel and holds a charge during the reading operation is not required. Also, in the configuration of the pixel 21, select transistors etc. that are required in a column parallel readout type solid-state image pickup device and that select a pixel outputting the pixel signal SIG are not required.

6. 2 Second Configuration Example of Pixel Circuit

Subsequently, a second configuration example of the pixel circuit 41 will be described with reference to FIG. 17.

Figure 17:
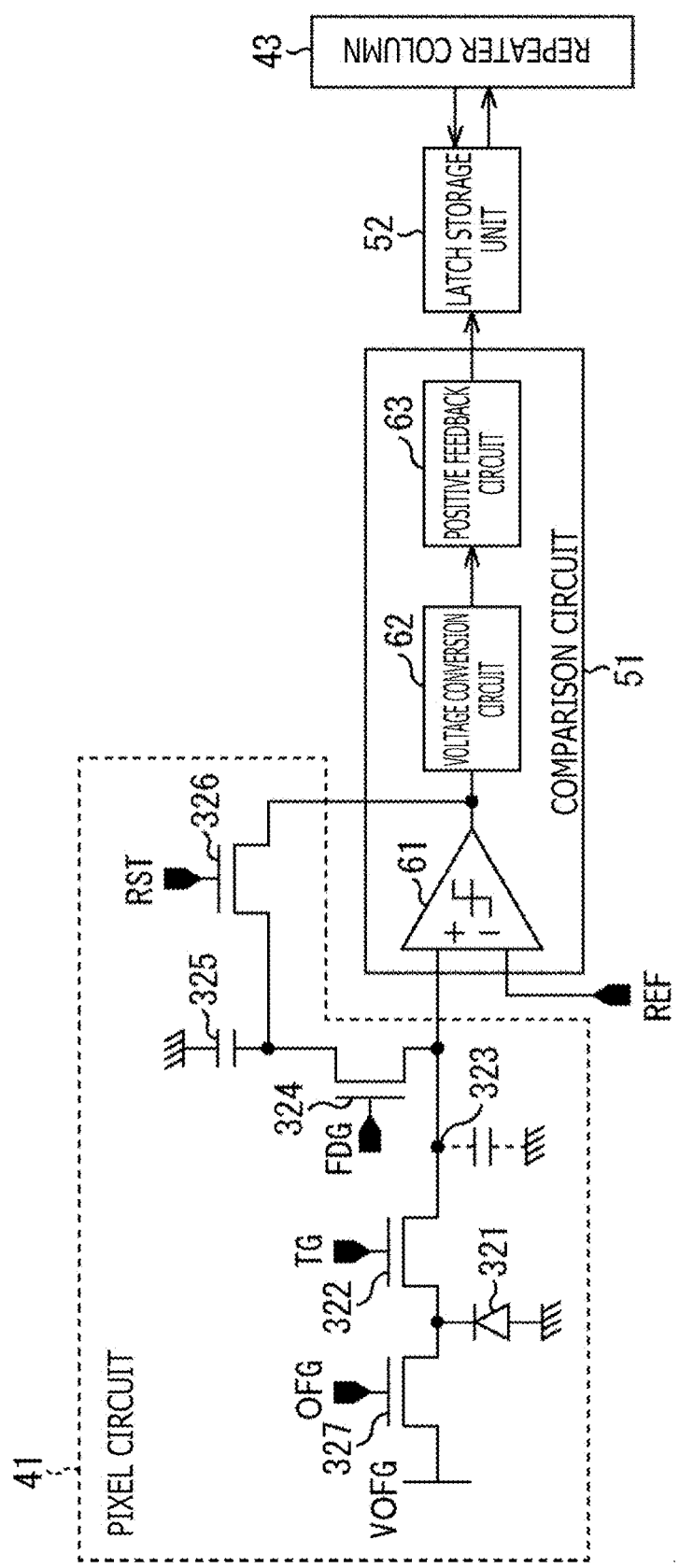
FIG. 17 is a diagram illustrating a pixel circuit of a second configuration example.

FIG. 17 is a diagram in which the pixel circuit 41 of the second configuration example is illustrated along with the comparison circuit 51, the latch storage unit 52, and the repeater column 43.

In the second configuration example of the pixel circuit 41 illustrated in FIG. 17, to a cathode terminal of the photodiode 321, the discharge transistor 327 is connected in addition to the first transfer transistor 322.

In the above-mentioned first configuration example, as illustrated with reference to FIG. 14, the first transfer transistor 322, the second transfer transistor 324, and the reset transistor 326 are turned on and the reference signal REF is set to the reset voltage $V_{rst}$, and thereby the reset operation of a charge is performed.

In the second configuration example, the discharge transistor 327 is provided, and thereby the discharge transistor 327 is turned on until a start of the exposure; further, at the time point at which the exposure is started, the discharge transistor 327 is turned off to thereby perform the reset operation of a charge. In the first configuration example, a plurality of transistors and the reference signal REF need to be controlled; in contrast, in the second configuration example, the reset operation of a charge can be performed only by control of the discharge transistor 327, and therefore further speeding up can be performed.

<Timing Chart of Second Configuration Example>

Figure 18:
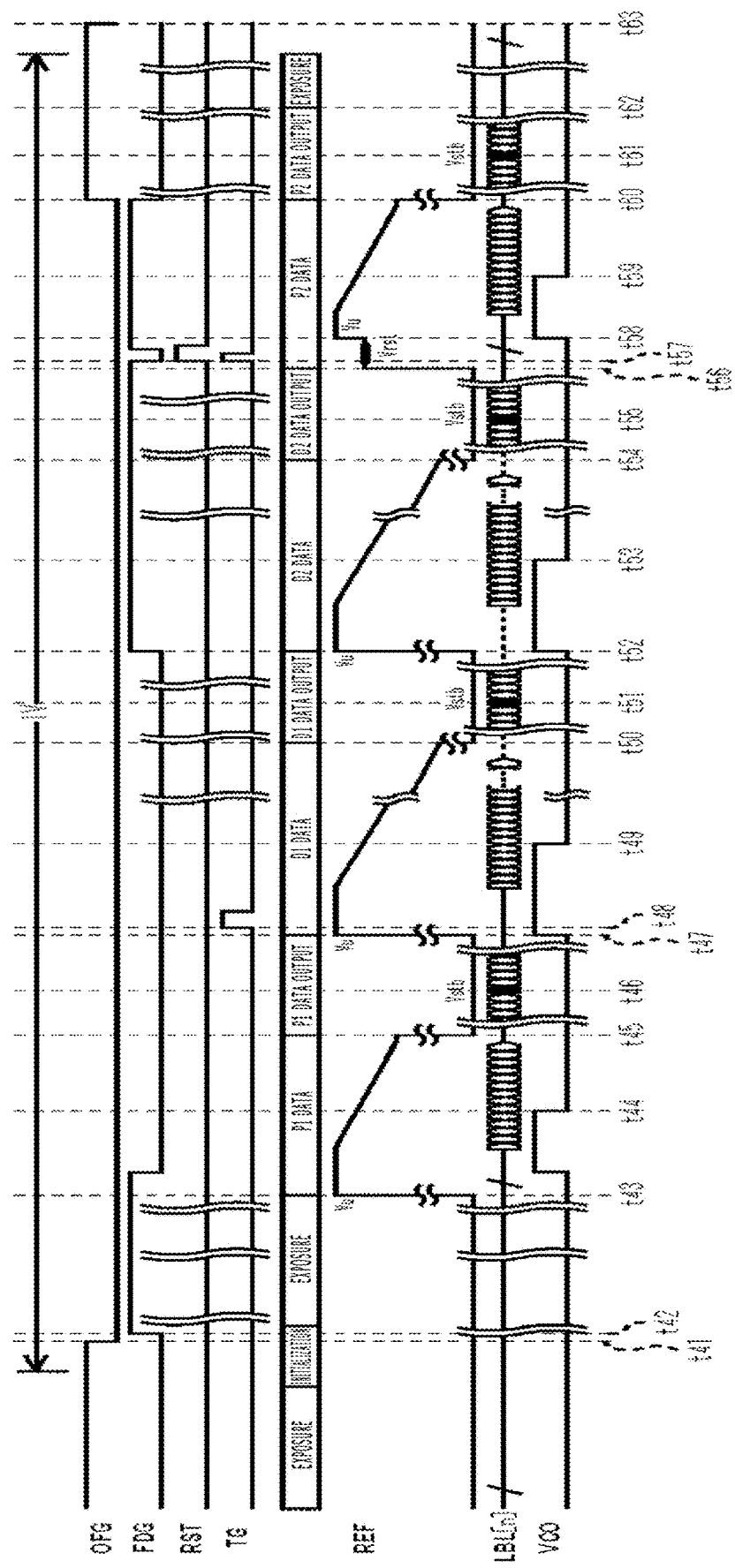
FIG. 18 is a diagram illustrating operations of a pixel having the pixel circuit of the second configuration example.

Operations of the pixel 21 using the pixel circuit 41 of the second configuration example illustrated in FIG. 17 will be described with reference to a timing chart of FIG. 18.

At the time t41, until the Hi discharge signal OFG is changed to Lo, a reset state of the photodiode 321 is continued. At the time t41, the discharge transistor 327 is turned off, and then at the time t42, the second transfer transistor 324 is turned on by the Hi transfer signal FDG and the exposure is started in a state in which the FD 323 and the LOFIC 325 are connected.

Figure 14:
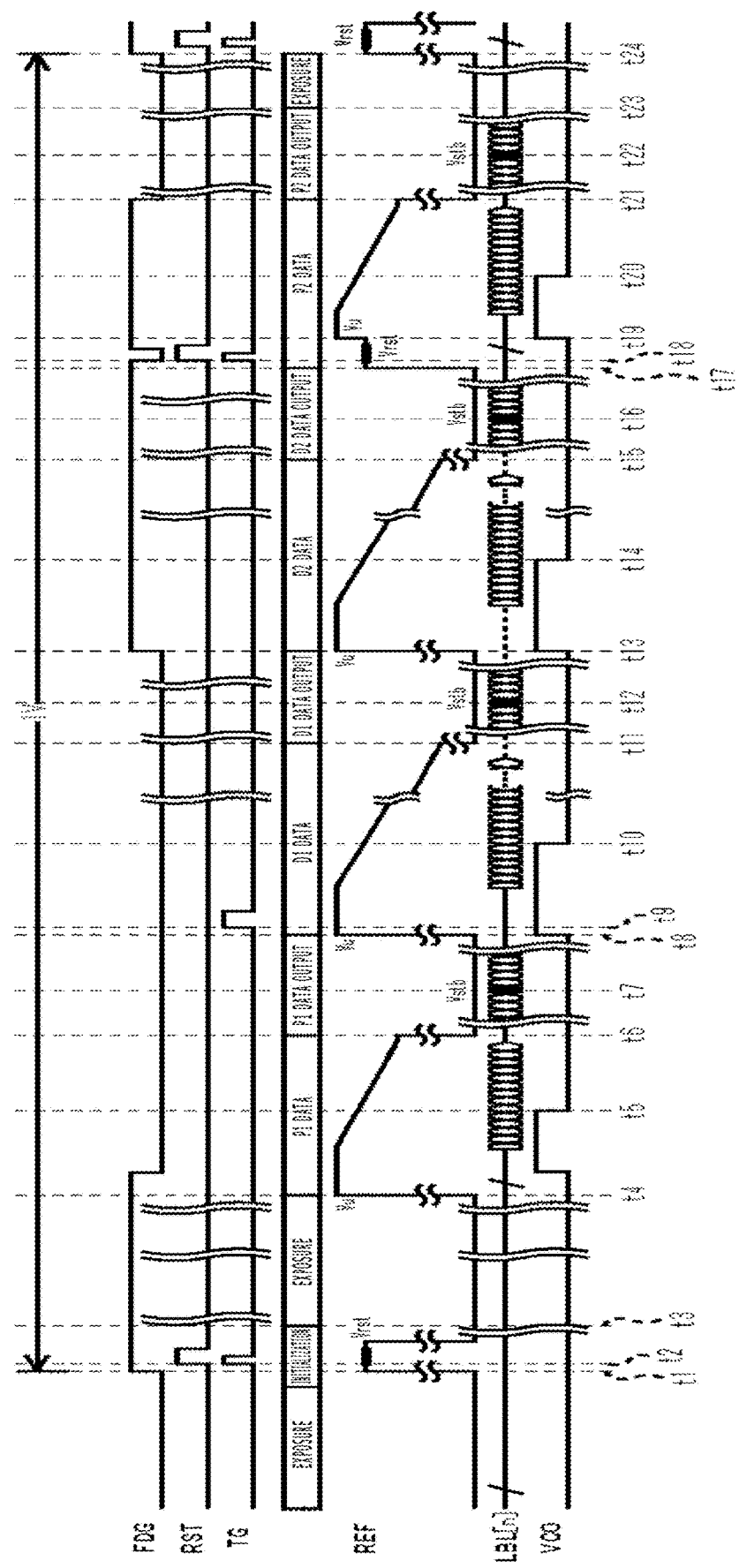
FIG. 14 is a diagram illustrating operations of a pixel having the pixel circuit of the first configuration example.

Operations from the time t42 to the time t60 are the same as those from the time t3 to the time 21 of the first configuration example illustrated in FIG. 14, and therefore its descriptions are omitted.

At the time t60, the discharge transistor 327 is turned on by the Hi discharge signal OFG, and at the same time, a voltage of the reference signal REF supplied to the gate of the transistor 81 in the comparison circuit 51 is reduced to a level (the standby voltage $V_{stb}$) in which the transistor 81 is turned off. Through this processing, consumption current of the comparison circuit 51 during the signal reading period is suppressed.

At the time t61, the WORD signal (not illustrated) for controlling the reading timing becomes Hi and the N-bit LBL [n] (n=1 to N) is output from the latch storage unit 52. Data obtained herein is P2 data in a reset level of the high-light intensity pixel signal.

At the time t62, the signal reading period is finished and the operation state is returned to the same as that before the time t41. A state of the time t63 is the same as that of the above-mentioned time t41 and becomes the next 1 V (one normal scan period).

Also in the pixel circuit 41 of the second configuration example, the LOFIC 325 is included, and thereby a broad dynamic range can be realized. In addition, the reset operation of a charge can be performed only by control of the discharge transistor 327, and therefore further speeding up can be performed.

6. 3 Third Configuration Example of Pixel Circuit

A third configuration example of the pixel circuit 41 will be described with reference to FIG. 19.

Figure 19:
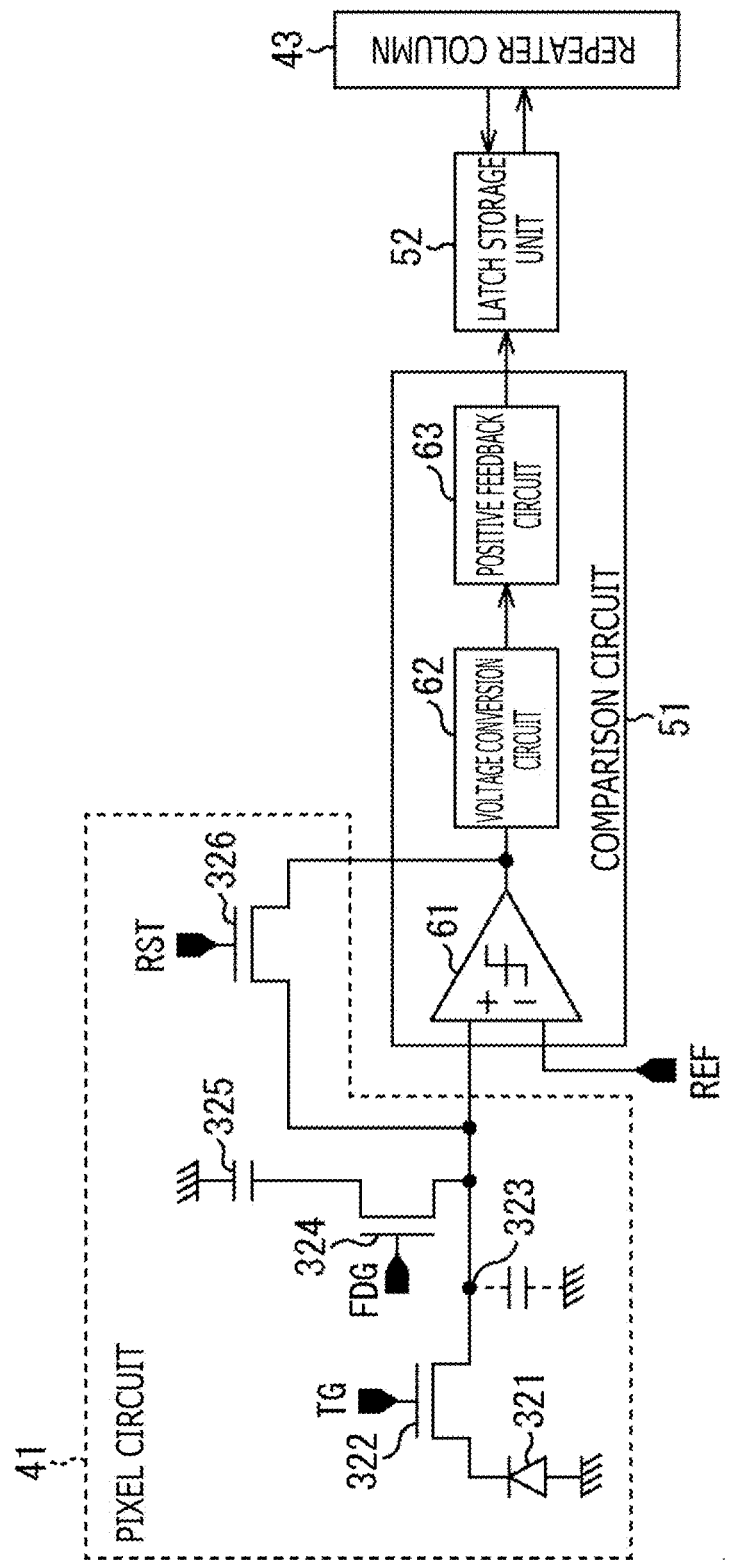
FIG. 19 is a diagram illustrating a pixel circuit of a third configuration example.

FIG. 19 is a diagram in which the pixel circuit 41 of the third configuration example is illustrated along with the comparison circuit 51, the latch storage unit 52, and the repeater column 43.

The pixel circuit 41 of the third configuration example illustrated in FIG. 19 is different from that of the first configuration example illustrated in FIG. 13 only in a connection destination of the source of the reset transistor 326. Specifically, in the first configuration example illustrated in FIG. 13, the source of the reset transistor 326 connected between the second transfer transistor 324 and the LOFIC 325 is connected to the gate (FIG. 4) of the transistor 82 in the differential input circuit 61 in the same manner as in the FD 323 in the third configuration example of FIG. 19.

By configuring the pixel circuit as described above, the reset operation of the accumulated charge in the FD323 and the reset operation of the accumulated charge in the LOFIC 325 can be performed separately.

<Timing Chart of Third Configuration Example>

Figure 20:
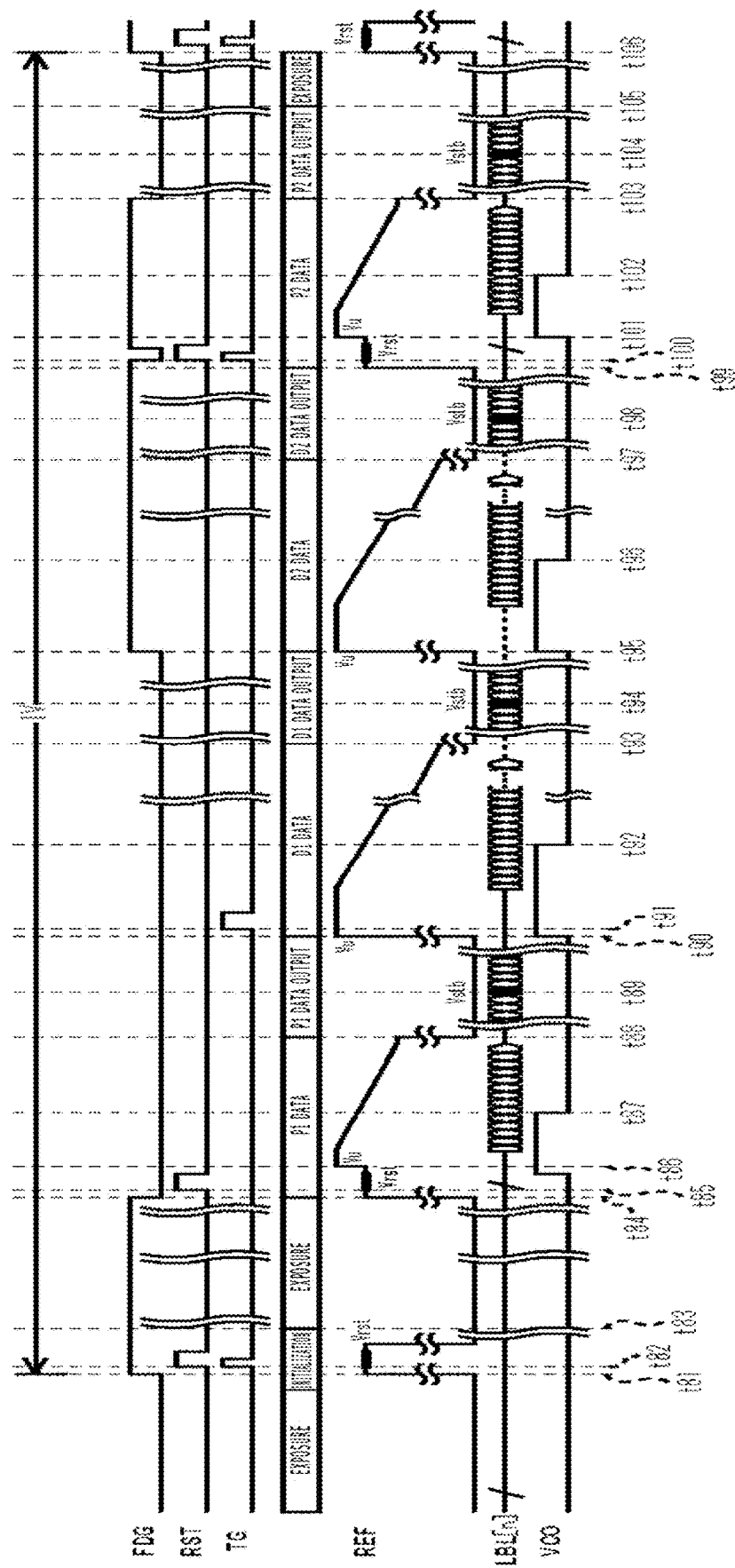
FIG. 20 is a diagram illustrating operations of a pixel having the pixel circuit of the third configuration example.

FIG. 20 is a timing chart illustrating the driving of the pixel 21 using the pixel circuit 41 of the third configuration example.

At the time t81, the reference signal REF is set to a reset voltage $V_{rst}$, and at the same time the second transfer transistor 324 is turned on by using the Hi transfer signal FDG, and the FD323 and the LOFIC 325 are connected. Then, at the time t82, the first transfer transistor 322 and the reset transistor 326 are turned on by using the Hi transfer signal TG and the Hi reset signal RST, and thereby the accumulated charge of the photodiode 321 and the accumulated charges of the FD 323 and the LOFIC 325 are reset.

The first transfer transistor 322 and the reset transistor 326 are turned off, and then during a period from the time t33 to the time t84, exposure is performed.

In the time t84 after the exposure is finished, the transfer signal FDG is changed to Lo and the second transfer transistor 324 is turned off, and at the same time the reference signal REF is set to the reset voltage $V_{rst}$. Afterward, at the time t85, the reset transistor 326 is turned on again by using the Hi reset signal RST, and thereby the accumulated charge of the FD 323 is reset.

Operations at the time t86 or later are the same as those at the time t4 or later of FIG. 14, and therefore its descriptions are omitted.

Also in the pixel circuit 41 of the third configuration example, the LOFIC 325 is included, and thereby a broad dynamic range can be realized. In addition, the reset operation of the accumulated charge in the FD323 and the reset operation of the accumulated charge in the LOFIC 325 can be performed separately.

6. 4 Fourth Configuration Example of Pixel Circuit

The fourth configuration example of the pixel circuit 41 will be described with reference to FIG. 21.

Figure 21:
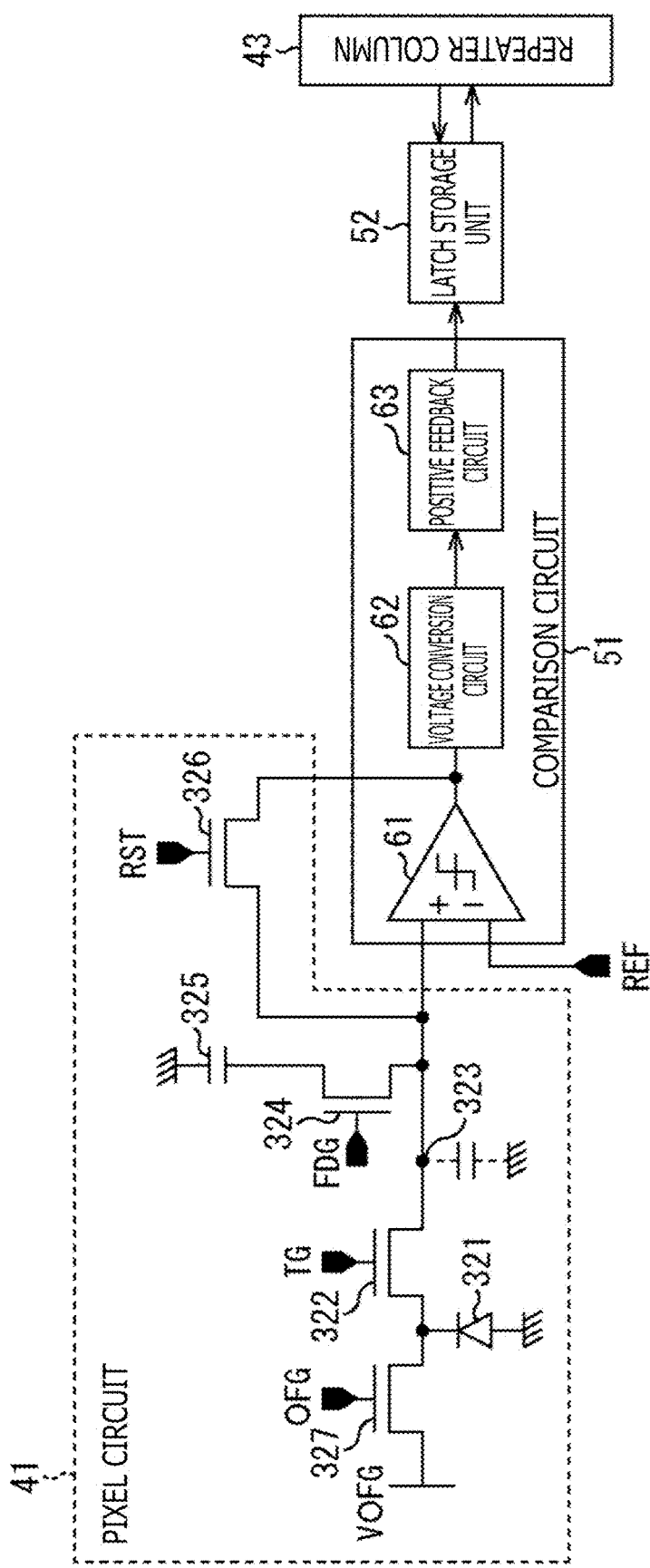
FIG. 21 is a diagram illustrating a pixel circuit of a fourth configuration example.

FIG. 21 is a diagram in which the pixel circuit 41 of the fourth configuration example is illustrated along with the comparison circuit 51, the latch storage unit 52, and the repeater column 43.

The pixel circuit 41 of the fourth configuration example illustrated in FIG. 21 has a structure in which the discharge transistor 327 in the same manner as in the second configuration example is added to the pixel circuit 41 of the third configuration example illustrated in FIG. 19.

<Timing Chart of Fourth Configuration Example>

Figure 22:
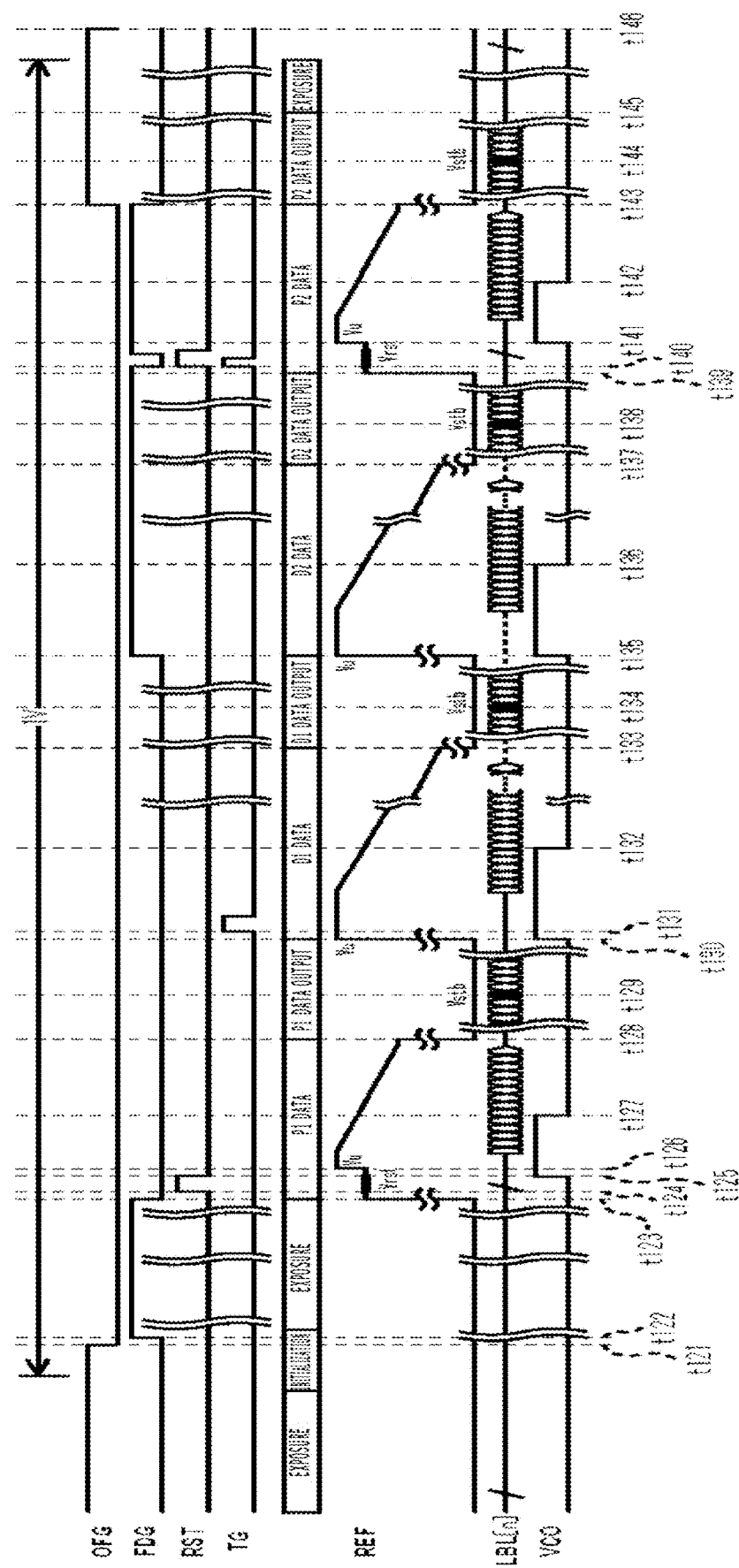
FIG. 22 is a diagram illustrating operations of a pixel having the pixel circuit of the fourth configuration example.

FIG. 22 is a timing chart illustrating the driving of the pixel 21 using the pixel circuit 41 of the fourth configuration example.

At the time t121, until the Hi discharge signal OFG is changed to Lo, a reset state of the photodiode 321 is continued. At the time t121, the discharge transistor 327 is turned off, and then at the time t122, the second transfer transistor 324 is turned on by using the Hi transfer signal FDG and the exposure is started in a state in which the FD 323 and the LOFIC 325 are connected.

After the exposure is finished, at the time t123, the transfer signal FDG is changed to Lo and the second transfer transistor 324 is turned off, and at the same time the reference signal REF is set to the reset voltage $V_{rst}$. Afterward, at the time t124, the reset transistor 326 is turned on again by using the Hi reset signal RST, and thereby the accumulated charge of the FD 323 is reset.

The operations at the time t125 or later are the same as those at the time t43 or later of FIG. 18, and therefore its descriptions are omitted.

Also in the pixel circuit 41 of the fourth configuration example, the LOFIC 325 is included, and thereby a broad dynamic range can be realized. In addition, the reset operation of the accumulated charge in the FD323 and the reset operation of the accumulated charge in the LOFIC 325 can be performed separately.

6. 5 Fifth Configuration Example of Pixel Circuit

The fifth configuration example of the pixel circuit 41 will be described with reference to FIG. 23.

Figure 23:
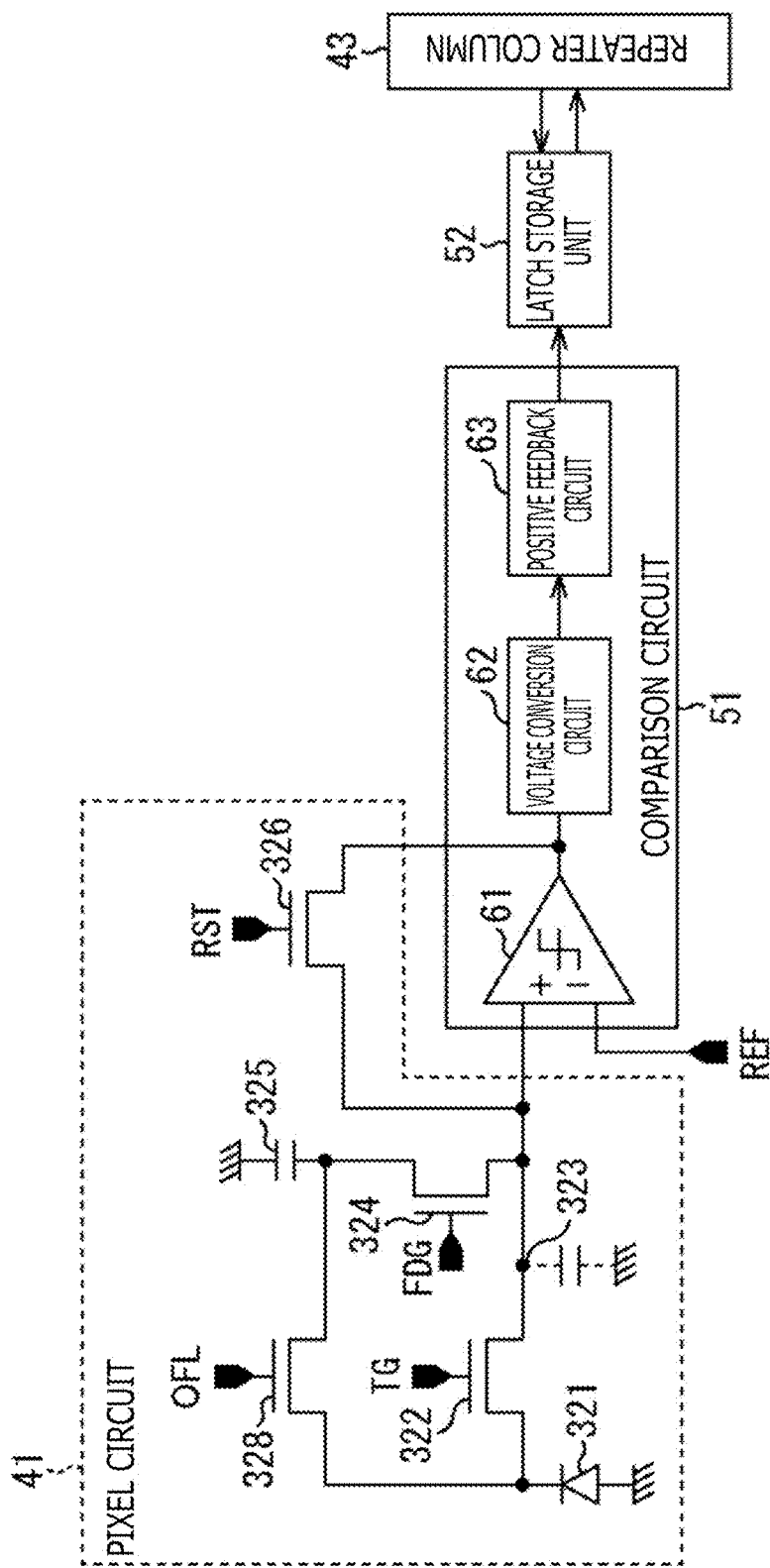
FIG. 23 is a diagram illustrating a pixel circuit of a fifth configuration example.

FIG. 23 is a diagram in which the pixel circuit 41 of the fifth configuration example is illustrated along with the comparison circuit 51, the latch storage unit 52, and the repeater column 43.

The pixel circuit 41 of the fifth configuration example illustrated in FIG. 23 has a structure in which the third transfer transistor 328 is further added to the third configuration example in which the reset transistor 326 illustrated in FIG. 19 is separated from the LOFIC 325. The third transfer transistor 328 directly transfers a charge overflowed from the photodiode 321 to the LOFIC 325 and accumulates the charge.

For example, a phenomenon occurs in which as in the pixel circuit 41 of the third configuration example of FIG. 19, in a structure in which a charge is transferred to the LOFIC 325 via the FD323, in the case where after the FD 323 is reset, a charge accumulated in the LOFIC 325 is transferred to the FD 323 and reading driving is performed, the charge of the FD 323 disappears. In the pixel circuit 41 of the fifth configuration example, such a phenomenon does not occur in which the charge of the FD 323 disappears, and therefore a pixel signal in which linearity is secured can be read-out.

<Timing Chart of Fifth Configuration Example>

Figure 24:
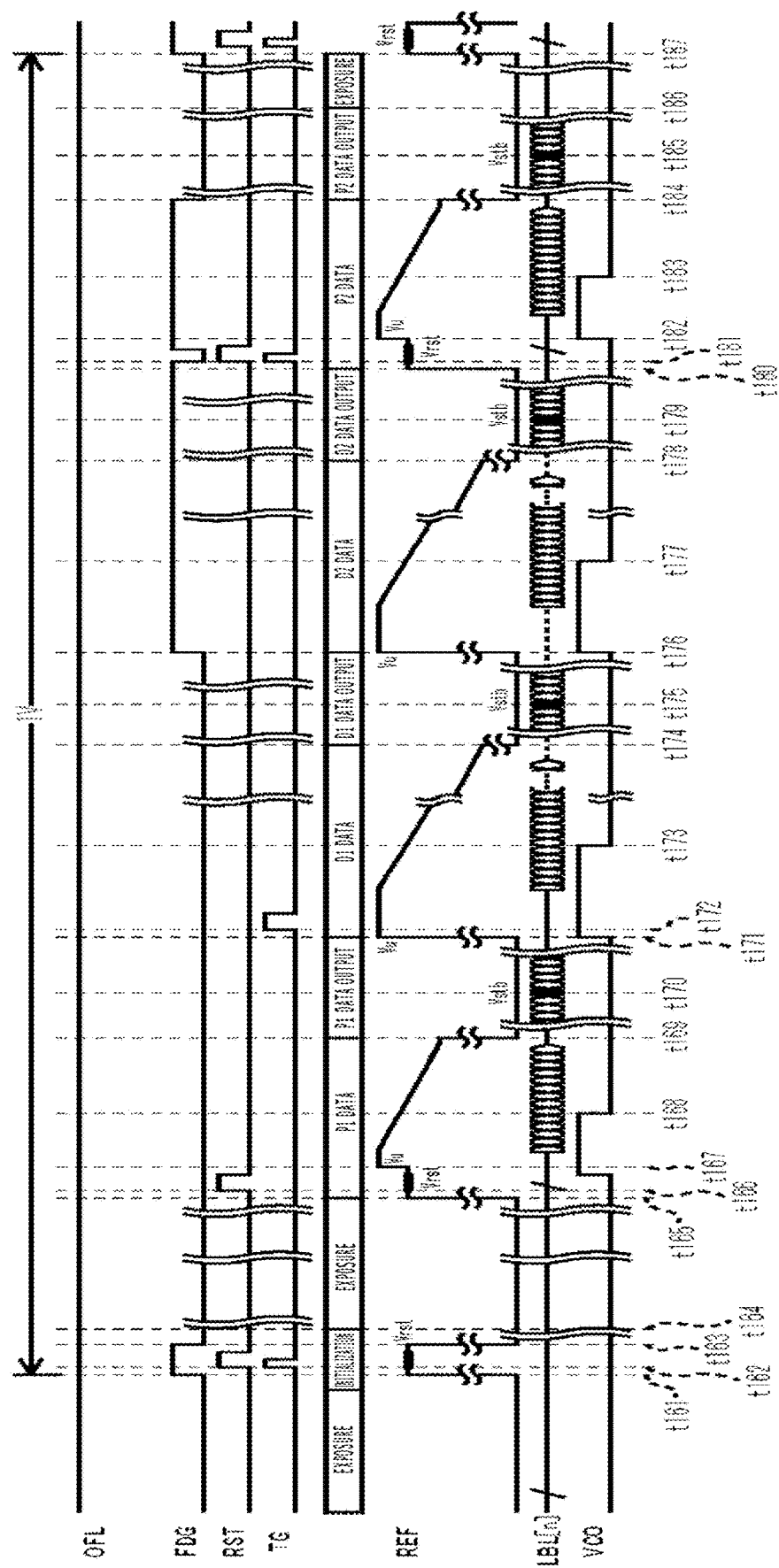
FIG. 24 is a diagram illustrating operations of a pixel having the pixel circuit of the fifth configuration example.

FIG. 24 is a timing chart illustrating the driving of the pixel 21 using the pixel circuit 41 of the fifth configuration example.

At the time t161, the reference signal REF is set to the reset voltage $V_{rst}$, and at the same time the second transfer transistor 324 is turned on by the Hi transfer signal FDG and the FD323 and the LOFIC 325 are connected. At the time t162, the first transfer transistor 322 and the reset transistor 326 are turned on by using the Hi transfer signal TG and the Hi reset signal RST, and thereby the accumulated charge of the photodiode 321 and the accumulated charges of the FD 323 and the LOFIC 325 are reset.

After the first transfer transistor 322 and the reset transistor 326 are turned off, at the time t163, the transfer signal FDG is changed to Lo and the second transfer transistor 324 is turned off. Afterward, during the period from the time 164 to the time t165, the exposure is performed.

Operations at the time t164 or later are the same as those at the time t83 or later of FIG. 20, and therefore its descriptions are omitted.

As illustrated in FIG. 24, the third transfer transistor 328 that is a gate between the photodiode 321 and the LOFIC 325 is controlled to be turned on for 1 V by using the Hi transfer signal OFL. Through this processing, a charge overflowed from the photodiode 321 during the exposure period is directly transferred to the LOFIC 325 and is accumulated.

Also in the pixel circuit 41 of the fifth configuration example, the LOFIC 325 is included, and thereby a broad dynamic range can be realized. In addition, the charge overflowed from the photodiode 321 is directly transferred to the LOFIC 325 and is accumulated, and therefore the pixel signal in which linearity is secured can be read out.

6. 6 Sixth Configuration Example of Pixel Circuit

The sixth configuration example of the pixel circuit 41 will be described with reference to FIG. 25.

Figure 25:
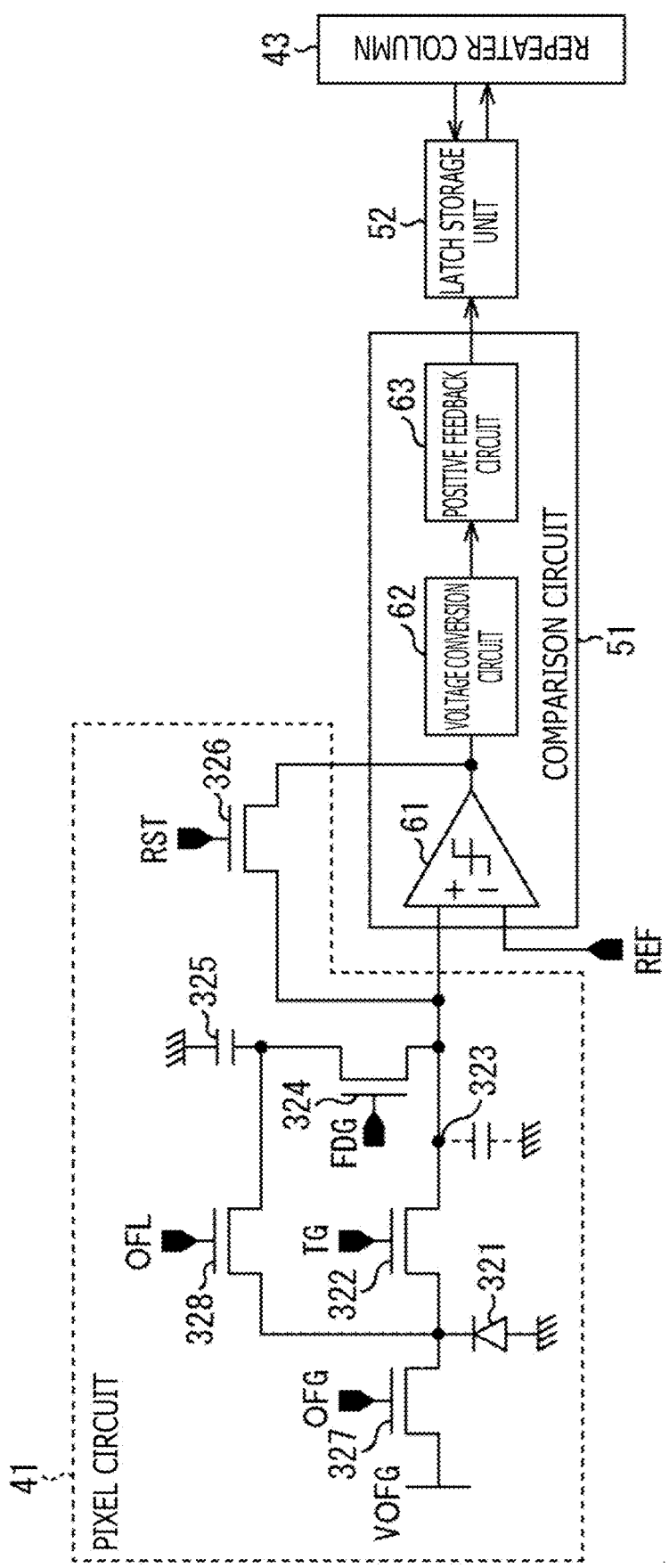
FIG. 25 is a diagram illustrating a pixel circuit of a sixth configuration example.

FIG. 25 is a diagram in which the pixel circuit 41 of the sixth configuration example is illustrated along with the comparison circuit 51, the latch storage unit 52, and the repeater column 43.

The pixel circuit 41 of the fifth configuration example illustrated in FIG. 25 has a structure in which the discharge transistor 327 is further added to the pixel circuit 41 of the fifth configuration example including the third transfer transistor 328 that directly transfers a charge from the photodiode 321 to the LOFIC 325, illustrated in FIG. 23. This processing permits the photodiode 321 to be initialized only by control of the discharge transistor 327 in the same manner as in the second configuration example.

<Timing Chart of Sixth Configuration Example>

Figure 26:
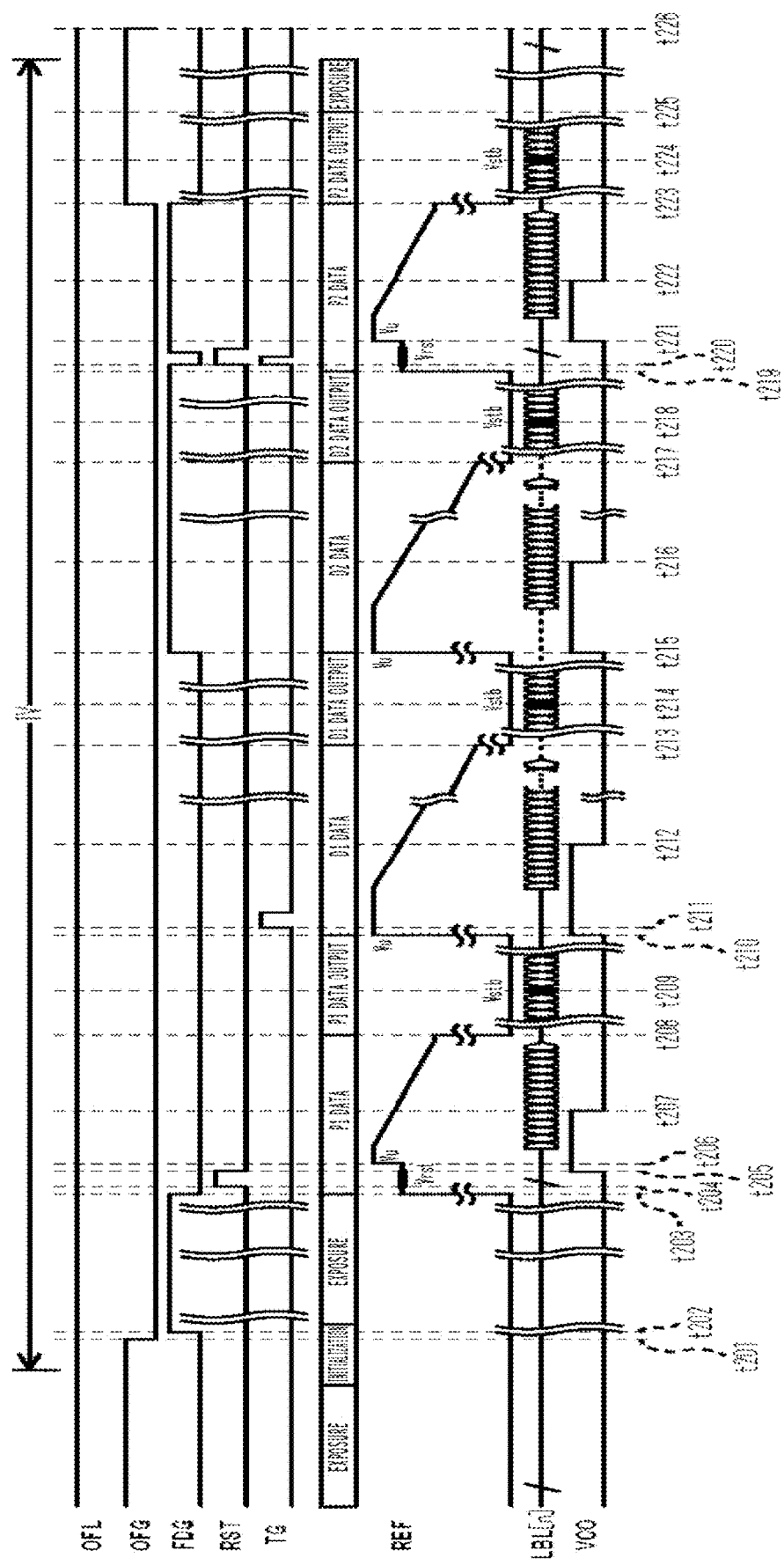
FIG. 26 is a diagram illustrating operations of a pixel having the pixel circuit of the sixth configuration example.

FIG. 26 is a timing chart illustrating the driving of the pixel 21 using the pixel circuit 41 of the sixth configuration example.

The driving of the pixel 21 using the pixel circuit 41 of the sixth configuration example is the same as that of the fourth configuration example illustrated in FIG. 22 other than the fact that control of the third transfer transistor 328 that is the gate between the photodiode 321 and the LOFIC 325 is added. The time t201 to t226 of FIG. 26 correspond to the time t121 to t146 of FIG. 22.

The third transfer transistor 328 that is the gate between the photodiode 321 and the LOFIC 325 is controlled to ON for 1 V in the same manner as in the fifth configuration example. Through this processing, a charge overflowed from the photodiode 321 during the exposure period is directly transferred to the LOFIC 325 and is accumulated.

Also in the pixel circuit 41 of the sixth configuration example, the LOFIC 325 is included, and thereby a broad dynamic range can be realized. In addition, the charge overflowed from the photodiode 321 is directly transferred to the LOFIC 325 and is accumulated, and therefore the pixel signal in which linearity is secured can be read-out.

7. Circuit Configuration Example of FD Sharing

Subsequently, a circuit configuration will be described in the case where the FD 323 and the ADC 42 in a subsequent stage thereof are shared by using a plurality of pixel circuits 41.

7. 1 First Configuration Example of FD Sharing

Figure 27:
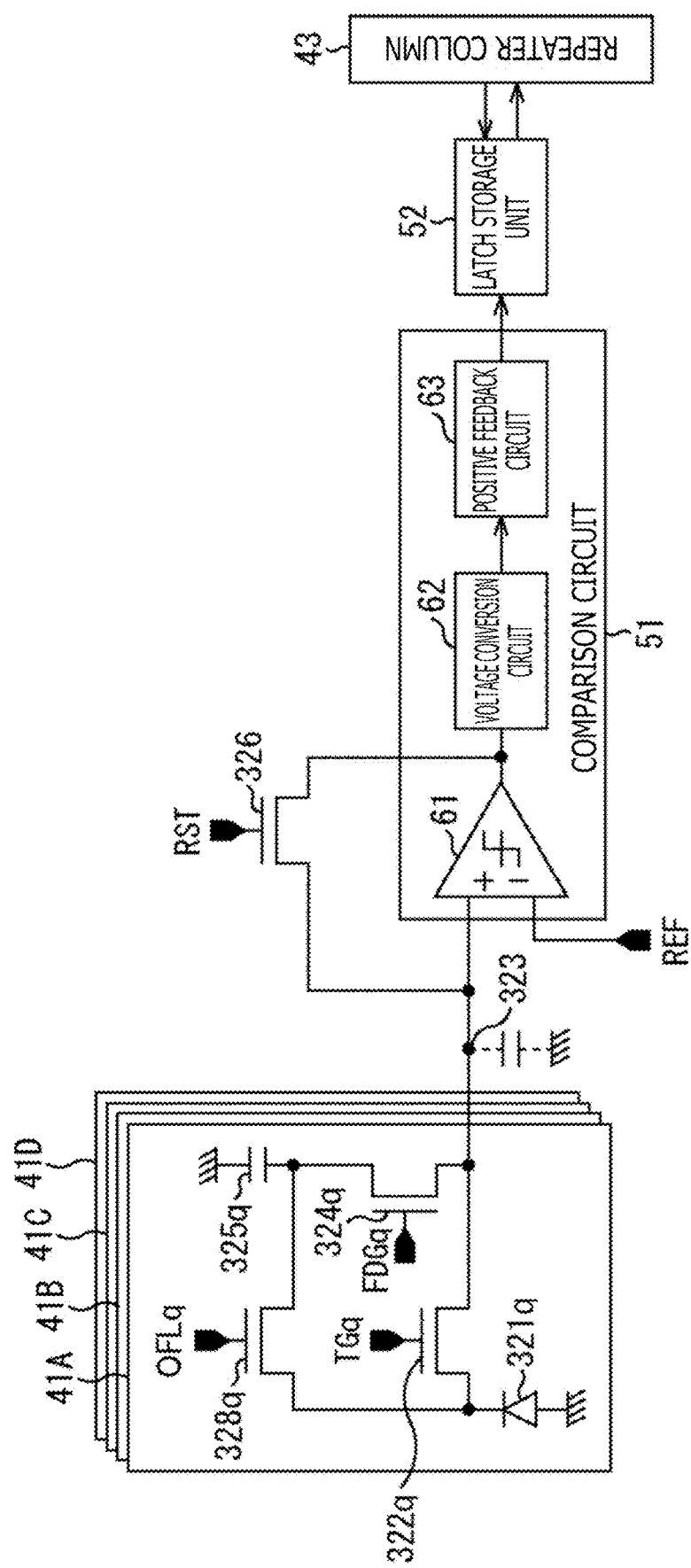
FIG. 27 is a diagram illustrating the first configuration example of FD sharing.

FIG. 27 illustrates the first configuration example of the FD sharing.

In the case where the FD 323 is shared, as illustrated in FIG. 27, the FD 323 and the reset transistor 326 are shared by using the plurality of pixel circuits 41 and are connected to the comparison circuit 51 in a subsequent stage.

In addition, the number of the pixel circuits 41 that share the FD 323 is not particularly limited; however, for example, a case in which pixel signals are supplied by using four pixel circuits 41A to 41D illustrated in FIG. 9 will be described with reference to FIG. 27.

Each of the pixel circuits 41A to 41D includes a photodiode 321$q$, a first transfer transistor 322$q$, a second transfer transistor 324$q$, a LOFIC 325$q$, and a third transfer transistor 328$q$ (any one of q=1, . . . , 4).

Thus, the pixel circuits 41A to 41D are configured in the same manner as in the fifth configuration example illustrated in FIG. 23. In the case where the FD 323 is shared, as in the first configuration example to the fourth configuration example, when a structure is adopted in which a charge is transferred to the LOFIC 325 via the FD 323, signals of a plurality of pixel circuits 41 are mixed. Therefore, the pixel circuits 41 in the case where the FD 323 is shared need to be set to a circuit configuration of the fifth configuration example or the sixth configuration example.

<Timing Chart of First Configuration Example of FD Sharing>

Figure 28:
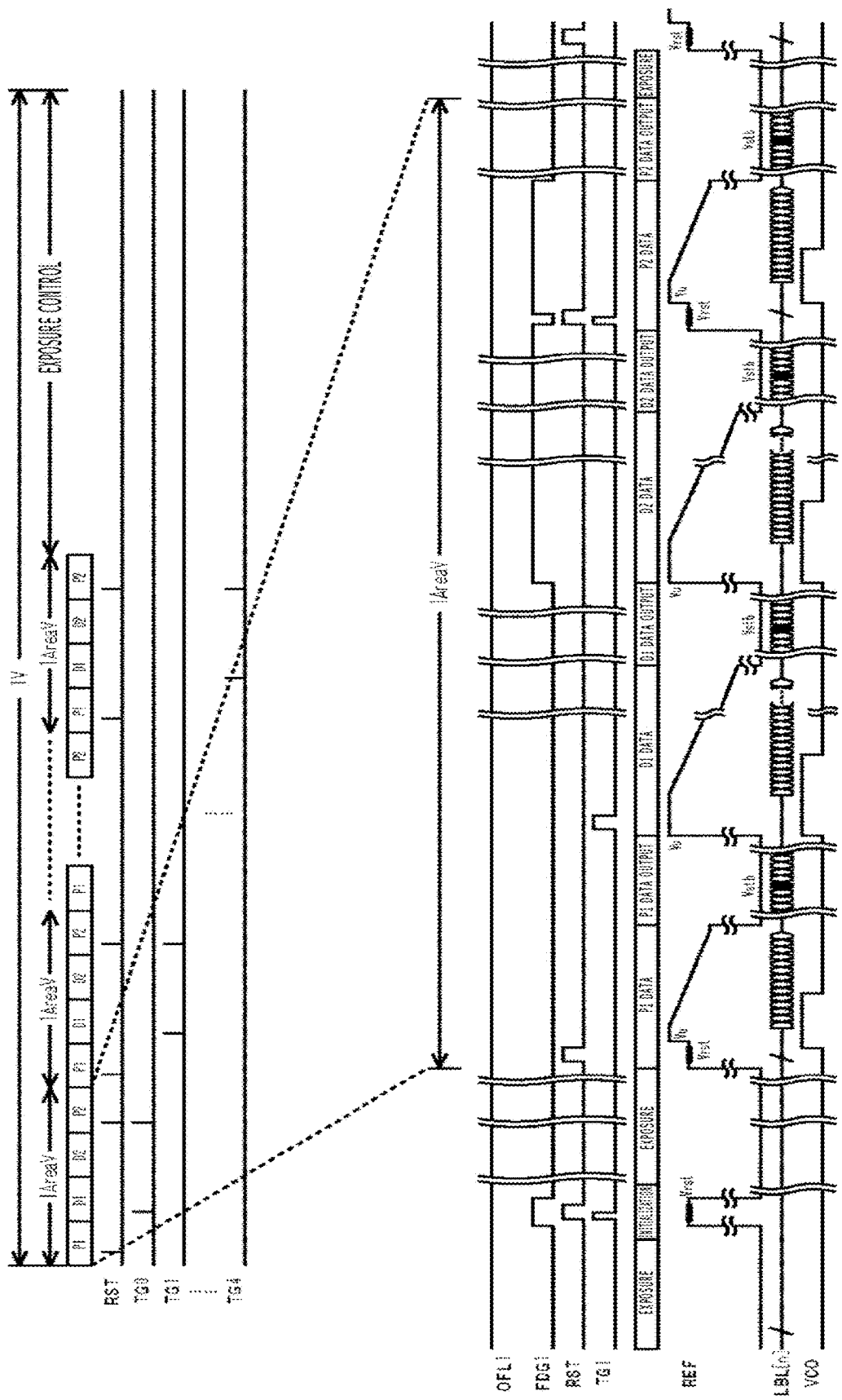
FIG. 28 is a diagram illustrating operations of a plurality of pixels using the first configuration example of the FD sharing.

FIG. 28 is a timing chart illustrating the driving of a plurality of pixels 21 of a sharing unit using the first configuration example of the FD sharing.

In the first configuration example of the FD sharing, reading of the same P1 data, D1 data, D2 data, and P2 data as those of driving of the fifth configuration example illustrated in FIG. 24 is performed in order in the four pixel circuits 41A to 41D that share the FD 323. Further, reset of the photodiode 321$q$ before the start of exposure and the exposure control are performed in all pixels at the same time for each sharing unit.

7. 2 Second Configuration Example of FD Sharing

Figure 29:
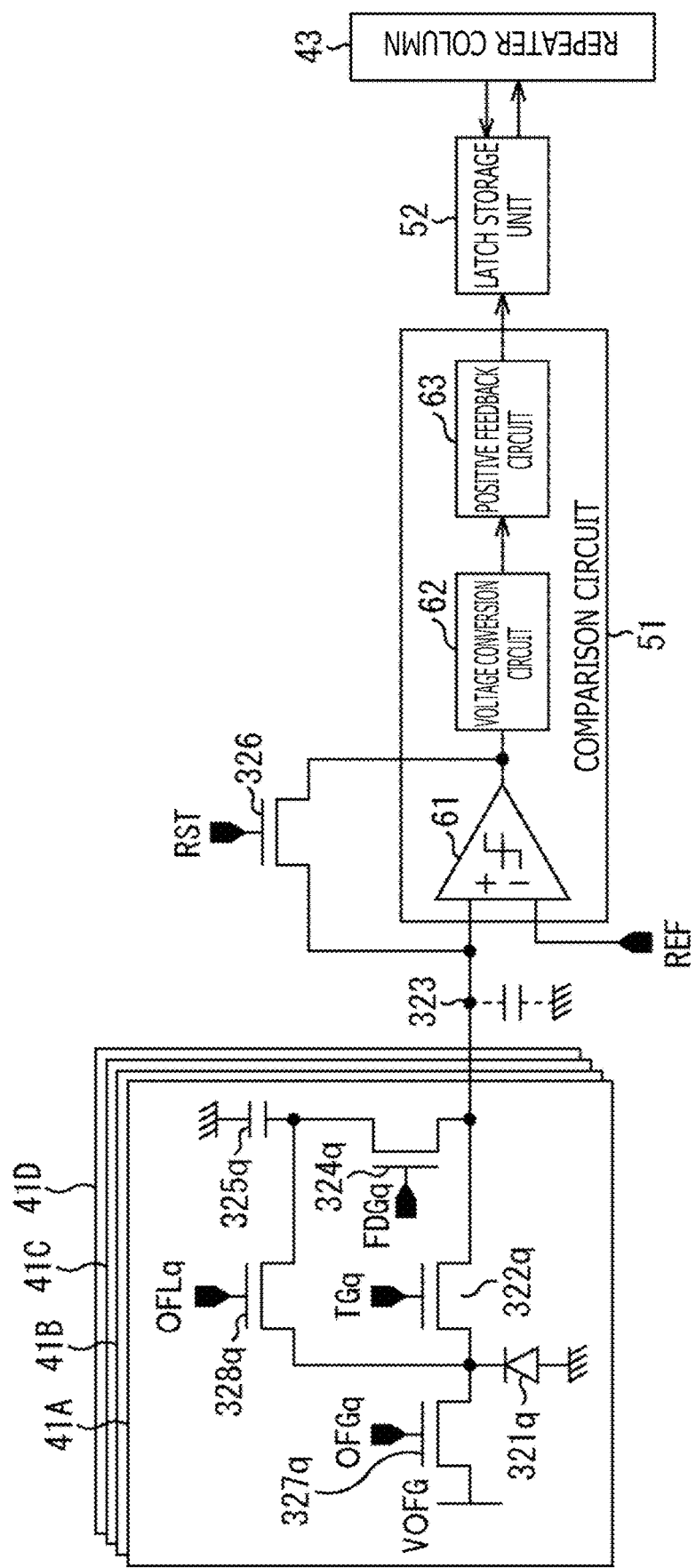
FIG. 29 is a diagram illustrating the second configuration example of the FD sharing.

FIG. 29 illustrates the second configuration example of the FD sharing.

The second configuration example of the FD sharing illustrated in FIG. 29 also illustrates an example in the case where pixel signals are supplied by using the four pixel circuits 41A to 41D in the same manner as in the first configuration example of the FD sharing of FIG. 27.

In the second configuration example of the FD sharing, the discharge transistor 327$q$ (any one of q=1, . . . , 4) is further added to each of the pixel circuits 41A to 41D of the first configuration example of the FD sharing illustrated in FIG. 27.

In other words, the second configuration example of the FD sharing has a structure in which the pixel circuits 41A to 41D are configured in the same manner as in the sixth configuration example illustrated in FIG. 25. This processing permits each photodiode 321$q$ of the pixel circuits 41A to 41D to be initialized only by control of the discharge transistor 327 in the same manner as in the sixth configuration example.

<Timing Chart of Second Configuration Example of FD Sharing>

Figure 30:
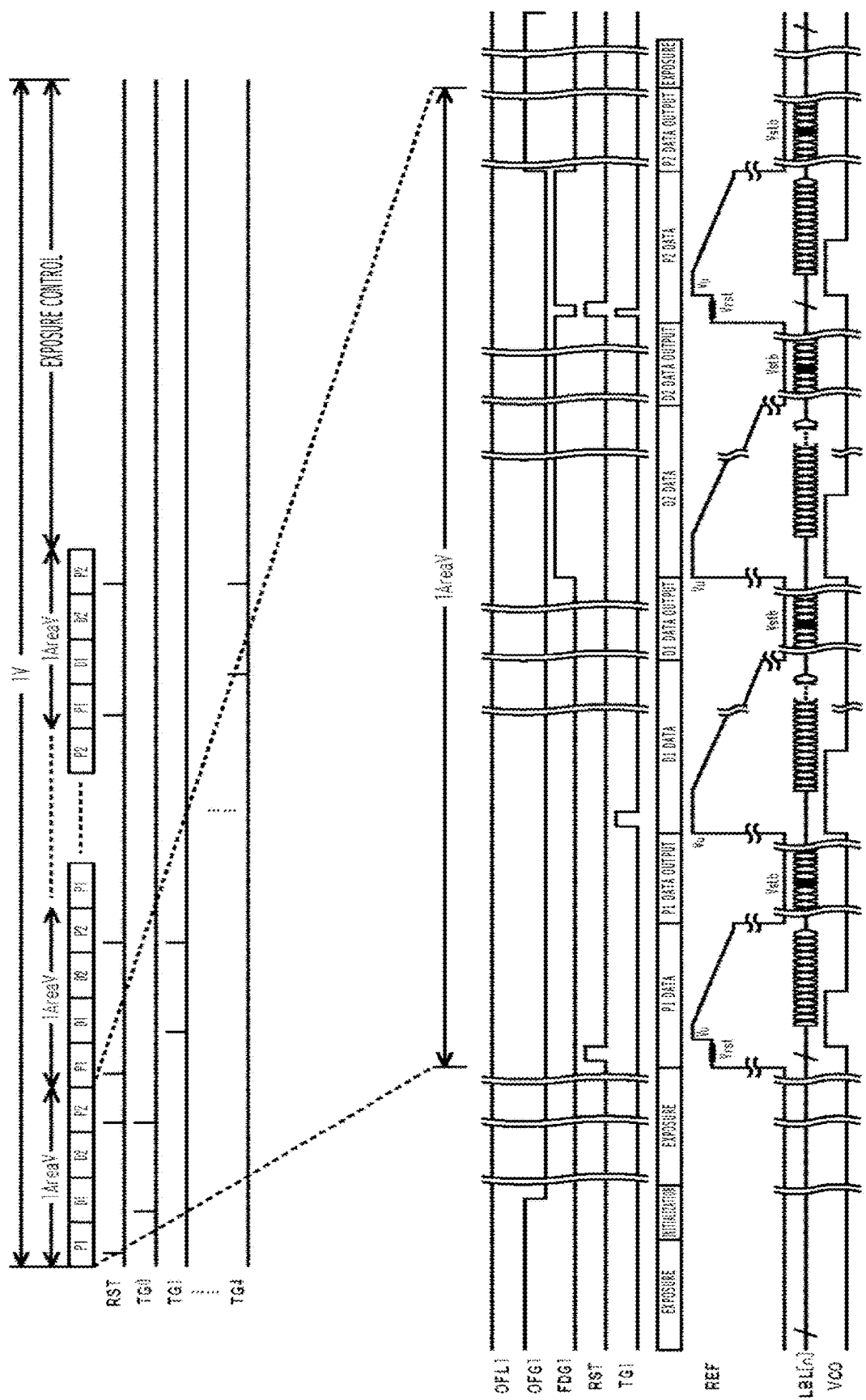
FIG. 30 is a diagram illustrating operations of a plurality of pixels using the second configuration example of the FD sharing.

FIG. 30 is a timing chart illustrating the driving of a plurality of pixels 21 of the sharing unit using the second configuration example of the FD sharing.

In the second configuration example of the FD sharing, reading of the same P1 data, D1 data, D2 data, and P2 data as those of driving of the sixth configuration example illustrated in FIG. 26 is performed in order in four pixel circuits 41A to 41D that share the FD 323. Further, reset of the photodiode 321$q$ before the start of exposure using the discharge transistor 327$q$ and the exposure control are performed in the sharing unit and all pixels at the same time.

7. 3 Third Configuration Example of FD Sharing

Figure 31:
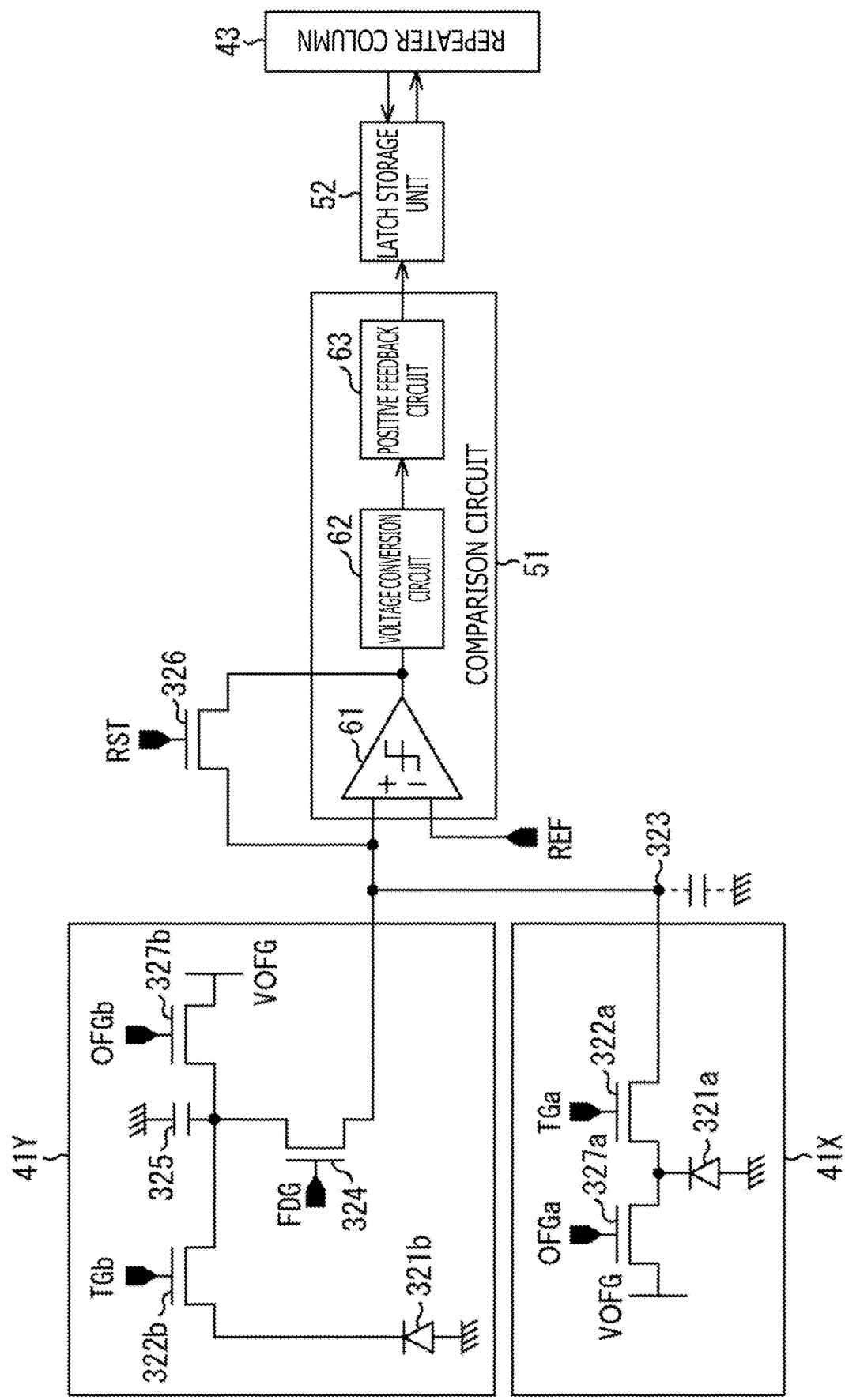
FIG. 31 is a diagram illustrating the third configuration example of the FD sharing.

FIG. 31 illustrates the third configuration example of the FD sharing.

In the third configuration example of the FD sharing, the FD 323 and the reset transistor 326, and the comparison circuit 51 in subsequent stage thereof are shared in the pixel circuit 41 detecting the low-light intensity (hereinafter, referred to as a low-light intensity pixel circuit 41X) and the pixel circuit 41 detecting the high-light intensity (hereinafter, referred to as a high-light intensity pixel circuit 41Y).

The low-light intensity pixel circuit X is configured of a photodiode 321$a$, a first transfer transistor 322$a$, and a discharge transistor 327$a$.

The high-light intensity pixel circuit 41Y is configured of a photodiode 321$b$, a first transfer transistor 322$b$, the second transfer transistor 324, the LOFIC 325, and a discharge transistor 327$b$.

In the low-light intensity pixel circuit 41X, a charge generated and accumulated by the photodiode 321$a$ is transferred to the FD 323 via the first transfer transistor 322$a$. In the high-light intensity pixel circuit 41Y, a charge generated by the photodiode 321$b$ is accumulated in both of the photodiode 321$b$ and the LOFIC 325 and is transferred to the FD 323 via the second transfer transistor 324.

The photodiode 321$b$ of the high-light intensity pixel circuit 41Y is formed to be smaller than the photodiode 321$a$ of the low-light intensity pixel circuit 41X, and a sensitivity difference is opened so that sensitivity of the photodiode 321$b$ becomes low and sensitivity of the photodiode 321$a$ becomes high.

<Timing Chart of Third Configuration Example of FD Sharing>

Figure 32:
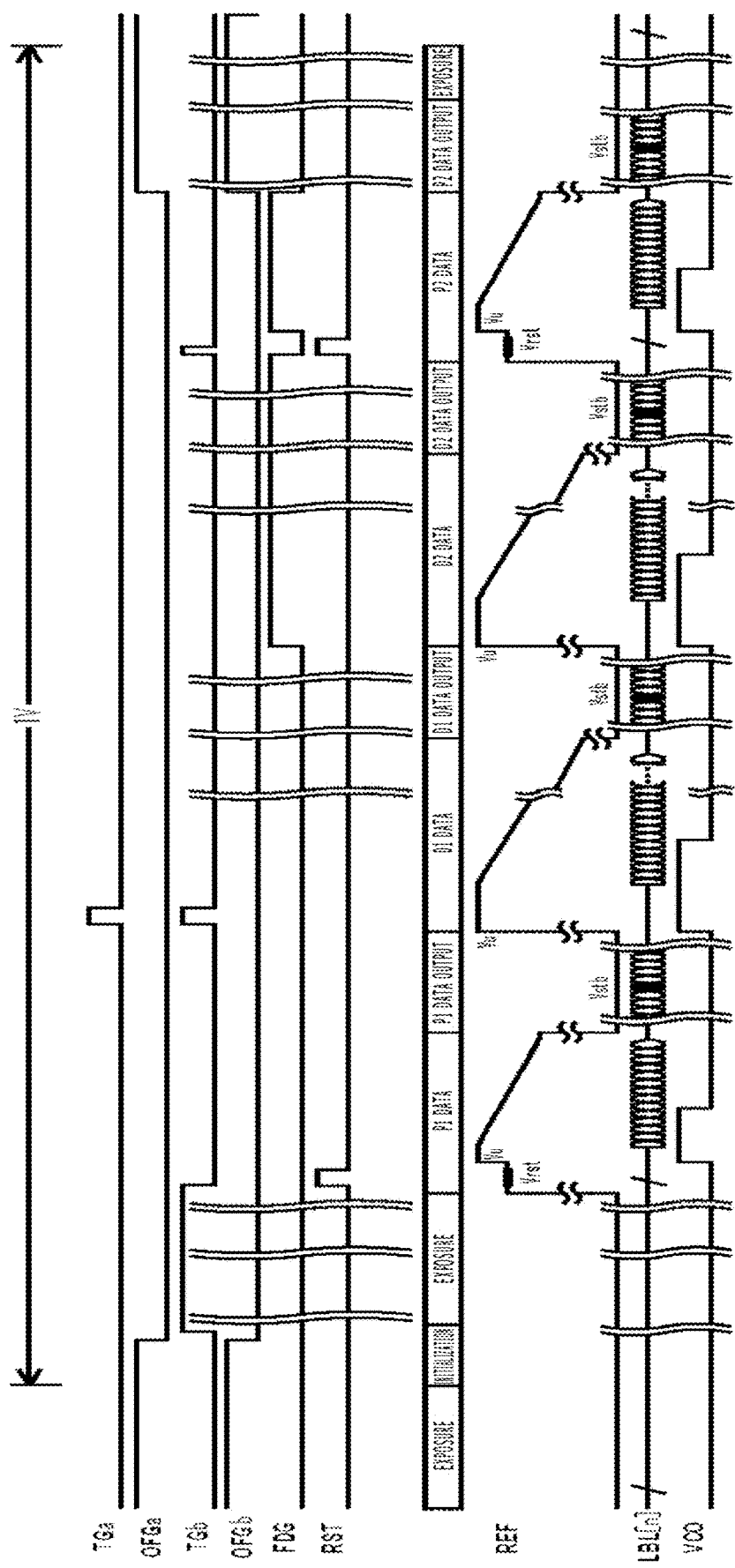
FIG. 32 is a diagram illustrating operations of a plurality of pixels using the third configuration example of the FD sharing.

FIG. 32 is a timing chart illustrating the driving of a plurality of pixels 21 of the sharing unit using the third configuration example of the FD sharing.

In the third configuration example of the FD sharing, in the same manner as in the driving of the pixel circuits 41 that do not share the FD 323, reading is performed in the order corresponding to the P1 data, the D1 data, the D2 data, and the P2 data. Note, however, that, in the third configuration example of the FD sharing, the P1 data and D1 data read out as the low-light intensity pixel signal is a charge generated by the photodiode 321$a$ in the low-light intensity pixel circuit 41X, and the D2 data and P2 data read out as the high-light intensity pixel signal is a charge generated by the photodiode 321$b$ in the high-light intensity pixel circuit 41Y.

Thus, in the timing chart of FIG. 32, in an output of the D1 data, the transfer signal TGa becomes Hi and a charge generated by the photodiode 321$a$ in the low-light intensity pixel circuit 41X is transferred to the FD 323 via the first transfer transistor 322$a$. Then, in an output of the D2 data, the transfer signal FDG becomes Hi and the charge of the LOFIC 325 is transferred to the FD 323 via the second transfer transistor 324.

<Configuration in which Each of High-Light Intensity Pixel Circuit and Low-Light Intensity Pixel Circuit has ADC>

Figure 33:
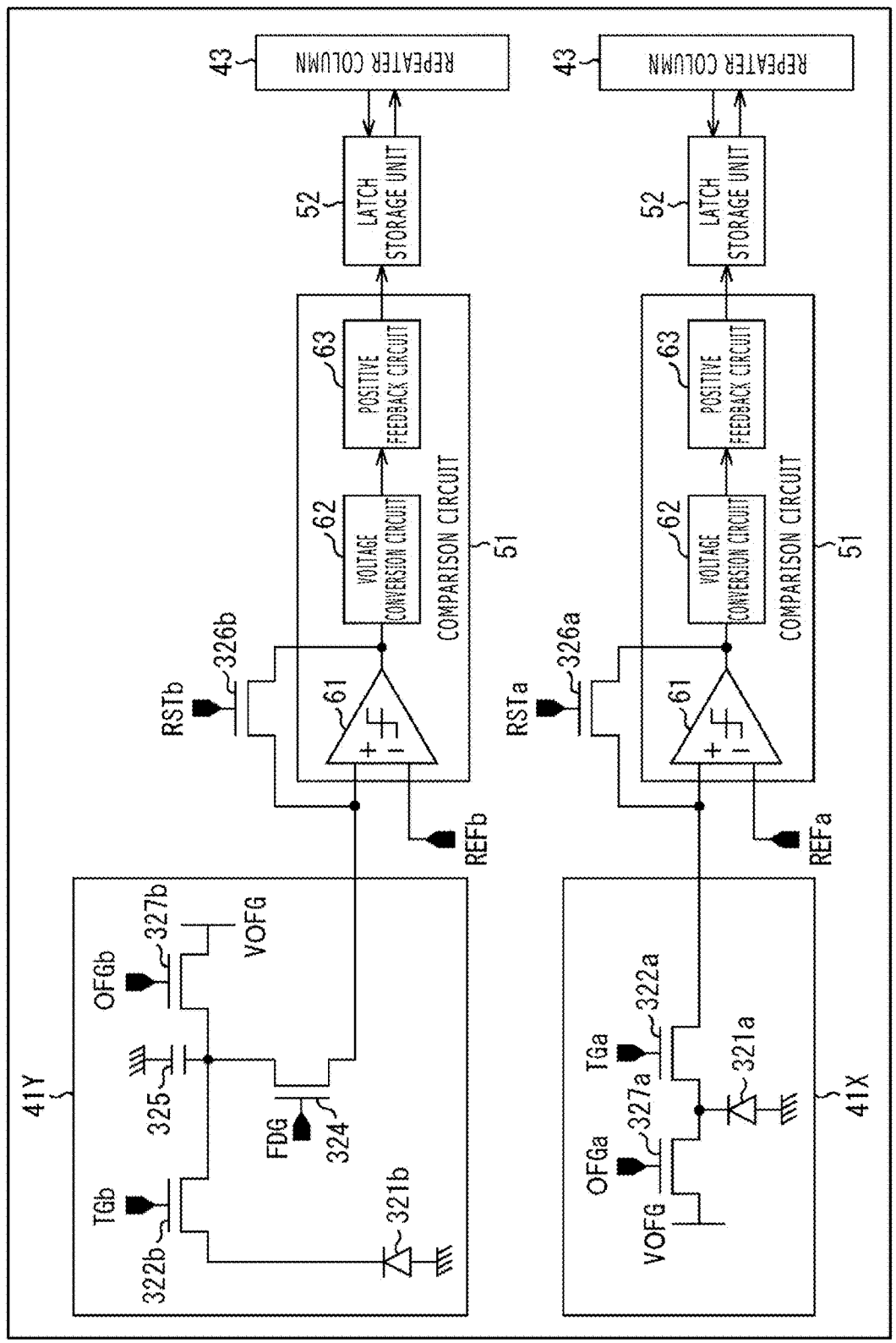
FIG. 33 is a diagram illustrating configuration examples of a high-light intensity pixel circuit and a low-light intensity pixel circuit.

FIG. 33 illustrates a configuration example in which the FD is not shared and each of the low-light intensity pixel circuit 41X and the high-light intensity pixel circuit 41Y of the third configuration example of the FD sharing illustrated in FIG. 31 is connected to an individual ADC 42 (the comparison circuit 51 and the latch storage unit 52).

In this configuration example, the reset transistor 326 is also provided in each of the low-light intensity pixel circuit 41X and the high-light intensity pixel circuit 41Y. In the low-light intensity pixel circuit 41X, the reset transistor 326a is provided and, in the high-light intensity pixel circuit 41Y, the reset transistor 326b is provided.

<Timing Chart of Configuration Example of FIG. 33>

Figure 34:
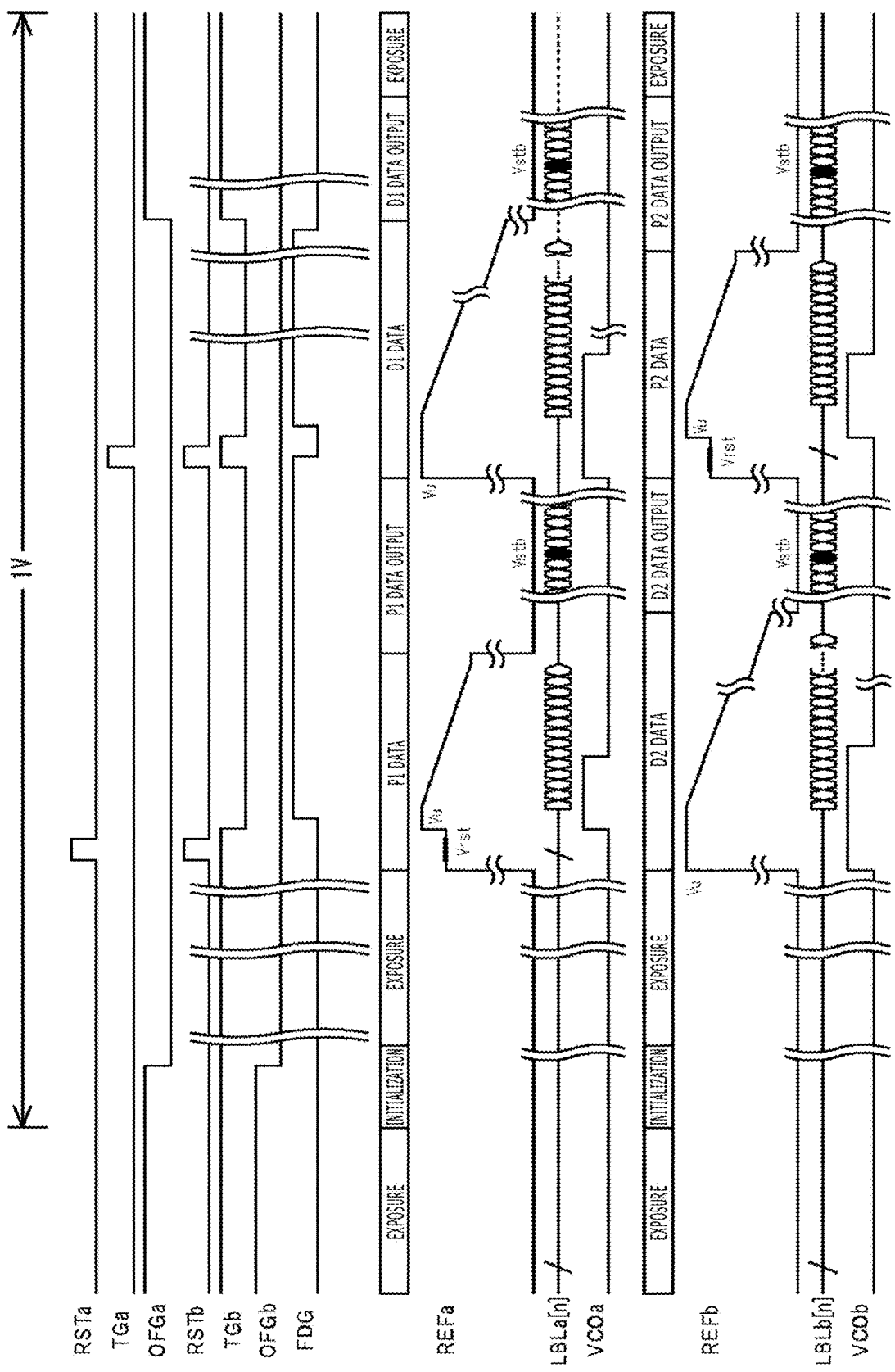
FIG. 34 is a diagram illustrating operations in the configuration examples of the high-light intensity pixel circuit and the low-light intensity pixel circuit.

FIG. 34 is a timing chart illustrating the driving of the pixel 21 having the low-light intensity pixel circuit 41X or the high-light intensity pixel circuit 41Y illustrated in FIG. 33.

This driving is not reading in the order corresponding to the P1 data, the D1 data, the D2 data, and the P2 data as in FIG. 32; further, the reading of the P1 data and D1 data of the low-light intensity pixel circuit 41X and the reading of the D2 data and P2 data of the high-light intensity pixel circuit 41Y can be performed at the same time, and the pixel signals of the same exposure time can be obtained in all pixels all together.

In the pixel array unit 12, rates of the low-light intensity pixel circuits 41X and the high-light intensity pixel circuits 41Y may be not necessarily the same. Specifically, the low-light intensity pixel circuits 41X and the high-light intensity pixel circuits 41Y may be arranged so as to be the same in number in the pixel array unit 12; further, one high-light intensity pixel circuit 41Y may be arranged for a plurality of low-light intensity pixel circuits 41X, and on the contrary, a plurality of high-light intensity pixel circuits 41Y may be arranged for one low-light intensity pixel circuit 41X.

Further, in an example illustrated in FIG. 33, an example is adopted in which one ADC 42 is provided for one low-light intensity pixel circuit 41X and one ADC 42 is provided for one high-light intensity pixel circuit 41Y; further, a configuration may be adopted in which one ADC 42 is provided for a plurality of low-light intensity pixel circuits 41X and one ADC 42 is provided for a plurality of high-light intensity pixel circuits 41Y.

8. Configuration of Plural Substrates

A circuit configuring the solid-state image pickup device 1 may be formed on a sheet of semiconductor substrate, and further the circuit may be separated into a plurality of sheets of semiconductor substrates and may be formed by using a structure in which they are stacked.

Figure 35:
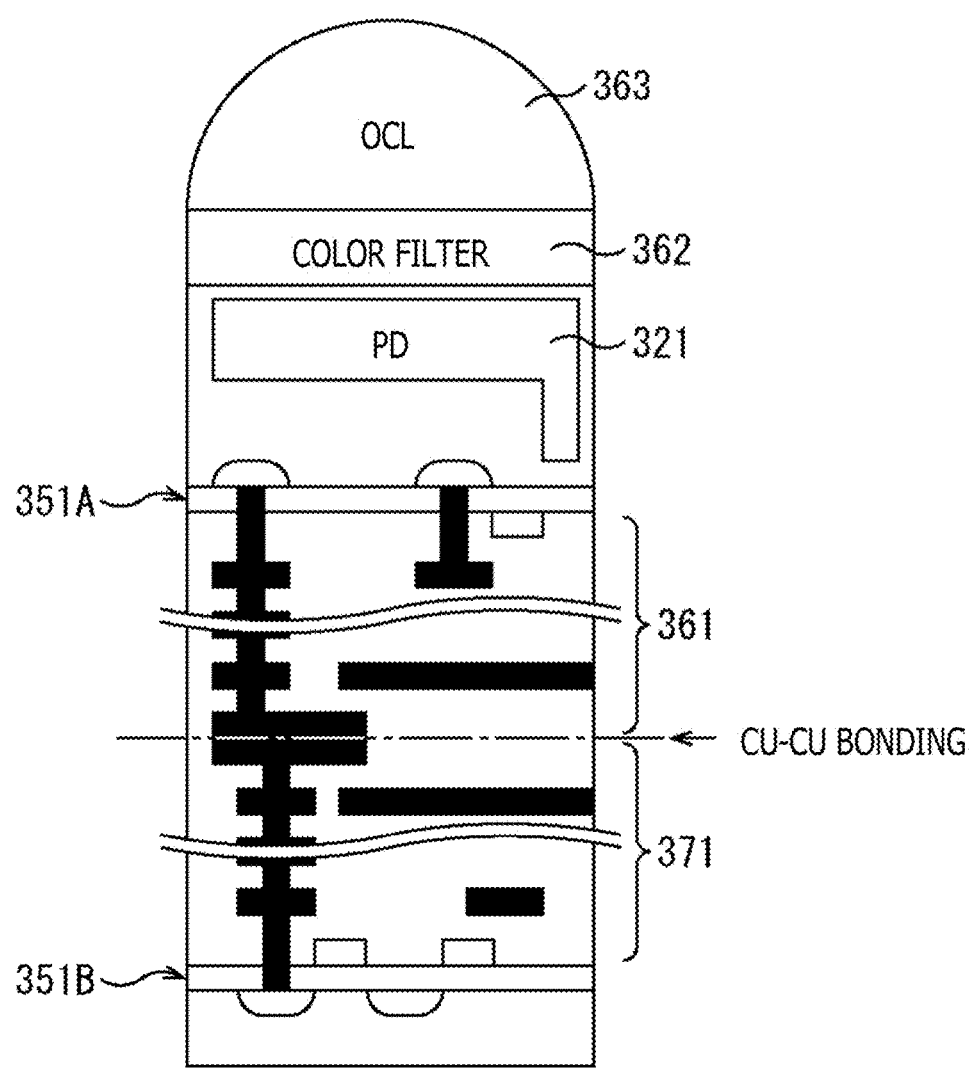
FIG. 35 is a schematic cross-section diagram in the case where the solid-state image pickup device is configured of two sheets of semiconductor substrates.

FIG. 35 illustrates a schematic cross-section diagram in the case where the solid-state image pickup device 1 is configured of two sheets of semiconductor substrates 351.

One first semiconductor substrate 351A of two sheets of semiconductor substrates 351 is a back-surface irradiation type in which the photodiode 321, a color filter 362, an OCL (an on-chip lens) 363, and the like are formed on the back-surface side opposite to the front-surface side in which a wiring layer 361 is formed.

On the front-surface side of the other second semiconductor substrate 351B of the two sheets of semiconductor substrates 351, a wiring layer 371 is formed. The wiring layer 371 of the second semiconductor substrate 351B is stuck on the wiring layer 361 of the first semiconductor substrate 351A through junction techniques such as Cu—Cu jointing or micro-bumps.

Figure 36:
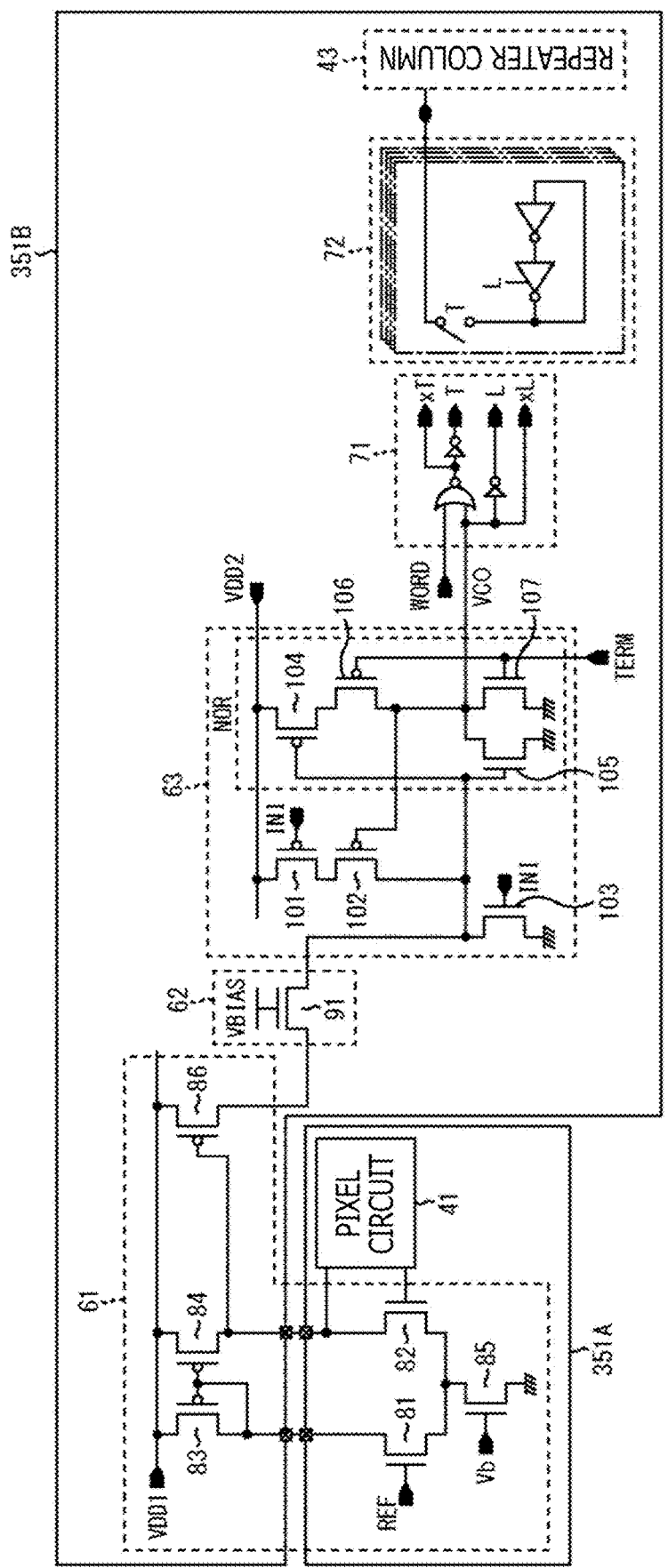
FIG. 36 is a circuit arrangement diagram in the case where the solid-state image pickup device is configured of two sheets of semiconductor substrates.

FIG. 36 illustrates a distribution example of a circuit that is formed on each of the first semiconductor substrate 351A and the second semiconductor substrate 351B. In addition, in FIG. 36, the latch control circuit 71 and latched value storage unit 72 of the latch storage unit 52 are illustrated by simplifying the structure.

On the first semiconductor substrate 351A, the pixel circuit 41 and circuits of the transistors 81, 82, and 85 in the differential input circuit 61 of the ADC 42 are formed. On the second semiconductor substrate 351B, the circuits of the ADC 42 excluding the transistors 81, 82, and 85, and the repeater column 43 are formed.

In a circuit arrangement illustrated in FIG. 36, the transistors 81 and 82 to be a differential pair of the differential input circuit 61 are formed on the first semiconductor substrate 351A and an arrangement is configured in which a characteristic differential is minimized.

Figure 37:
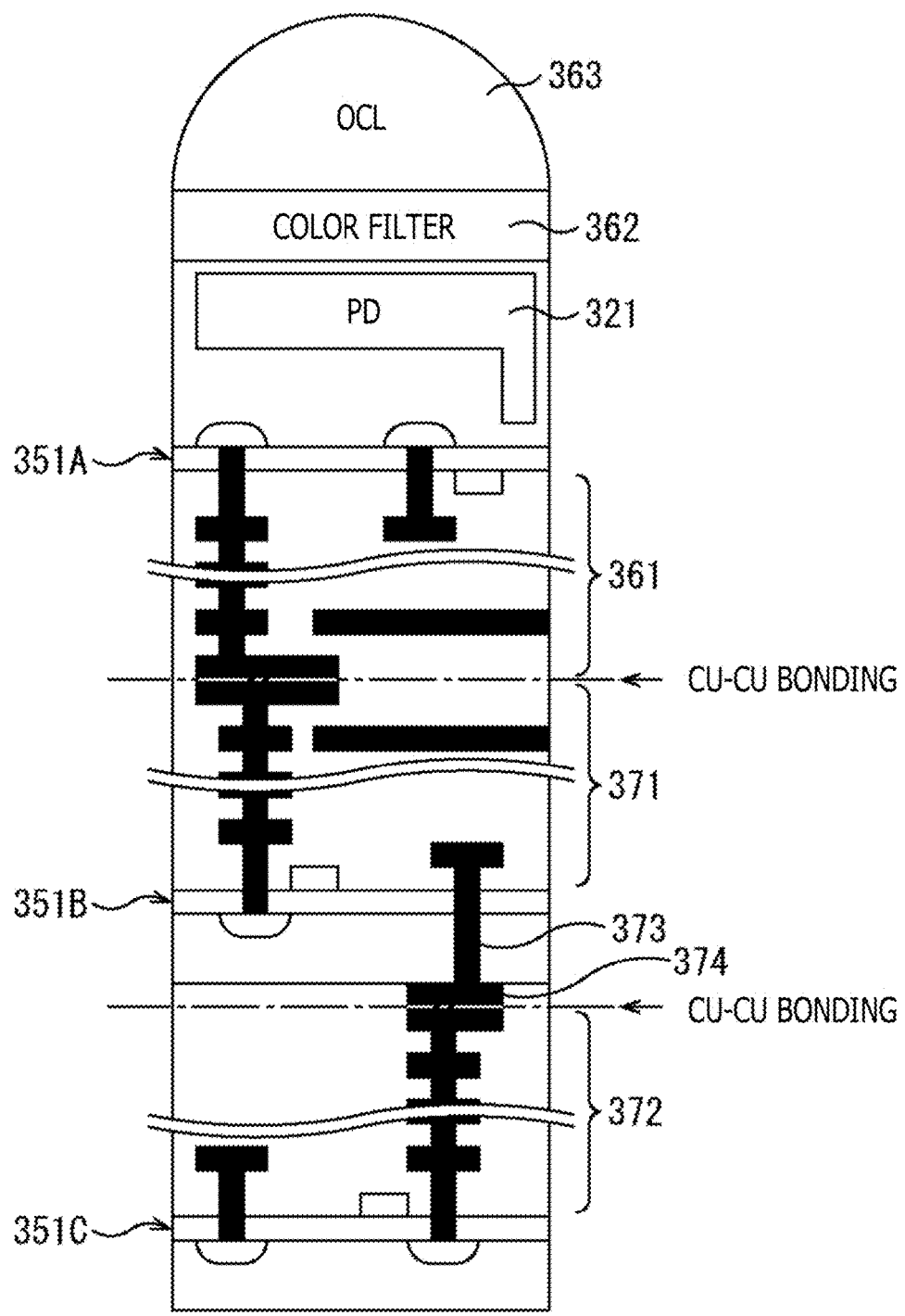
FIG. 37 is a schematic cross-section diagram in the case where the solid-state image pickup device is configured of three sheets of semiconductor substrates.

FIG. 37 illustrates a schematic cross-section diagram in the case where the solid-state image pickup device 1 is configured of three sheets of semiconductor substrates 351.

In the case where the solid-state image pickup device 1 is configured of three sheets of semiconductor substrates 351, the first semiconductor substrate 351A and the second semiconductor substrate 351B are first stuck together by the Cu—Cu jointing in the same manner as in the two-layer stacked structure illustrated in FIG. 35.

Then, the second semiconductor substrate 351B and the third semiconductor substrate 351C are further stuck through the Cu—Cu jointing between the wiring layer 372 formed on the front-surface side of the third semiconductor substrate 351C and a wiring for connection 374 of the second semiconductor substrate 351B. The wiring for connection 374 of the second semiconductor substrate 351B is connected to the wiring layer 371 on the front-surface side of the second semiconductor substrate 351B by using a through electrode 373.

In the example of FIG. 37, the wiring layer 371 on the front-surface side of the second semiconductor substrate 351B is jointed so as to face the wiring layer 361 of the first semiconductor substrate 351A; on the other hand, the top and bottom of the second semiconductor substrate 351B may be inverted and the wiring layer 371 of the second semiconductor substrate 351B may be jointed so as to face the wiring layer 372 of the third semiconductor substrate 351C.

9. Arithmetic Operation Configuration Example of CDS/DDS

Subsequently, with reference to FIGS. 38 and 39, the CDS processing and DDS processing of the pixel signals output from each pixel 21 of the pixel array unit 12 will be described.

As described above, in the solid-state image pickup device 1, the pixel signals are output from each pixel 21 of the pixel array unit 12 in the order corresponding to the P1 data, the D1 data, the D2 data, and the P2 data and are supplied to the signal processing circuit/horizontal control circuit 16 via the repeater column 43.

Figure 38:
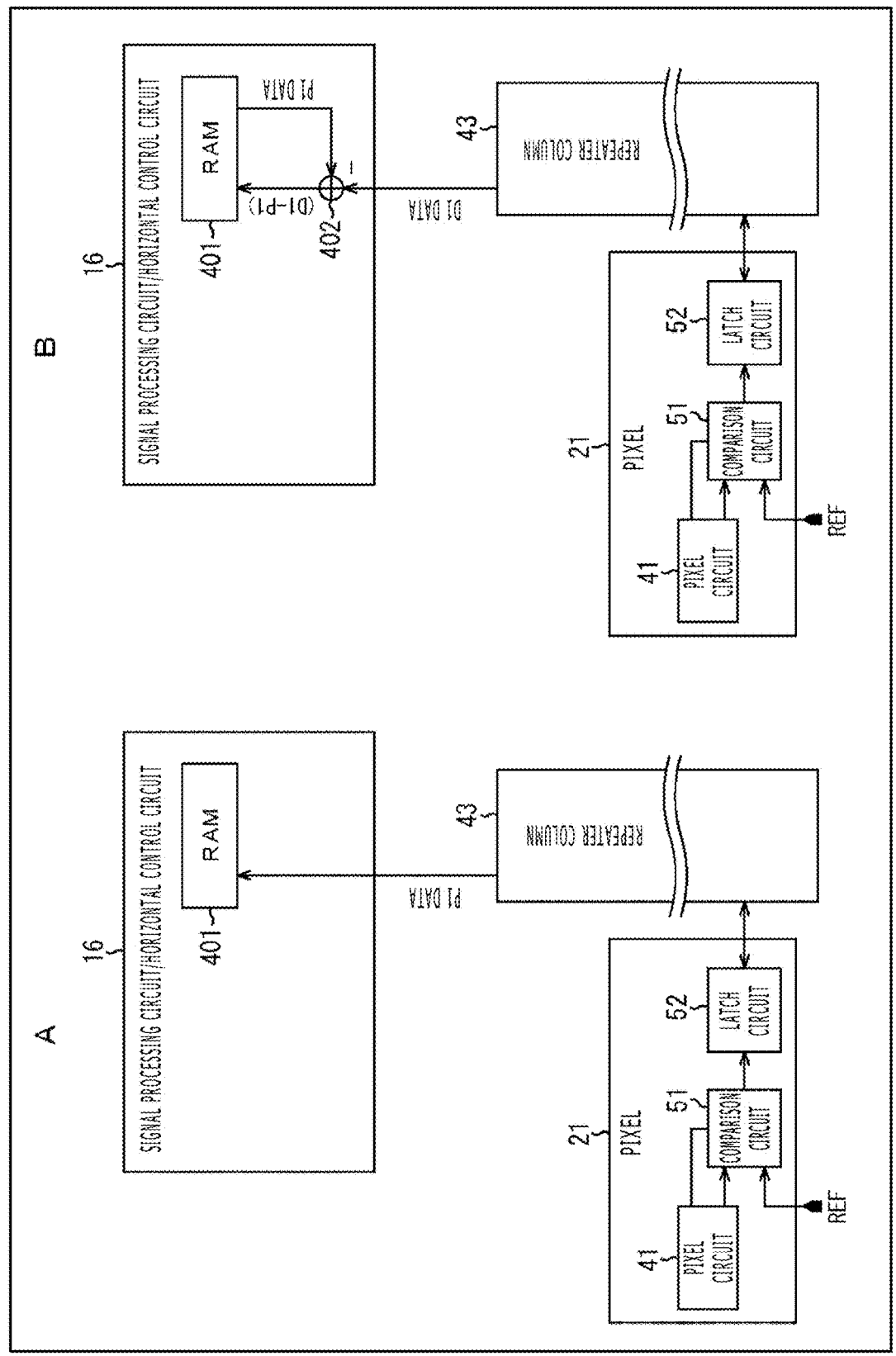
FIG. 38 is a diagram illustrating CDS processing and DDS processing.

FIG. 38 is a diagram illustrating the CDS processing of the P1 data and D1 data that are the low-light intensity pixel signals output from each pixel 21.

The signal processing circuit/horizontal control circuit 16 at least has an RAM (Random Access Memory) 401 and a computing unit 402 in an internal portion.

First, as illustrated in A of FIG. 38, the P1 data output from the pixel 21 is stored in the RAM 401 of the signal processing circuit/horizontal control circuit 16 via the repeater column 43.

Next, as illustrated in B of FIG. 38, the D1 data output from the pixel 21 is supplied to the computing unit 402 of the signal processing circuit/horizontal control circuit 16 via the repeater column 43. Further, to the computing unit 402, the P1 data stored in the RAM 401 is also supplied. The computing unit 402 performs the arithmetic operation of subtracting the P1 data from the D1 data and outputs its result of the arithmetic operation (D1-P1) to the RAM 401. Then, the (D1-P1) data after the CDS processing stored at one point in the RAM 401 is output to the I/O circuit 17 (FIG. 1) after a predetermined time.

Figure 39:
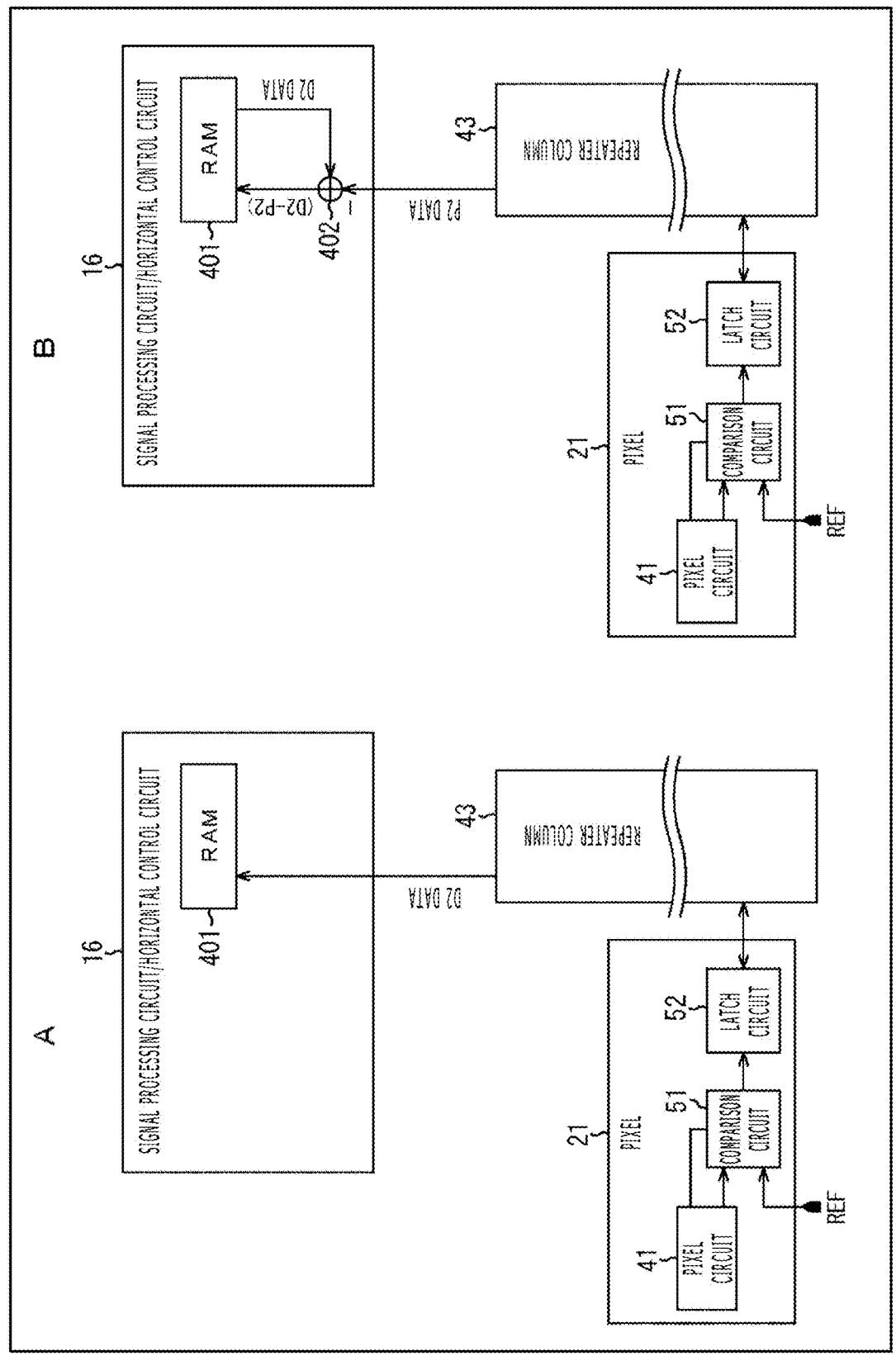
FIG. 39 is a diagram illustrating the CDS processing and the DDS processing.

FIG. 39 is a diagram illustrating the DDS processing of the D2 data and P2 data that are the high-light intensity pixel signals output from each pixel 21.

First, as illustrated in A of FIG. 39, the D2 data output from the pixel 21 is stored in the RAM 401 of the signal processing circuit/horizontal control circuit 16 via the repeater column 43.

Next, as illustrated in B of FIG. 39, the P2 data output from the pixel 21 is supplied to the computing unit 402 of the signal processing circuit/horizontal control circuit 16 via the repeater column 43. Further, to the computing unit 402, the D2 data stored in the RAM 401 is also supplied. The computing unit 402 performs the arithmetic operation of subtracting the P2 data from the D2 data and outputs its result of the arithmetic operation (D2-P2) to the RAM 401. Then, the (D2-P2) data after the DDS processing stored at one point in the RAM 401 is output to the I/O circuit 17 (FIG. 1) after a predetermined time.

10. Other Configuration Examples of Pixels

Other configuration examples of the pixels 21 will be described.

10. 1 in the Case where Latch Storage Unit Latches and Stores Both of P Phase Data and D Phase Data In the above-mentioned example, as illustrated with reference to FIG. 6, the latch storage unit 52 of the pixels 21 is configured of the latch control circuit 71 and the latched value storage unit 72, and in the latched value storage unit 72, the P1 data, the D1 data, the D2 data, and the P2 data are stored and output in order.

Figure 40:
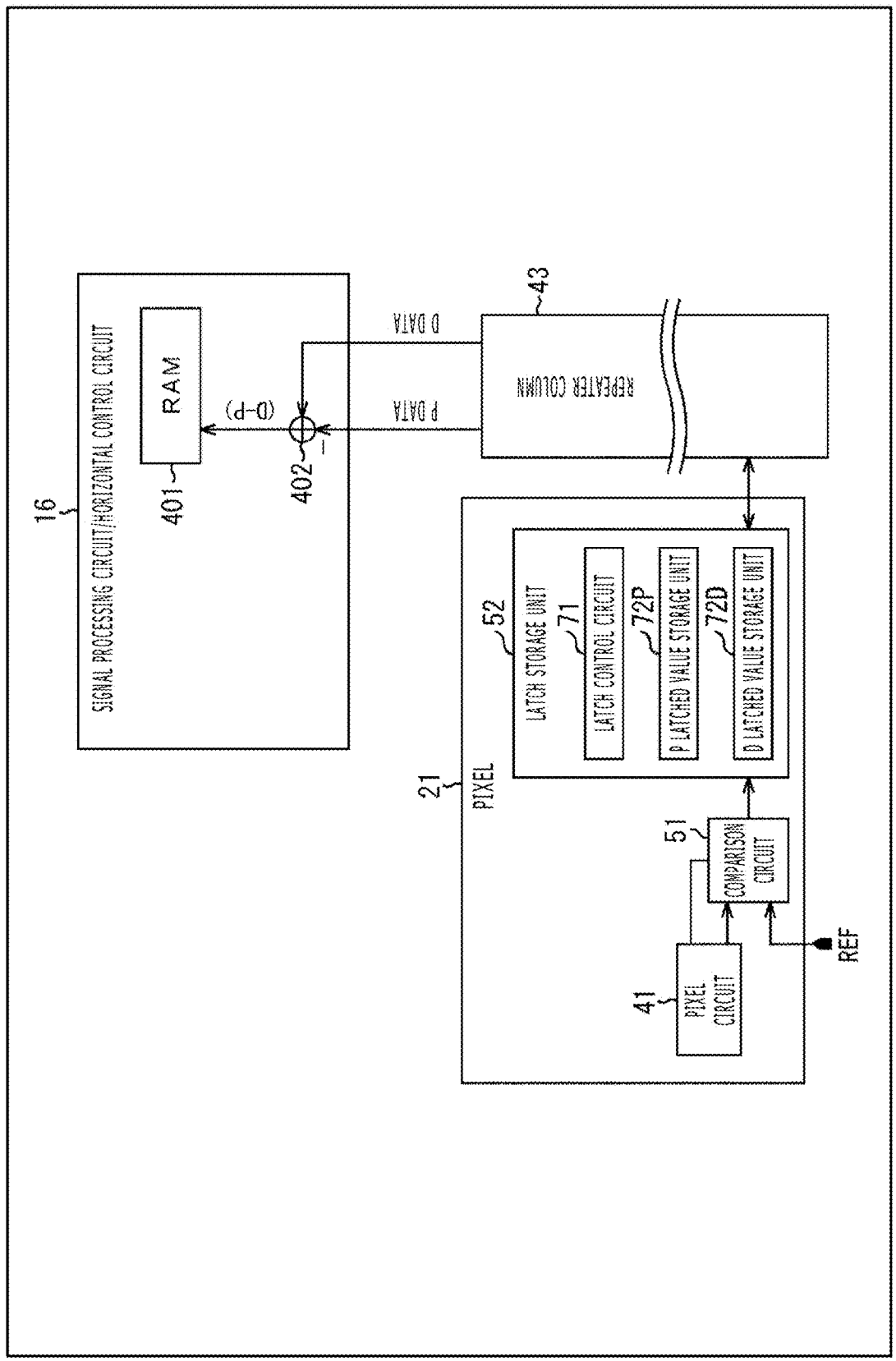
FIG. 40 is a diagram illustrating other configuration examples of the pixel.

However, as illustrated in FIG. 40, as the latch storage unit 52, a configuration may be adopted in which a P latched value storage unit 72P and a D latched value storage unit 72D are included so that the P phase data and the D phase data can be stored at the same time.

As described above, in the case where a configuration is adopted in which the latch storage unit 52 can store the P phase data and the D phase data at the same time, the signal processing circuit/horizontal control circuit 16 performs the CDS processing of the low-light intensity pixel signal and DDS processing of the high-light intensity pixel signal as described below.

First, the P1 data latched and stored in the P latched value storage unit 72P of the latch storage unit 52 and the D1 data latched and stored in the D latched value storage unit 72D are supplied to the computing unit 402 of the signal processing circuit/horizontal control circuit 16 via the repeater column 43.

The computing unit 402 performs the arithmetic operation of subtracting the P1 data from the D1 data and outputs its result of the arithmetic operation (D1-P1) to the RAM 401.

Next, the P2 data latched and stored in the P latched value storage unit 72P of the latch storage unit 52 and the D2 data latched and stored in the D latched value storage unit 72D are supplied to the computing unit 402 of the signal processing circuit/horizontal control circuit 16 via the repeater column 43.

The computing unit 402 performs the arithmetic operation of subtracting the P2 data from the D2 data and outputs its result of the arithmetic operation (D2-P2) to the RAM 401.

As described above, in the case where the latch storage unit 52 can store the P phase data and the D phase data at the same time, the solid-state image pickup device 1 can read out the P phase data and the D phase data at the same time and perform the CDS processing or DDS processing in the signal processing circuit/horizontal control circuit 16.

10. 2 Configuration Example in which U/D Counter is Included

Figure 41:
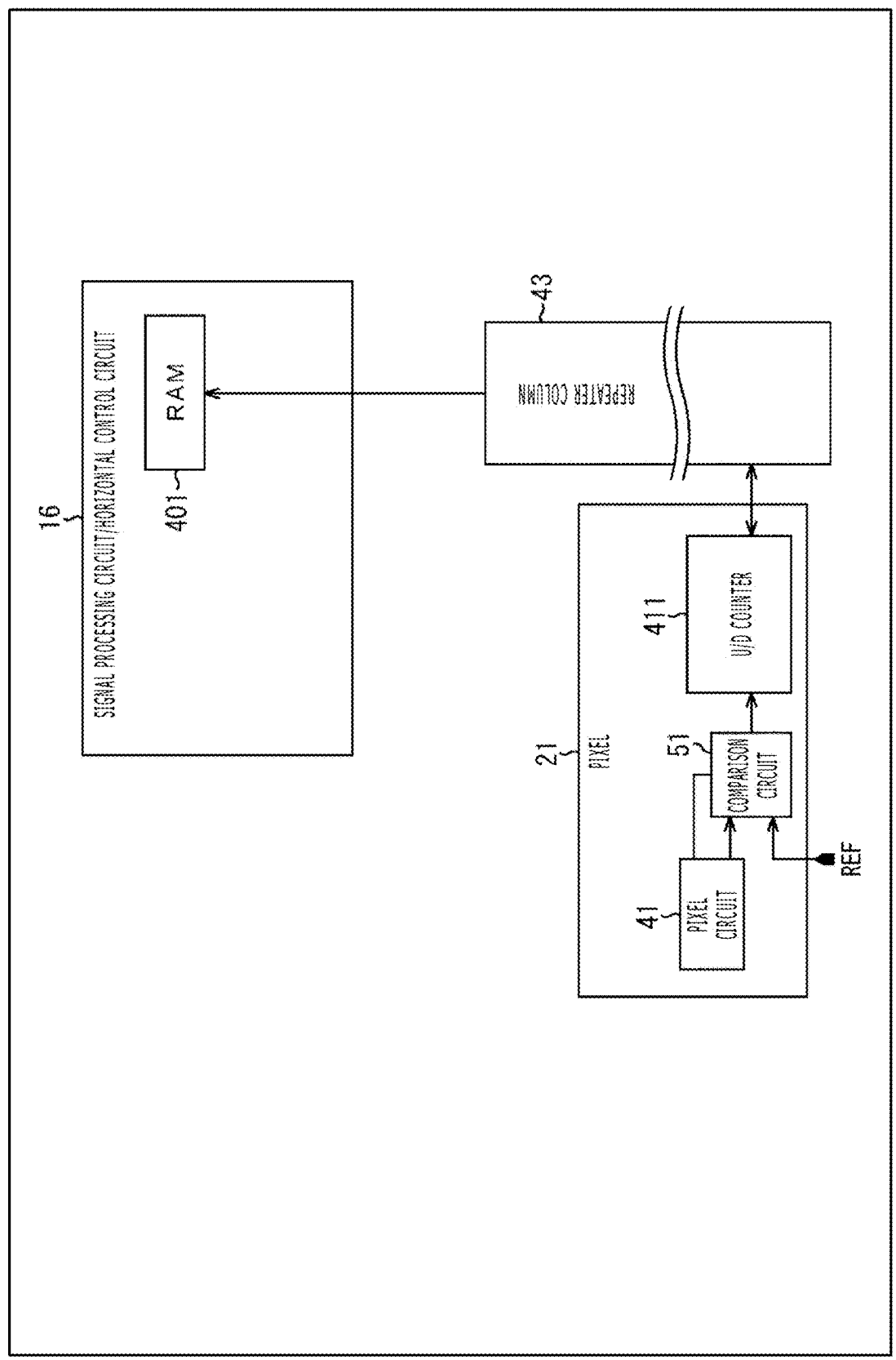
FIG. 41 is a diagram illustrating a configuration example in which the pixel includes a U/D counter.

In the above-mentioned example, the ADC 42 in the pixel 21 is configured of the comparison circuit 51 and the latch storage unit 52; further, in place of the latch storage unit 52, as illustrated in FIG. 41, a configuration in which a U/D counter (an up/down counter) 411 is provided may be adopted.

During the P phase (preset phase) AD conversion period, the U/D counter 411 counts down only while the Hi output signal VCO is supplied, and at the same time during the D phase (data phase) AD conversion period, counts up only while the Hi output signal VCO is supplied. Then, the U/D counter 411 outputs as pixel data after the CDS processing or DDS processing an addition result of the down count value during the P phase AD conversion period and the up count value during the D phase AD conversion period. In addition, the U/D counter 411 may count up during the P phase AD conversion period and count down during the D phase AD conversion period.

To the RAM 401 of the signal processing circuit/horizontal control circuit 16, the pixel data after the CDS processing or the DDS processing is supplied via the repeater column 43.

Figure 42:
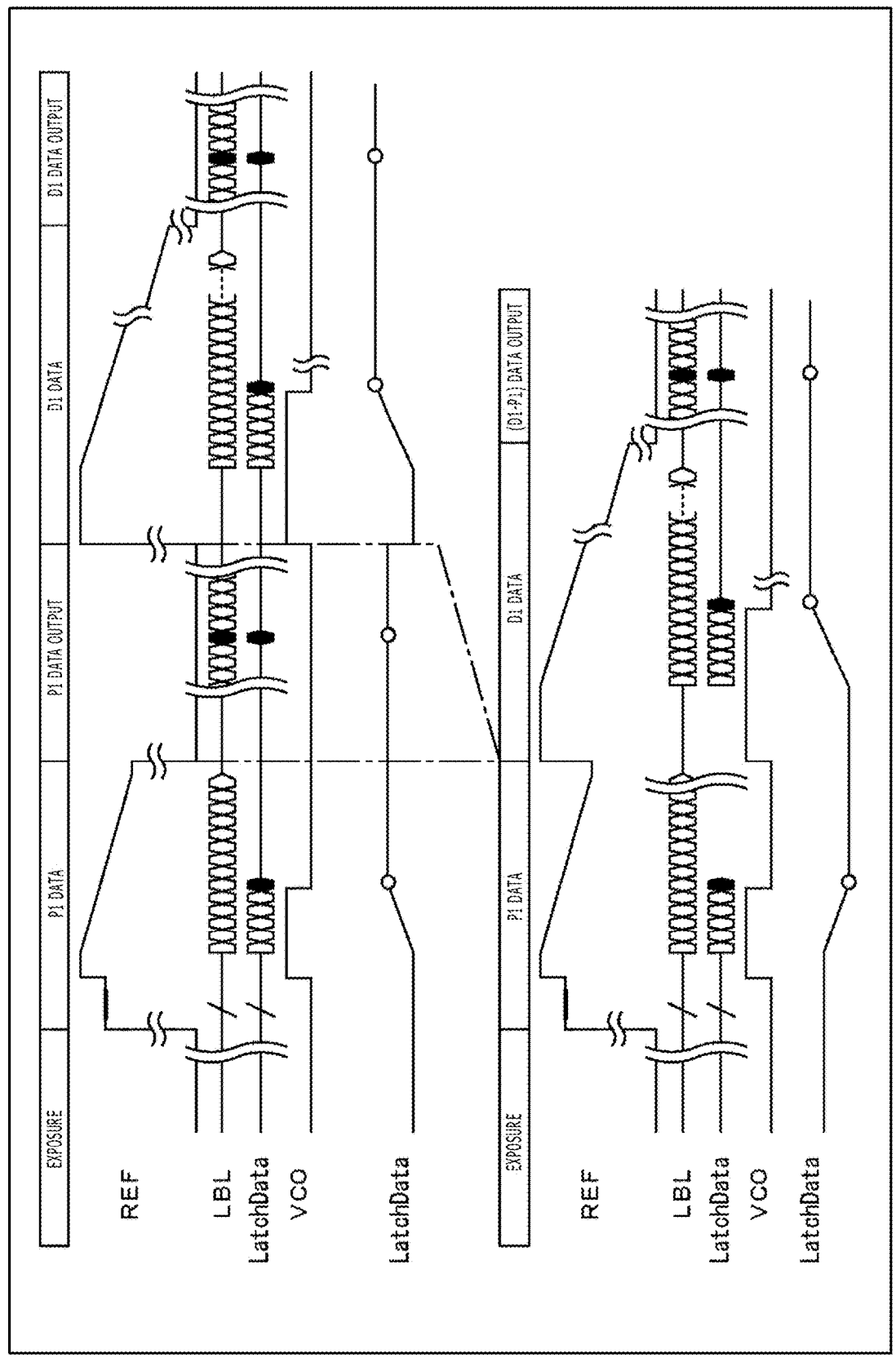
FIG. 42 is a diagram illustrating operations in the case where the pixel includes the U/D counter.

In FIG. 42, the driving in the case where the ADC 42 is configured of the comparison circuit 51 and the latch storage unit 52 and the driving in the case where the ADC 42 is configured of the comparison circuit 51 and the U/D counter 411 are illustrated by comparison.

A waveform in an upper stage of FIG. 42 indicates the driving in the case where the ADC 42 is configured of the comparison circuit 51 and the latch storage unit 52 and a waveform in a lower stage of FIG. 42 indicates the driving in the case where the ADC 42 is configured of the comparison circuit 51 and the U/D counter 411. In addition, any case indicates only a portion of the low-light intensity pixel signals from among the P1 data and D1 data of the low-light intensity pixel signals and the D2 data and P2 data of the high-light intensity pixel signals.

In the case where the ADC 42 includes the U/D counter 411, since an arithmetic operation of the CDS processing is performed in the U/D counter 411, the P1 data does not need to be output to the signal processing circuit/horizontal control circuit 16 via the repeater column 43. As a result, in the case where the ADC 42 includes the U/D counter 411, since the P1 data output period on the upper stage of FIG. 42 is omitted, speeding up of the processing can be performed.

In addition, in the example illustrated with reference to FIG. 38 to FIG. 42, the (D1-P1) data after the CDS processing and the (D2-P2) data after the DDS processing are stored once in the RAM 401 in the signal processing circuit/horizontal control circuit 16 and then are output to the I/O circuit 17; further, they may be output to the I/O circuit 17 as it is without being stored in the RAM 401.

11. Signal Synthetic Process

Subsequently, the synthetic process of the (D1-P1) data on the low-light intensity pixel signal and the (D2-P2) data on the high-light intensity pixel signal, performed by the signal processing circuit/horizontal control circuit 16 will be described.

Figure 43:
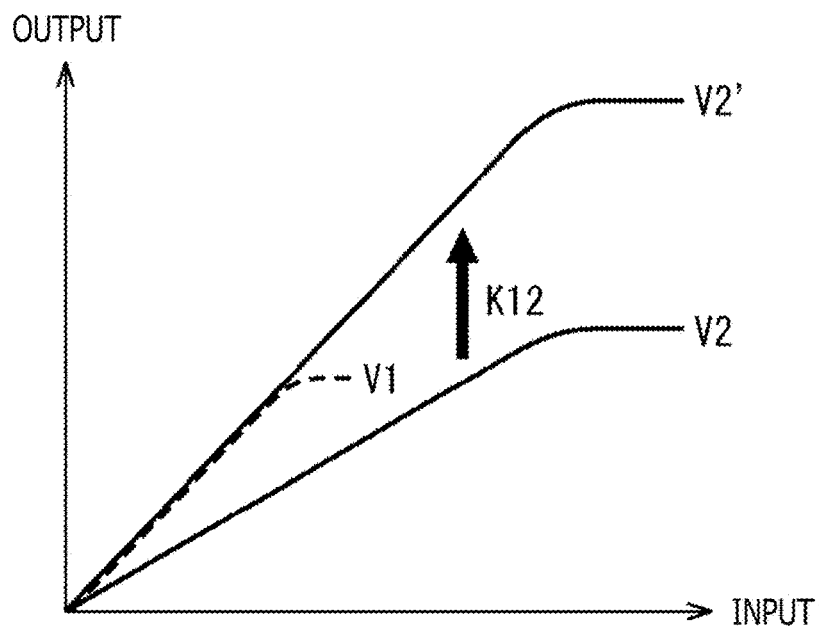
FIG. 43 is a diagram illustrating a signal synthetic process.

When the (D1-P1) data on the low-light intensity pixel signal after the CDS processing is set to V1 and the (D2-P2) data on the high-light intensity pixel signal after the DDS processing is set to V2, the signal processing circuit/horizontal control circuit 16 outputs the low-light intensity pixel signal V1 in the case where the amount of received light of the pixel 21 is a low-light intensity, and outputs a high-light intensity pixel signal V2' obtained by multiplying the high-light intensity pixel signal V2 by K12 as illustrated in FIG. 43 in the case where the amount of received light of the pixel 21 is a high-light intensity. Here, the K12 is a gain factor and corresponds to a capacity ratio between the FD 323 and the LOFIC 325.

On the other hand, the signal processing circuit/horizontal control circuit 16 prevents a DNL (derivative linearity error) in a connection portion between the low-light intensity pixel signal V1 and the high-light intensity pixel signal V2' and outputs a signal after processing in which the synthetic process for switching a signal smoothly is performed.

Figure 44:
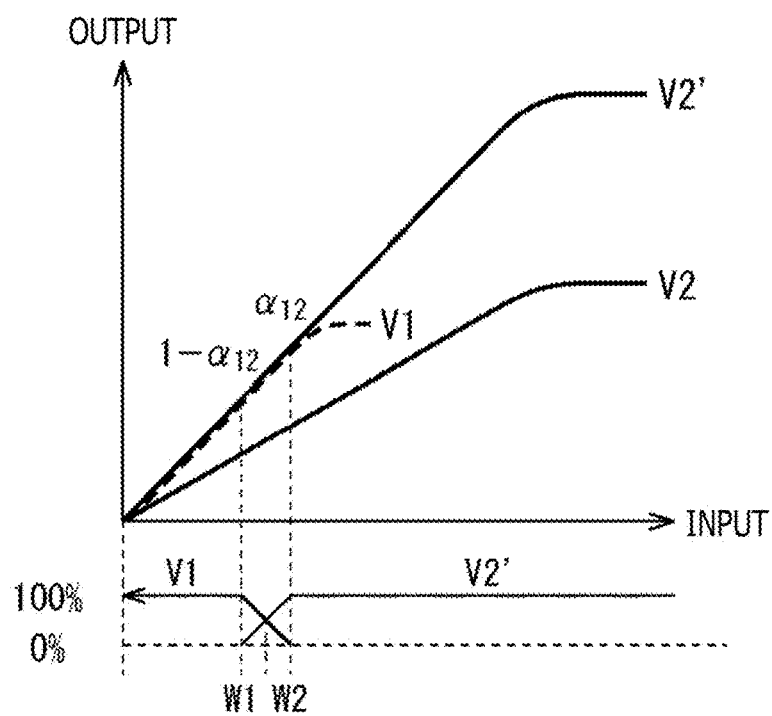
FIG. 44 is a diagram illustrating the signal synthetic process.

Specifically, as illustrated in FIG. 44, the signal processing circuit/horizontal control circuit 16 is connected so that a rate of the low-light intensity pixel signal V1 and the high-light intensity pixel signal V2' becomes valuable from $(1-\alpha_{12})$ to $\alpha_{12}$ before the low-light intensity pixel signal V1 is saturated and in an interval from W1 to W2 having linearity.

In other words, in the interval from W1 to W2, the signal processing circuit/horizontal control circuit 16 outputs a signal Vout obtained by the following arithmetic expression as an output signal. Here, $\alpha_{12}$ takes 0 at W1, $\alpha_{12}$ takes 1 at W2, and $\alpha_{12}$ is a value that changes linearly at $0<\alpha_{12}<1$ in the interval from W1 to W2.

$$V\text{out}=\alpha_{12}\cdot V1+(1-\alpha_{12})\cdot K12\cdot V2$$

In addition to the above-mentioned low-light intensity pixel signal V1 and high-light intensity pixel signal V2, for example, in the case where another LOFIC 325 is provided in the pixel and a pixel signal V3 read out therefrom is synthesized with the high-light intensity pixel signal V2, the synthesized output signal Vout of the high-light intensity pixel signal V2 and the pixel signal V3 can be obtained as described below.

$$V\text{out}=\alpha_{23}\cdot(K12\cdot V2)+(1-\alpha_{23})\cdot K23\cdot(K12\cdot V2)$$

12. Signal Determination Process

As described above, other than the interval in which two pixel signals are synthesized, the signal processing circuit/horizontal control circuit 16 outputs any one of the low-light intensity pixel signal V1 and the high-light intensity pixel signal V2; further, a determination method for determining which signal is output will be described.

A first determination method is a method for determining which signal is output on the basis of a size of the low-light intensity pixel signal V1. In this case, if the low-light intensity pixel signal V1 is equal to or larger than a predetermined value, the signal processing circuit/horizontal control circuit 16 outputs the high-light intensity pixel signal V2, and if the low-light intensity pixel signal V1 is less than a predetermined value, the signal processing circuit/horizontal control circuit 16 outputs the low-light intensity pixel signal V1.

A second determination method is a method for determining which signal is output on the basis of a size of the high-light intensity pixel signal V2. In this case, if the high-light intensity pixel signal V2 is less than a predetermined value, the signal processing circuit/horizontal control circuit 16 outputs the low-light intensity pixel signal V1, and if the high-light intensity pixel signal V2 is equal to or larger than a predetermined value, the signal processing circuit/horizontal control circuit 16 outputs the high-light intensity pixel signal V2.

In the first determination method and the second determination method, the second determination method is better for determining, by using the high-light intensity pixel signal V2, which signal is output.

Figure 45:
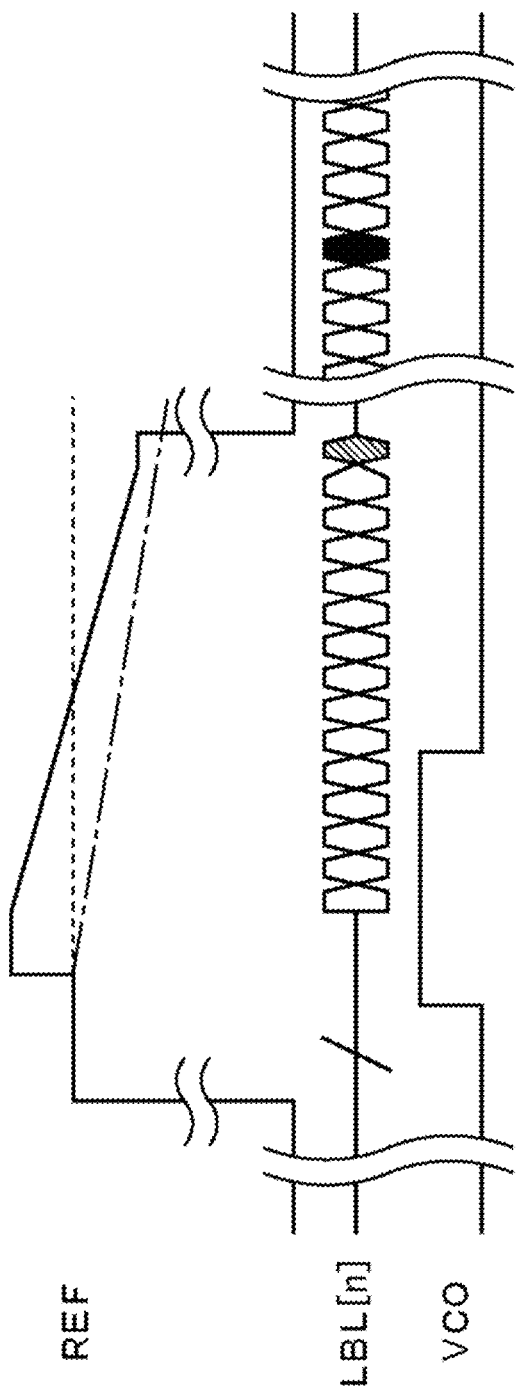
FIG. 45 is a diagram illustrating a signal determination process.

In the first determination method, in the case where external light is extremely strong or in the case of using a pixel structure in which the FD 323 is not initialized by using the reset transistor 326, a voltage value in the FD 323 is a voltage value other than a range of the voltage slope for comparison and the P phase data becomes large as a value as illustrated using a chain line in FIG. 45. As a result, arithmetic results (the D phase data–the P phase data) of the CDS processing after obtaining the following D phase data becomes smaller than original signal values. In this state, since the voltage value becomes small as an output signal difference, values near to black are output as compared to peripheral white saturation. Thus, sunspots may be obtained in the first determination method, and therefore it can be said that the second determination method is better for determining, by using the high-light intensity pixel signal V2, which signal is output.

In addition, in the case where external light is extremely strong or the pixels are not initialized, the P1 data has a maximum value. Therefore, whether the P1 data has the maximum value may be determined and, when the P1 data has the maximum value, the high-light intensity pixel signal V2 may be determined to be used.

The above-mentioned signal synthetic process and signal determination process are performed by using the signal processing circuit/horizontal control circuit 16 in the solid-state image pickup device 1; further, the outside of the solid-state image pickup device 1, for example, an input of the output signals from the solid-state image pickup device 1 may be received and performed by using a DSP circuit (a DSP circuit 503 etc. of FIG. 48) that performs predetermined signal processing.

13. Descriptions of Advantageous Effects

Subsequently, advantageous effects of the solid-state image pickup device 1 will be described as compared to the solid-state image pickup device disclosed in PTL 1 of background art.

Figure 46:
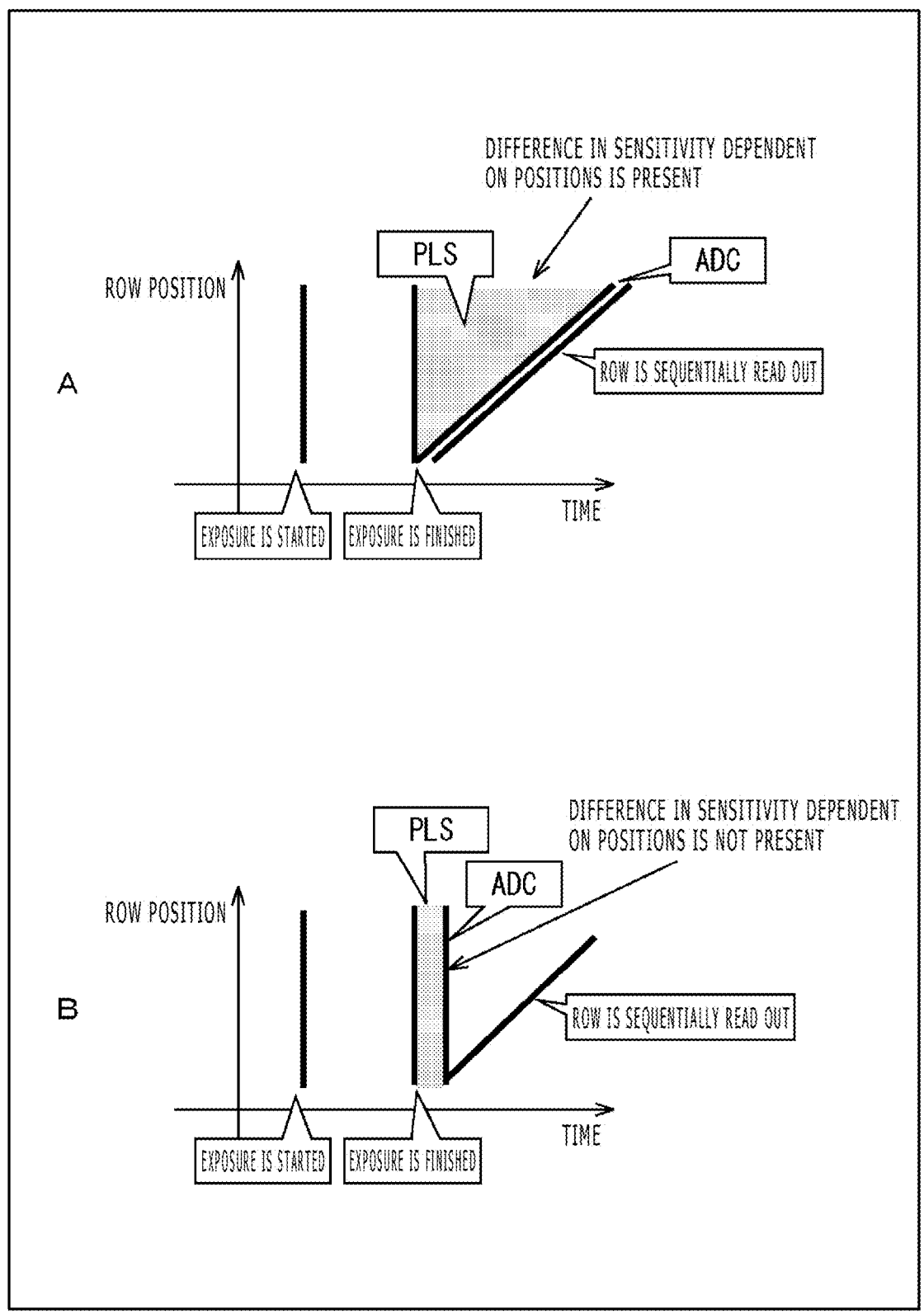
FIG. 46 is a diagram illustrating advantageous effects of the solid-state image pickup device of FIG. 1.

A of FIG. 46 illustrates a time relation from an exposure start to a signal readout of each row of the pixel array unit in the solid-state image pickup device disclosed in PTL 1 of background art.

B of FIG. 46 illustrates the time relation from an exposure start to a signal readout of each row of the pixel array unit 12 in the solid-state image pickup device 1.

Each pixel of the solid-state image pickup device disclosed in PTL 1 includes a LOFIC unit for accumulating an overflow charge and a CCD for a global shutter, and therefore can start an exposure and finish the exposure in all pixels at the same time.

However, the reading out and AD conversion of the pixel signals are line-sequentially performed, and therefore PLS is different depending on the read-out row as illustrated in A of FIG. 46. The pixel in which PLS is maximized is a pixel in a final read-out row.

In contrast, as described above, the pixel 21 of the solid-state image pickup device 1 includes the ADC 42 in the pixel, and therefore the exposure period is the same as a matter of course and, after the exposure is finished, the AD conversion can also be performed in all pixels at the same time. As a result, as illustrated in B of FIG. 46, the PLS is not zero but a slight value, and is even in all pixels. That is, the PLS does not depend on a time up to the read-out and the sensitivity difference depending on a position in the pixel array unit 12 does not occur.

Thus, in accordance with the solid-state image pickup device 1 of the present disclosure, an image quality degradation due to the PLS such as shading is hard to observe and an image having high image quality can be obtained.

14. Other Driving Methods of Pixels

Figure 47:
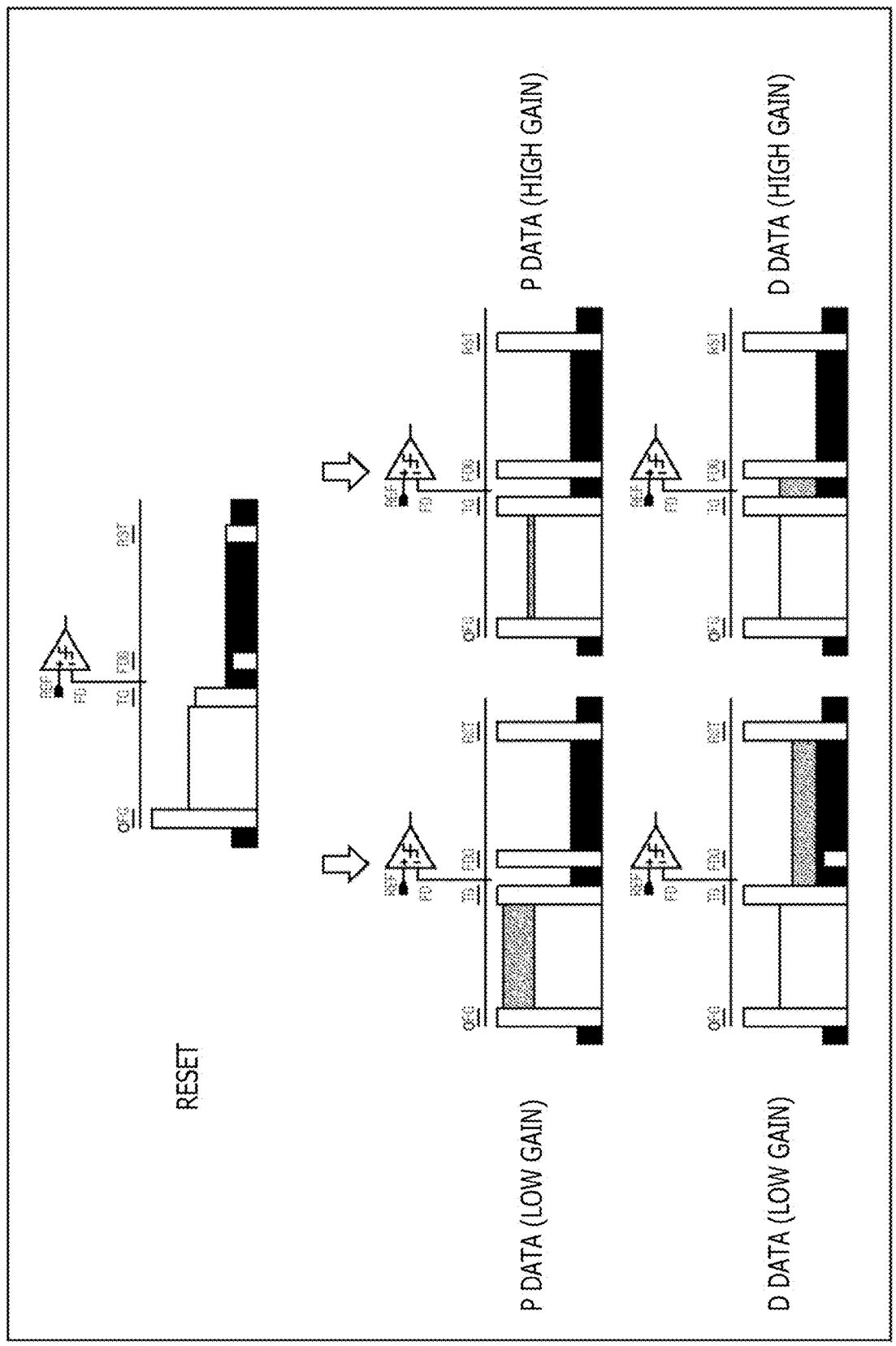
FIG. 47 is a diagram illustrating other driving methods of the pixel.

FIG. 47 is a diagram illustrating other driving methods of the pixels 21.

In the above-mentioned example, the pixel 21 performs the read-out of the P1 data, the D1 data, the D2 data, and the P2 data during the one normal scan period, and a driving method for obtaining both of the low-light intensity pixel signal and the high-light intensity pixel signal is described.

However, in the case where it is understood that the amount of received light is the low-light intensity or the high-light intensity, as illustrated in FIG. 47, a low-light intensity driving and a high-light intensity driving may be switched and operated so as to obtain any one of the low-light intensity pixel signal and the high-light intensity pixel signal.

Specifically, after the photodiode 321 and the FD 323 are reset, in the case of the high-light intensity, a charge accumulated in the photodiode 321 is held in both of the FD 323 and the LOFIC 325. On the other hand, in the case of the low-light intensity, the charge accumulated in the photodiode 321 is held only in the FD 323. Through this processing, a conversion efficiency can be switched in accordance with the amount of received light and the pixel signal can be obtained with a high gain at the time of the low-light intensity.

15. Application Examples to Electronic Apparatus

The present technology is not limited to an application to the solid-state image pickup device. Specifically, the present technology can be applied to an overall electronic apparatus using the solid-state image pickup device as an image capturing unit (photoelectric conversion unit), for example, an imaging device such as a digital still camera or a video camera, a portable terminal apparatus having an imaging function, a copying machine using the solid-state image pickup device as an image reading unit. The solid-state image pickup device may be a shape formed as a one-chip or a modular shape having an imaging function in which an imaging unit and a signal processing unit or an optical system are packaged collectively.

Figure 48:
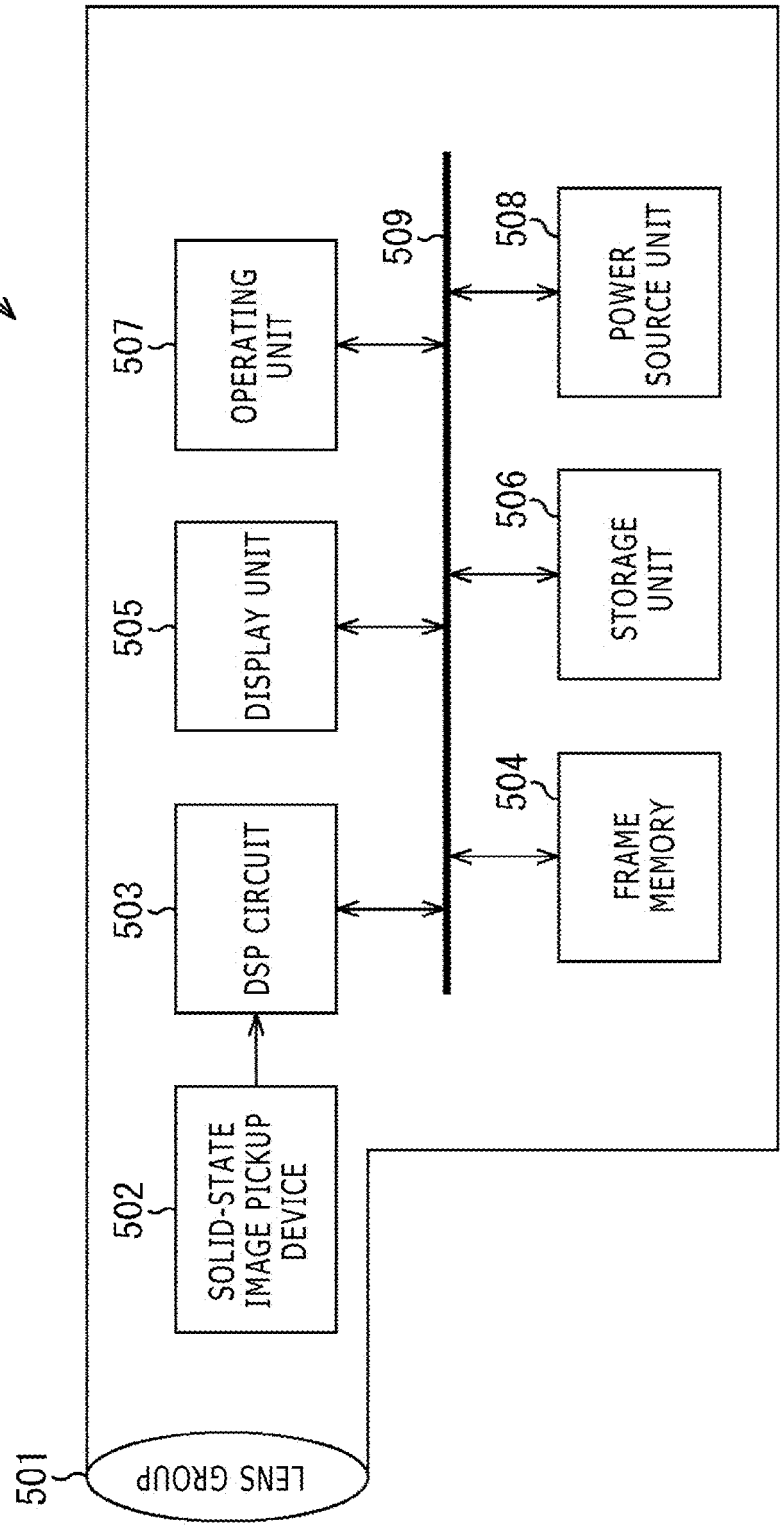
FIG. 48 is a block diagram illustrating a configuration example of an imaging device as an electronic apparatus to which the present technology is applied.

FIG. 48 is a block diagram illustrating a configuration example of the imaging device as electronic apparatus to which the present technology is applied.

An imaging device 500 of FIG. 48 includes an optical unit 501 configured of a lens group etc., a solid-state image pickup device (an imaging device) 502 in which a configuration of the solid-state image pickup device 1 of FIG. 1 is adopted, and a DSP (Digital Signal Processor) circuit 503 that is a camera signal processing circuit. Further, the imaging device 500 also includes a frame memory 504, a display unit 505, a recording unit 506, an operating unit 507, and a power supply unit 508. The DSP circuit 503, the frame memory 504, the display unit 505, the recording unit 506, the operating unit 507, and the power supply unit 508 are connected to each other through a bus line 509.

The optical unit 501 captures incident light (image light) from an object and provides an image on an imaging surface of the solid-state imaging pickup device 502. The solid-state image pickup device 502 converts a light amount of incident light in which an image is provided on the imaging surface by using the optical unit 501 to an electrical signal in units of pixels and outputs the electrical signal as the pixel signal. As this solid-state image pickup device 502, the solid-state image pickup device 1 of FIG. 1, that is, the solid-state image pickup device can be used in which the pixels 21 each having the pixel circuit 41 and the ADC 42 are arrayed in a two-dimensional array and in which an image quality degradation due to the PLS is discreet.

The display unit 505 is configured of a panel type display device such as a liquid crystal panel or an organic EL (Electro Luminescence) panel and displays a moving image or still image imaged by the solid-state image pickup device 502. The recording unit 506 records a moving image or still image imaged by the solid-state image pickup device 502 on a recording medium such as a hard disc or semiconductor memory.

The operating unit 507 issues an operation command relating to various functions included in the imaging device 500 under the operations through users. The power supply unit 508 appropriately supplies various power supplies to be an operating power supply of the DSP circuit 503, the frame memory 504, the display unit 505, the recording unit 506, and the operating unit 507 to those objects to be supplied.

As described above, as the solid-state image pickup device 502, an image in which an image quality degradation due to the PLS is discreet can be generated by using the above-mentioned solid-state image pickup device 1. Accordingly, also in the imaging device 500 such as a video camera, a digital still camera, further a camera module for a mobile device of cell-phones etc., a higher image quality of the image can be realized.

<Usage Example of Image Sensor>

Figure 49:
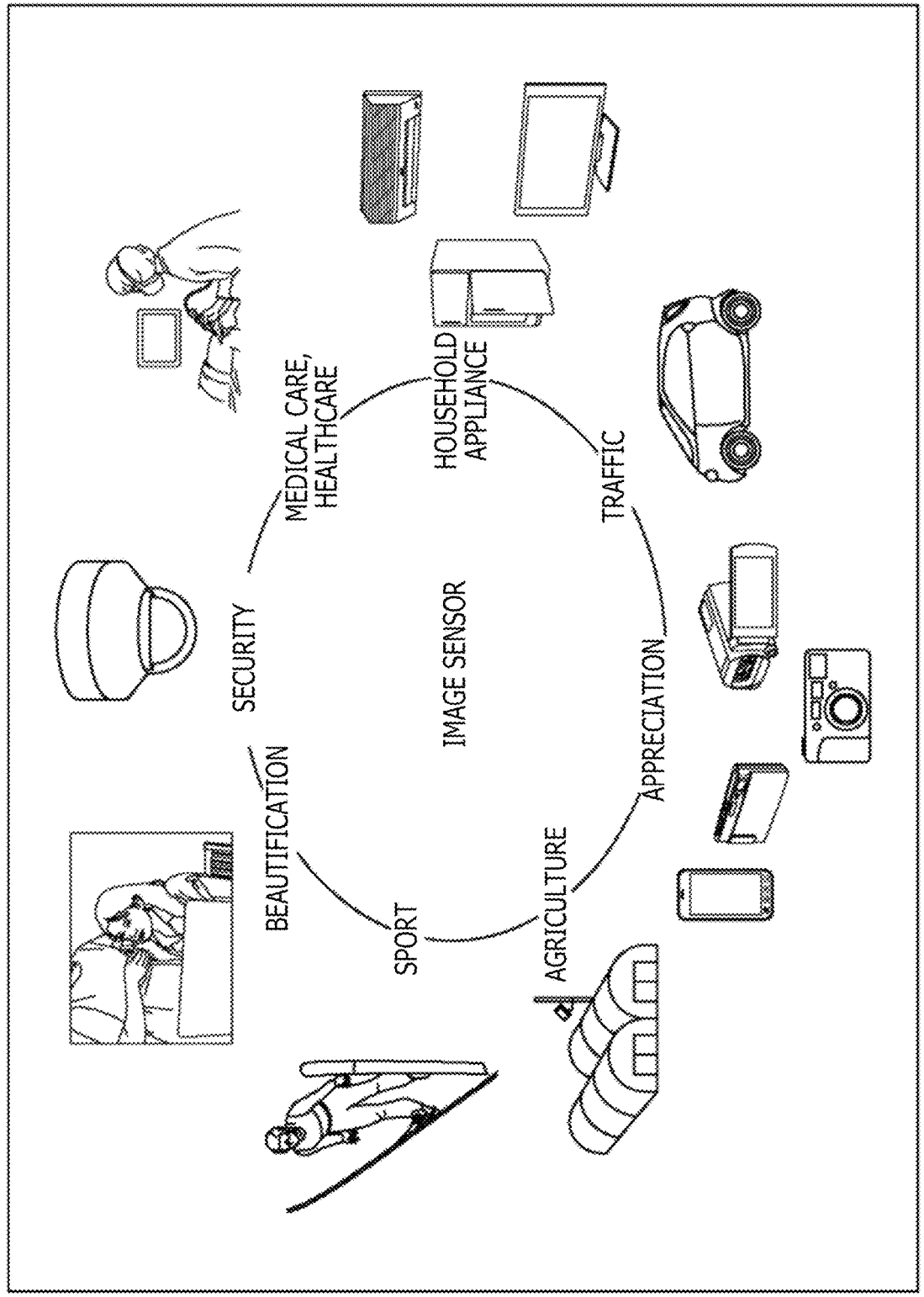
FIG. 49 is a diagram illustrating a usage example of the solid-state image pickup device of FIG. 1.

FIG. 49 is a diagram illustrating a usage example in which an image sensor is used as the above-mentioned solid-state image pickup device 1.

The image sensor can be used, for example, in various cases of sensing light such as visible light, infrared light, ultraviolet light, or X-ray as described below.

- A device for shooting an image for use in appreciation such as a digital camera or a mobile device having a camera function
- A device for use in traffic such as an on-vehicle sensor that images a front, a rear, a circumference, or the inside etc. of a vehicle or a monitoring camera that monitors moving vehicles or roads, or a ranging sensor that measures a distance between vehicles for a safety drive of automatic stop etc. or recognition etc. of a state of drivers A device for use in household appliances such as TV sets, refrigerators, or air conditioners in order to shoot gestures of a user and perform an equipment operation in accordance with the gestures A device for use in medical care or healthcare such as an endoscope or a device for performing an angiography by receiving infrared light A device for use in security such as monitoring cameras for crime prevention or cameras for person authentication A device for use in beautification, such as a skin measuring device for shooting a skin or a microscope for shooting a skin of scalp A device for use in sport such as action cameras or wearable cameras for sport usage etc.

A device for use in agriculture, such as cameras for monitoring a state of fields or crops In addition, embodiments of the present technology are not limited to the above-mentioned embodiments, and various changes can be made in a scope not departing from the spirit of the present technology.

Further, the present technology is not limited to application to a solid-state image pickup device that captures an image by detecting the distribution of the incident amount of visible light; further, the present technology can be applied to the overall solid-state image pickup device (physical quantity distribution detecting devices) such as a solid-state image pickup device that captures as an image the distribution of the incident amount of infrared light, X-rays, particles, or the like, or in a broad sense, a fingerprint detection sensor that detects the distribution of other physical quantities such as pressure or electric capacitance, and captures images.

The circuit configuration of each embodiment described above has been described as a circuit configuration in which electrons are used as charges; further, in the present technology, a circuit configuration in which positive holes are used as charges may be adopted. Further, each circuit configuration described above can be realized even by using a circuit configuration in which the polarity (NMOS transistors and PMOS transistors) of transistors is rearranged. In that case, the control signals input to the transistors are a Hi signal and a Low signal opposite to each other.

In each embodiment described above, the reference signal REF has been described as a slope signal in which a level (voltage) monotonously decreases in accordance with the elapse of time; further, the reference signal REF may be set to the slope signal in which a level (voltage) monotonously increases in accordance with the elapse of time.

In addition, it is possible to adopt a mode in which all or a portion of a plurality of embodiments described above are combined. It is also possible to adopt a mode in which both of other embodiments that are not described in the embodiments described above are appropriately combined.

Incidentally, the advantageous effects described in the specifications are strictly illustrative and are not limited thereto, and there may be advantageous effects other than those described in the specifications.

Further, the present technology may be configured as follows.

(1)
A solid-state image pickup device including:
a first unit pixel at least having one photoelectric conversion element and over flow integration capacitor as a portion of pixels in a pixel array unit in which a plurality of pixels are arrayed; and
one AD converter for the one or more first unit pixel in the pixel array unit.

(2)
The solid-state image pickup device according to (1) above, in which the one AD converter is included for the plurality of first unit pixels.

(3)
The solid-state image pickup device according to (2) above, in which the plurality of first unit pixels are configured so that a floating diffusion layer and a reset transistor that resets a charge of the floating diffusion layer are shared.

(4)
The solid-state image pickup device according to any one of (1) to (3) above, in which the one AD converter is included for a second unit pixel not having the over flow integration capacitor and at least having a photoelectric conversion element and the one first unit pixel.

(5)
The solid-state image pickup device according to (4) above, in which the first unit pixel is a high-light intensity pixel and the second unit pixel is a low-light intensity pixel.

(6)
The solid-state image pickup device according to any one of (1) to (5) above, further including:
the second unit pixel not having the over flow integration capacitor and at least having the photoelectric conversion element as a portion of pixels in the pixel array unit; and the one AD converter for the one or more second unit pixels in the pixel array unit.

(7)
The solid-state image pickup device according to (6) above, in which
the one AD converter is included for the one first unit pixel, and
the one AD converter is included for the one second unit pixel.

(8)
The solid-state image pickup device according to any one of (1) to (7) above, in which the solid-state image pickup device is a back-surface irradiation type.

(9)
The solid-state image pickup device according to any one of (1) to (8) above, in which the solid-state image pickup device is configured by stacking a plurality of semiconductor substrates.

(10)
The solid-state image pickup device according to any one of (1) to (9) above, in which
the AD converter outputs a digital value in which a pixel signal of the first unit pixel is AD-converted, and CDS processing of the first unit pixel is performed in a signal processing circuit other than the pixel array unit.

(11)
The solid-state image pickup device according to (10) above, in which the AD converter outputs in order P phase data and D phase data obtained by AD-converting the pixel signal of the first unit pixel.

(12)
The solid-state image pickup device according to (10) above, in which the AD converter simultaneously outputs the P phase data and D phase data obtained by AD-converting the pixel signal of the first unit pixel.

(13)

The solid-state image pickup device according to (10) above, in which the AD converter AD-converts the pixel signal of the first unit pixel and outputs the digital value after the CDS processing.

(14)

The solid-state image pickup device according to any one of (1) to (13) above, further including:

a signal processing circuit that performs a signal synthetic process of a high-light intensity pixel signal and low-light intensity pixel signal obtained from the first unit pixel.

(15)

The solid-state image pickup device according to any one of (1) to (14) above, further including:

a signal processing circuit that performs a signal determination process for determining which signal of the high-light intensity pixel signal and low-light intensity pixel signal obtained from the first unit pixel is output.

(16)

The solid-state image pickup device according to (15) above, in which the signal processing circuit determines whether or not the P phase data of the low-light intensity pixel signal is a maximum value and determines which signal of the high-light intensity pixel signal and the low-light intensity pixel signal is output.

(17)

The solid-state image pickup device according to any one of (1) to (16) above, in which the first unit pixel further includes a first transfer transistor that transfers a charge of the photoelectric conversion element to the floating diffusion layer and a second transfer transistor that transfers a charge of the photoelectric conversion element to the over flow integration capacitor.

(18)

A method for controlling a solid-state image pickup device, including: causing a solid-state image pickup device including a unit pixel at least having one photoelectric conversion element and over flow integration capacitor as a portion of pixels in a pixel array unit in which a plurality of pixels are arrayed, and one AD converter for the one or more unit pixels in the pixel array unit to convert a pixel signal of the unit pixel to a digital value and to output the digital value in the pixel array unit.

(19)

An electronic apparatus including: a solid-state image pickup device including a unit pixel at least having one photoelectric conversion element and over flow integration capacitor as a portion of pixels in a pixel array unit in which a plurality of pixels are arrayed, and one AD converter for the one or more unit pixels in the pixel array unit.

REFERENCE SIGNS LIST

1 Solid-state image pickup device, 12 Pixel array unit, BL Block, CL Cluster, 16 Signal processing circuit/horizontal control circuit, 17 I/O circuit, 21 Pixel, 41 Pixel circuit, 42 ADC, 42L, 42R Comparison circuit/latch column, 42R$_{CL}$, 42L$_{CL}$ Comparison circuit latch group, 43 Repeater column, 51 Comparison circuit, 52 Latch storage unit, 61 Differential input circuit, 62 Voltage conversion circuit, 63 Positive feedback circuit, 71 Latch control circuit, 72 Latched value storage unit, 72D D latched value storage unit, 72P P latched value storage unit, 221 Shift resister, 222 Bidirectional buffer circuit, 231 D-F/F, 232 Repeater circuit, 321 Photodiode, 322 First transfer transistor, 323 FD (floating diffusion layer), 324 Second transfer transistor, 325 Lateral over flow integration capacitor (LOFIC), 326 Reset transistor, 327 Discharge transistor, 328 Third transfer transistor, 351A First semiconductor substrate, 351B Second semiconductor substrate, 351C Third semiconductor substrate, 362 Color filter, 363 OCL (on-chip lens), 411 U/D counter, 500 Imaging device, 502 Solid-state image pickup device

The invention claimed is:

1. A solid-state image pickup device comprising:
   a first unit pixel including a first photoelectric conversion element and an over flow integration capacitor, wherein the first unit pixel is included in a pixel array unit in which a plurality of pixels are arrayed;
   a second unit pixel including a second photoelectric conversion element, wherein the second unit pixel does not include an over flow integration capacitor; and
   a first analog-to digital (AD) converter arranged to process an output of the first unit pixel and/or an output of the second unit pixel.

2. The solid-state image pickup device according to claim 1, further comprising a plurality of first unit pixels including the first unit pixel, and wherein the first AD converter is arranged to process an output of each of the plurality of first unit pixels.

3. The solid-state image pickup device according to claim 2, wherein the plurality of first unit pixels are configured so that a floating diffusion layer and a reset transistor that resets a charge of the floating diffusion layer are shared.

4. The solid-state image pickup device according to claim 1, wherein the first unit pixel is a high-light intensity pixel and the second unit pixel is a low-light intensity pixel.

5. The solid-state image pickup device according to claim 1, further comprising:
   a second AD converter arranged to process output from the second unit pixel.

6. The solid-state image pickup device according to claim 5, wherein
   the first AD converter is arranged to process the output from the first unit pixel, and
   the second AD converter is arranged to process the output from the second unit pixel.

7. The solid-state image pickup device according to claim 1, wherein the solid-state image pickup device is a back-surface irradiation type.

8. The solid-state image pickup device according to claim 1, wherein the solid-state image pickup device is configured by stacking a plurality of semiconductor substrates.

9. The solid-state image pickup device according to claim 1, wherein
   the first AD converter is configured to output a digital value in which a pixel signal of the first unit pixel is AD-converted, and
   correlated double sampling (CDS) processing of the output of the first unit pixel is performed in a signal processing circuit other than the pixel array unit.

10. The solid-state image pickup device according to claim 9, wherein the first AD converter is configured to output in order P phase data and D phase data obtained by AD-converting the pixel signal of the first unit pixel.

11. The solid-state image pickup device according to claim 9, wherein the first AD converter is configured to simultaneously output P phase data and D phase data obtained by AD-converting the pixel signal of the first unit pixel.

12. The solid-state image pickup device according to claim 9, wherein the first AD converter is configured to AD-convert the pixel signal of the first unit pixel and output the digital value after the CDS processing.

13. The solid-state image pickup device according to claim 1, further comprising
a signal processing circuit configured to perform a signal synthetic process of a high-light intensity pixel signal and low-light intensity pixel signal obtained from the first unit pixel.

14. The solid-state image pickup device according to claim 1, further comprising
a signal processing circuit configured to perform a signal determination process for determining whether to output a high-light intensity pixel signal output from the first unit pixel or a low-light intensity pixel signal output from the second unit pixel.

15. The solid-state image pickup device according to claim 14, wherein the signal processing circuit is configured to determine whether or not P phase data of the low-light intensity pixel signal is a maximum value.

16. The solid-state image pickup device according to claim 1, wherein the first unit pixel further includes a first transfer transistor configured to transfer a first charge of the first photoelectric conversion element to a floating diffusion layer and a second transfer transistor configured to transfer a second charge of the first photoelectric conversion element to the over flow integration capacitor.

17. A method for controlling a solid-state image pickup device, comprising:
causing a solid-state image pickup device including a first unit pixel including a first photoelectric conversion element and an over flow integration capacitor, a second unit pixel including a second photoelectric conversion element and no over flow integration capacitor, and an analog-to-digital (AD) converter to convert a pixel signal of the first unit pixel and/or the second unit pixel to a digital value and to output the digital value.

18. An electronic apparatus comprising:
a solid-state image pickup device including a first unit pixel including a first photoelectric conversion element and an over flow integration capacitor, a second unit pixel including a second photoelectric conversion element and no over flow integration capacitor, and an analog-to-digital (AD) converter to convert a pixel signal of the first unit pixel and/or the second unit pixel to a digital value and to output the digital value.

* * * * *